(12) United States Patent
Kim et al.

(10) Patent No.: US 8,816,404 B2
(45) Date of Patent: Aug. 26, 2014

(54) SEMICONDUCTOR DEVICE AND METHOD OF FORMING STACKED SEMICONDUCTOR DIE AND CONDUCTIVE INTERCONNECT STRUCTURE THROUGH AN ENCAPSULANT

(75) Inventors: YoungJoon Kim, Kyoungki-do (KR); SangMi Park, Gyeonggi-do (KR); YongHyuk Jeong, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 63 days.

(21) Appl. No.: 13/234,902

(22) Filed: Sep. 16, 2011

(65) Prior Publication Data

US 2013/0069239 A1    Mar. 21, 2013

(51) Int. Cl.
*H01L 23/58*    (2006.01)

(52) U.S. Cl.
USPC .... 257/212; 257/104; 257/288; 257/E21.006; 257/E21.007; 257/E21.053; 257/E21.304; 257/E21.352; 257/E21.499; 257/E21.502; 257/E21.508

(58) Field of Classification Search
USPC ................ 257/104, 199, 212, 288, 414, 603, 257/E21.006, E21.007, E21.053, E21.17, 257/E21.304, E21.352, E21.502, E21.508, 257/E21.499
See application file for complete search history.

(56) References Cited

U.S. PATENT DOCUMENTS

| | | | |
|---|---|---|---|
| 6,204,562 B1 | 3/2001 | Ho et al. | |
| 6,498,054 B1 | 12/2002 | Chiu et al. | |
| 7,242,081 B1 * | 7/2007 | Lee ............................... | 257/686 |
| 7,847,413 B2 * | 12/2010 | Akiba et al. .................. | 257/777 |
| 7,863,755 B2 * | 1/2011 | Lee et al. ...................... | 257/777 |
| 7,948,095 B2 | 5/2011 | Ng et al. | |
| 7,951,643 B2 | 5/2011 | Ha et al. | |
| 2004/0070083 A1 | 4/2004 | Su | |
| 2007/0013043 A1 | 1/2007 | Pan et al. | |
| 2010/0207262 A1 | 8/2010 | Park et al. | |

* cited by examiner

*Primary Examiner* — David Nhu
(74) *Attorney, Agent, or Firm* — Robert D. Atkins; Patent Law Group: Atkins and Associates, P.C.

(57) ABSTRACT

A semiconductor device has a first conductive layer formed over a first substrate. A second conductive layer is formed over a second substrate. A first semiconductor die is mounted to the first substrate and electrically connected to the first conductive layer. A second semiconductor die is mounted to the second substrate and electrically connected to the second conductive layer. The first semiconductor die is mounted over the second semiconductor die. An encapsulant is deposited over the first and second semiconductor die and the first and second substrates. A conductive interconnect structure is formed through the encapsulant to electrically connect the first and second semiconductor die to the second surface of the semiconductor device. Forming the conductive interconnect structure includes forming a plurality of conductive vias through the encapsulant and the first substrate outside a footprint of the first and second semiconductor die.

14 Claims, 48 Drawing Sheets

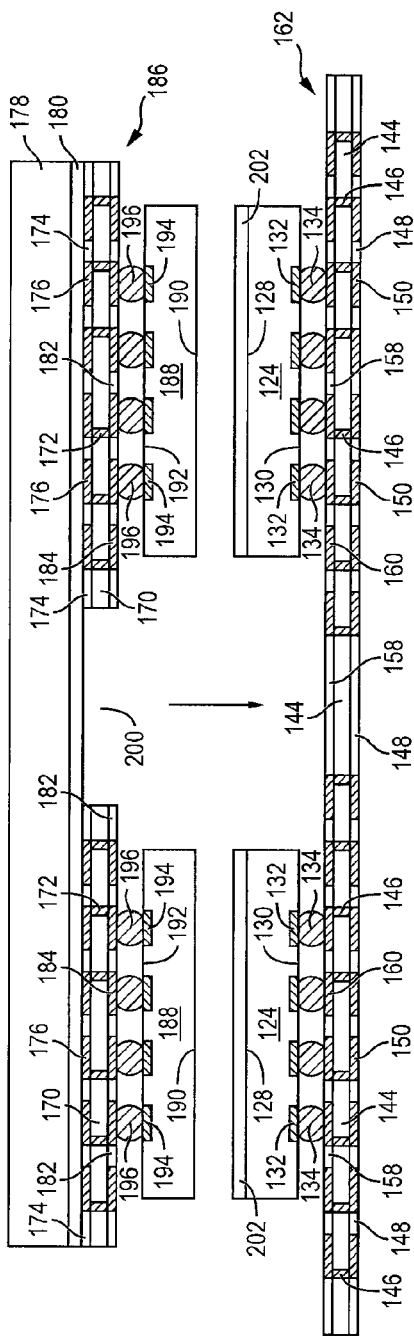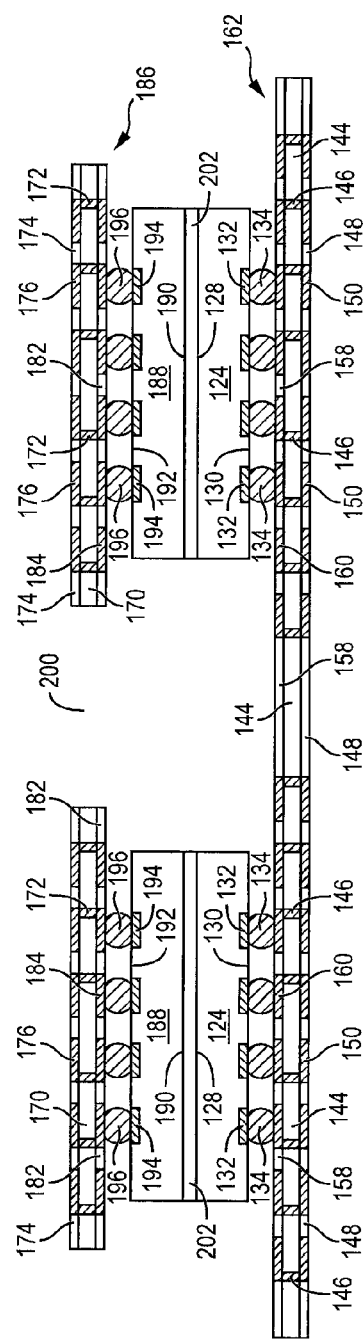

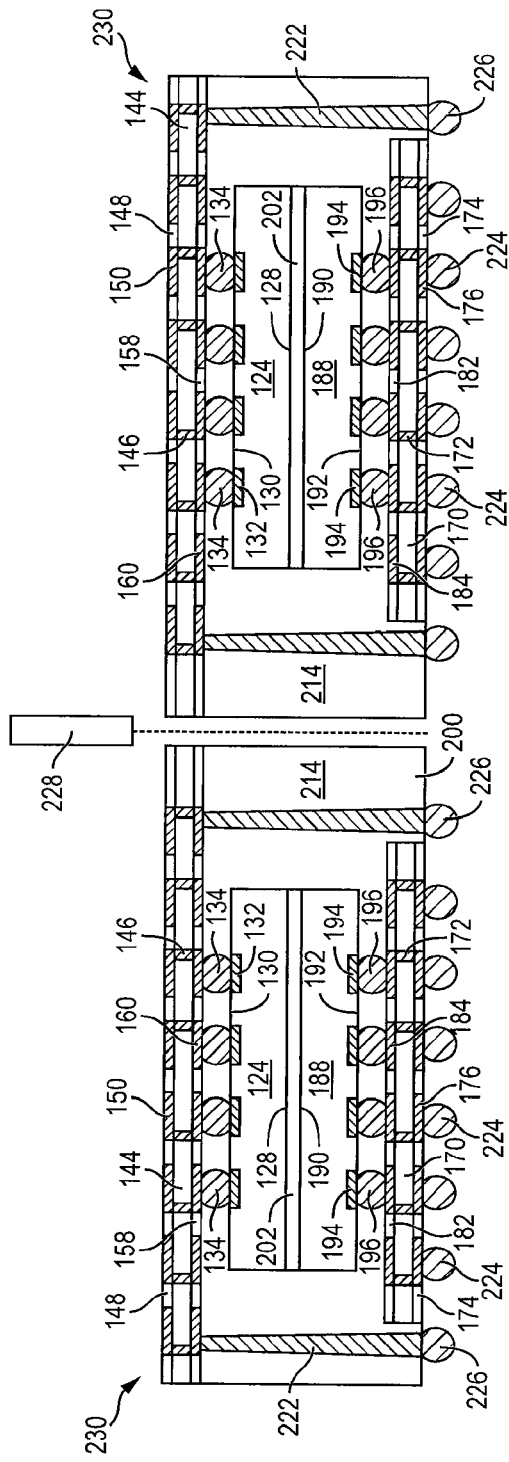
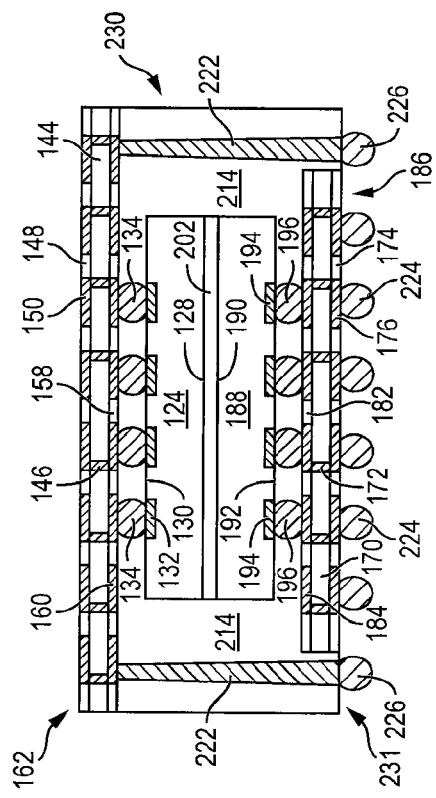
FIG. 4t
FIG. 5

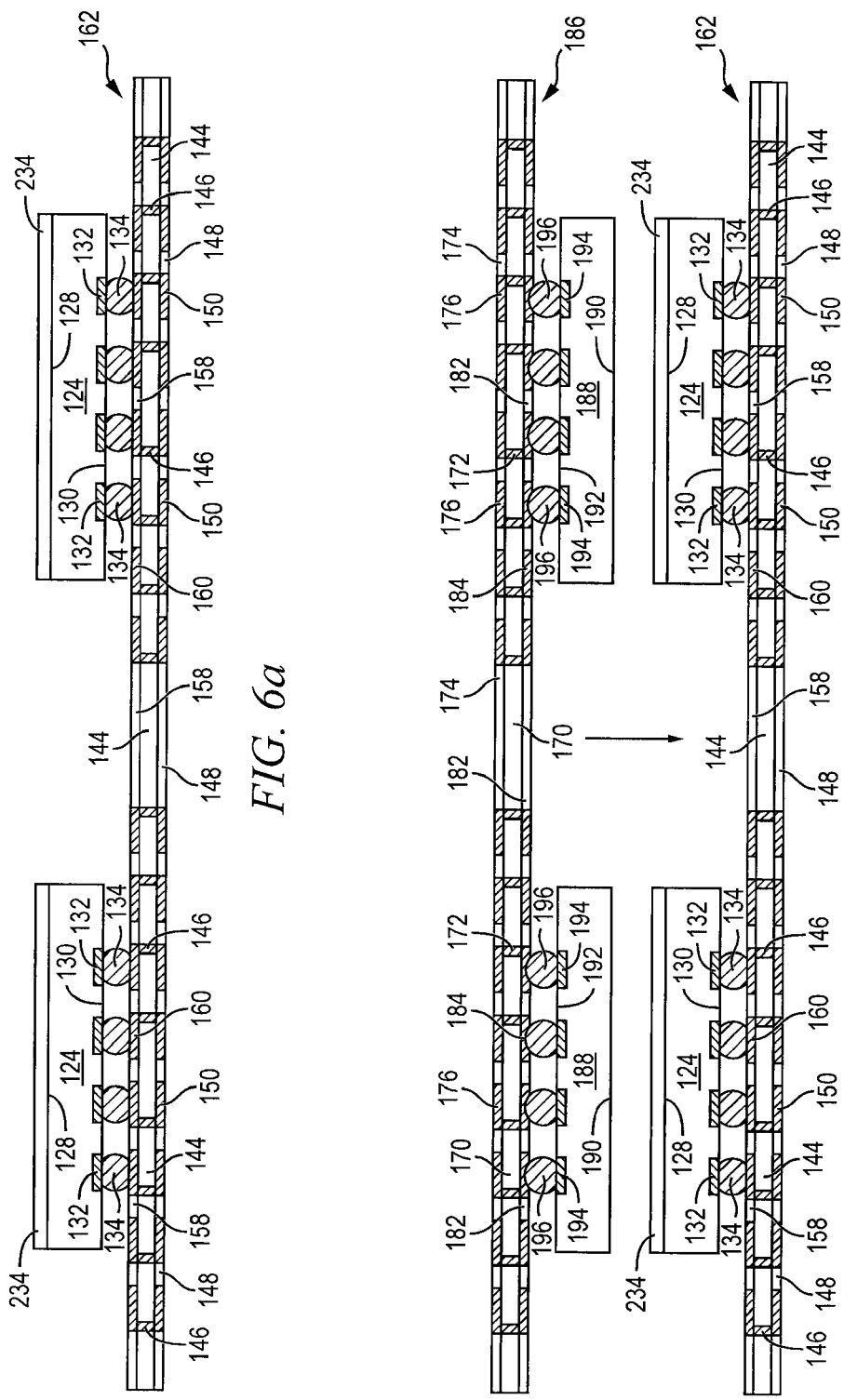

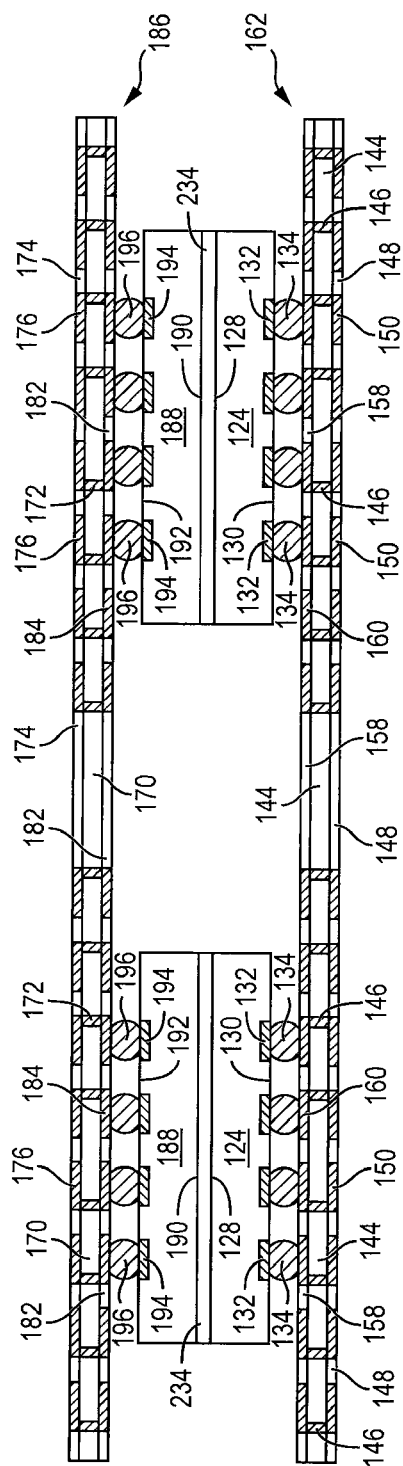
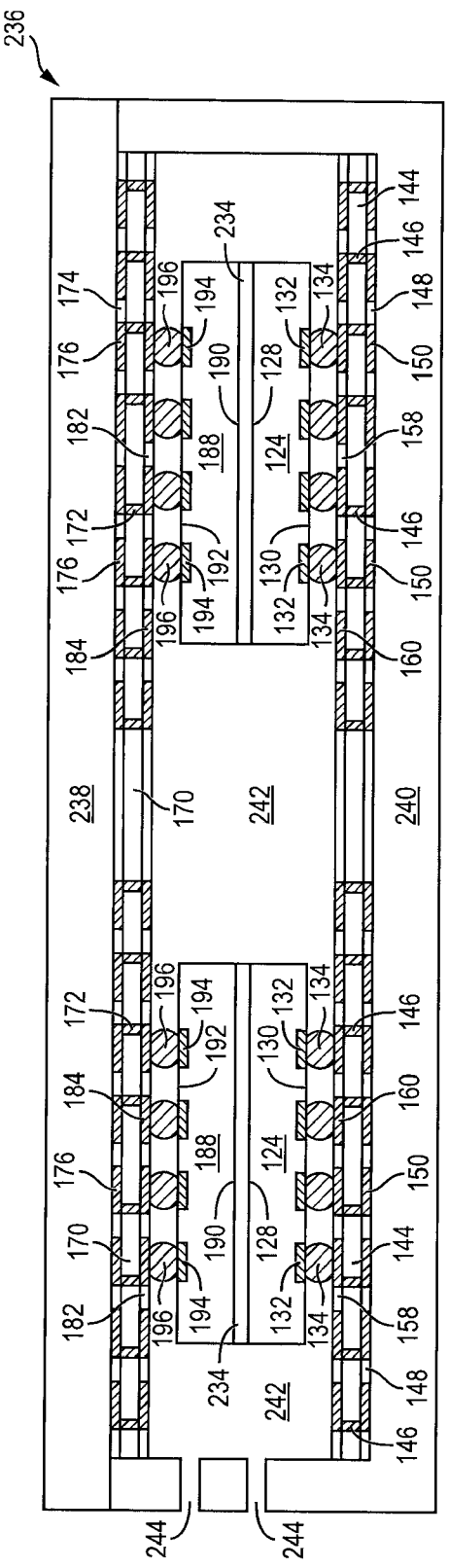
FIG. 6c
FIG. 6d

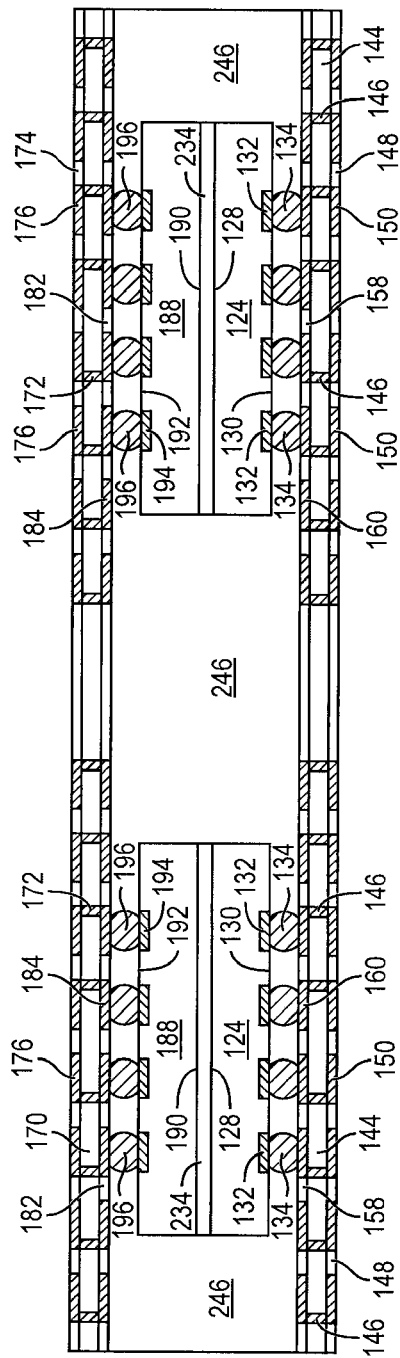
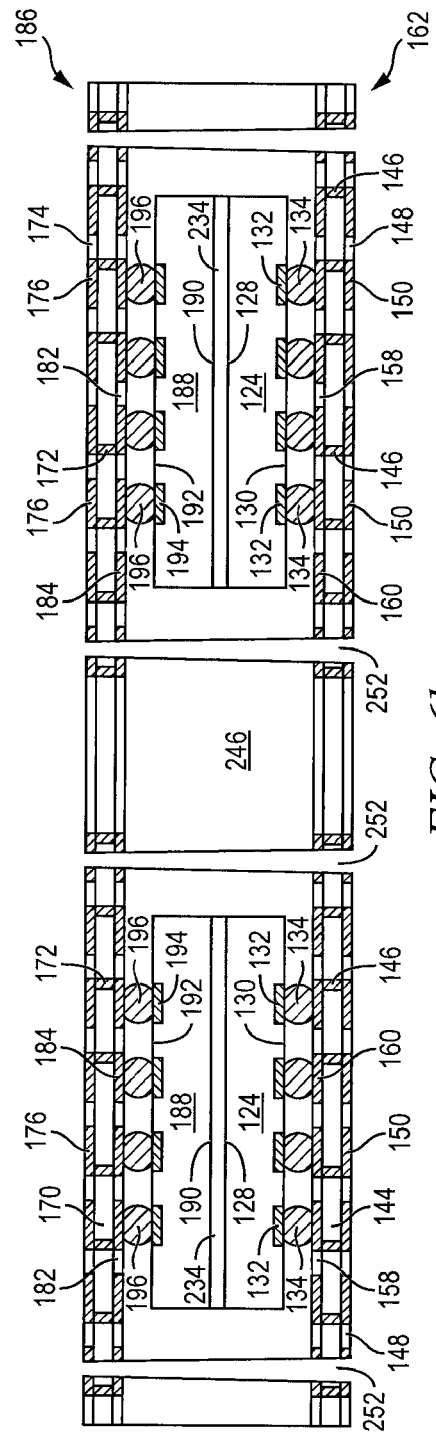
FIG. 6g
FIG. 6h

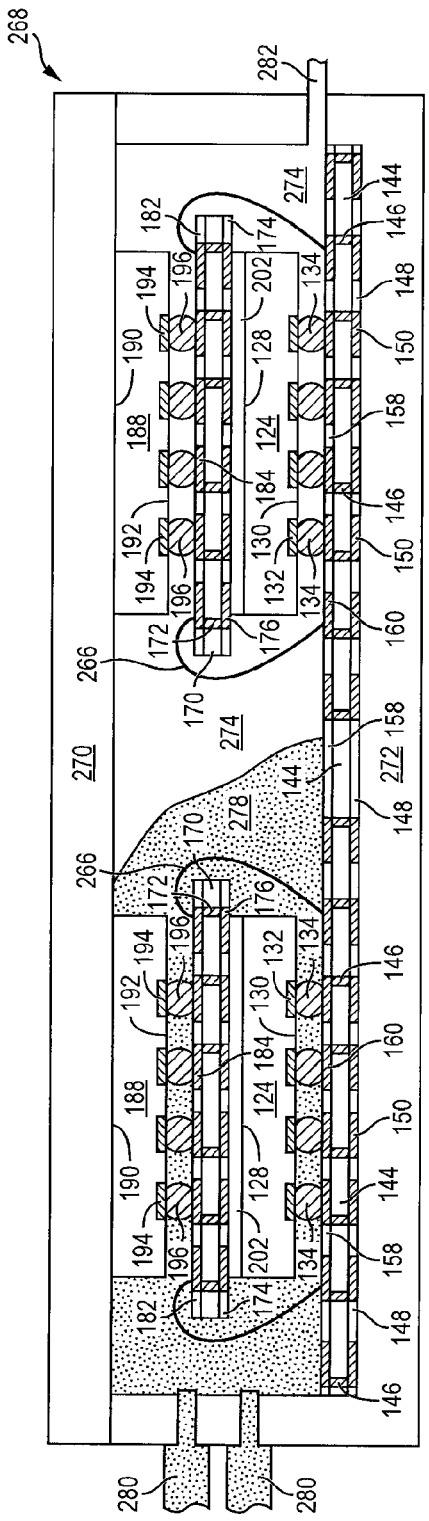
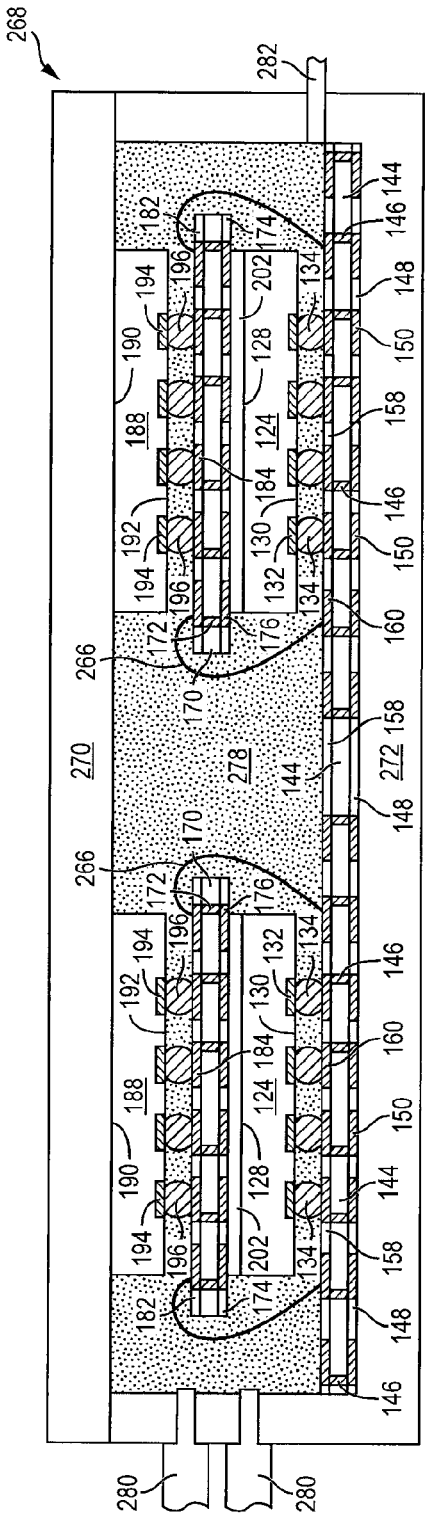
FIG. 8d
FIG. 8e

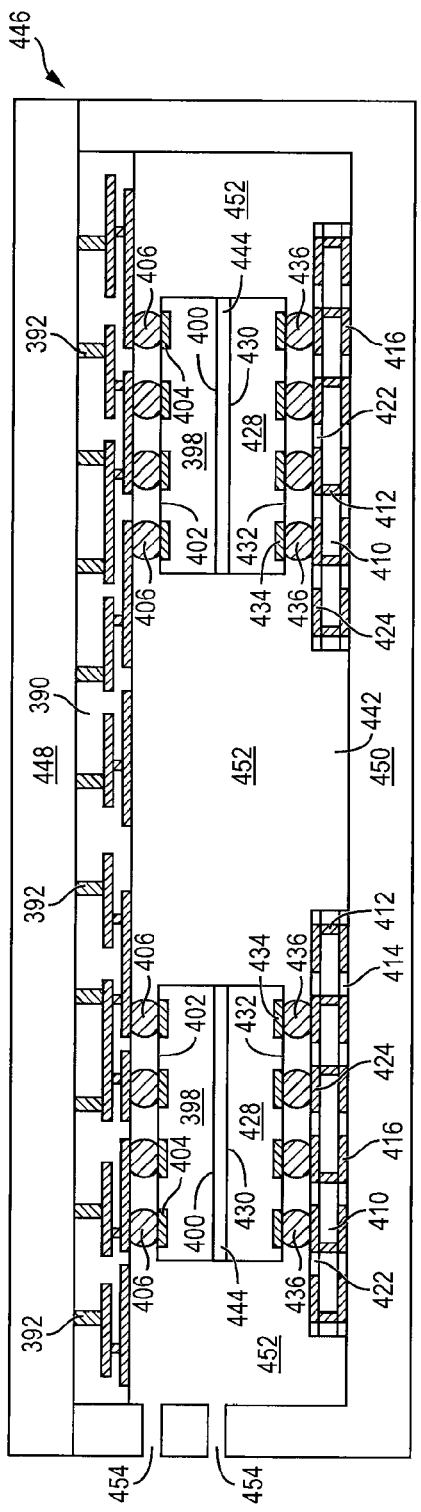
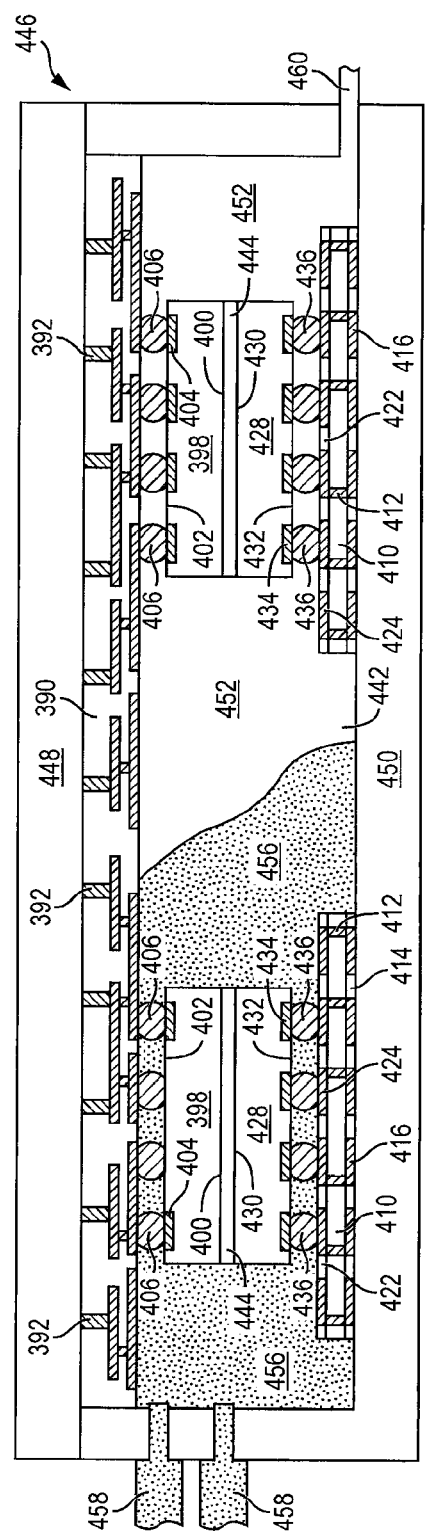
FIG. 12j
FIG. 12k

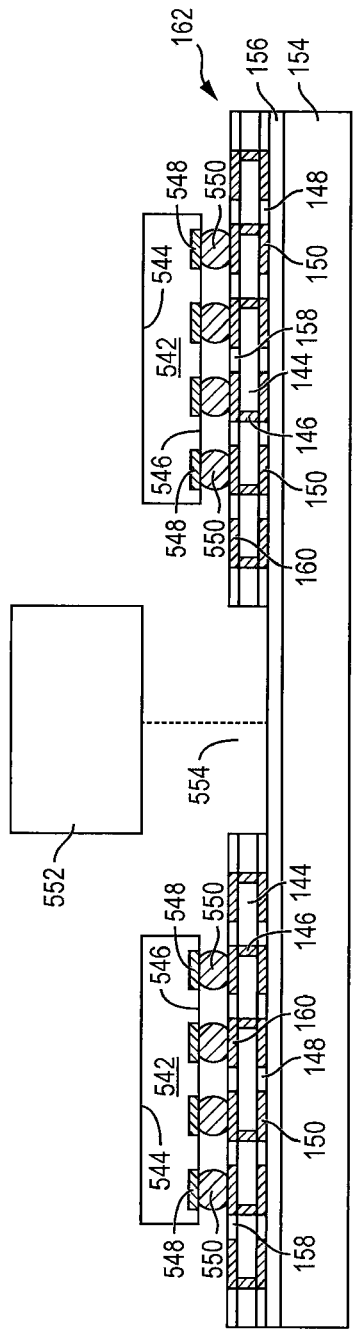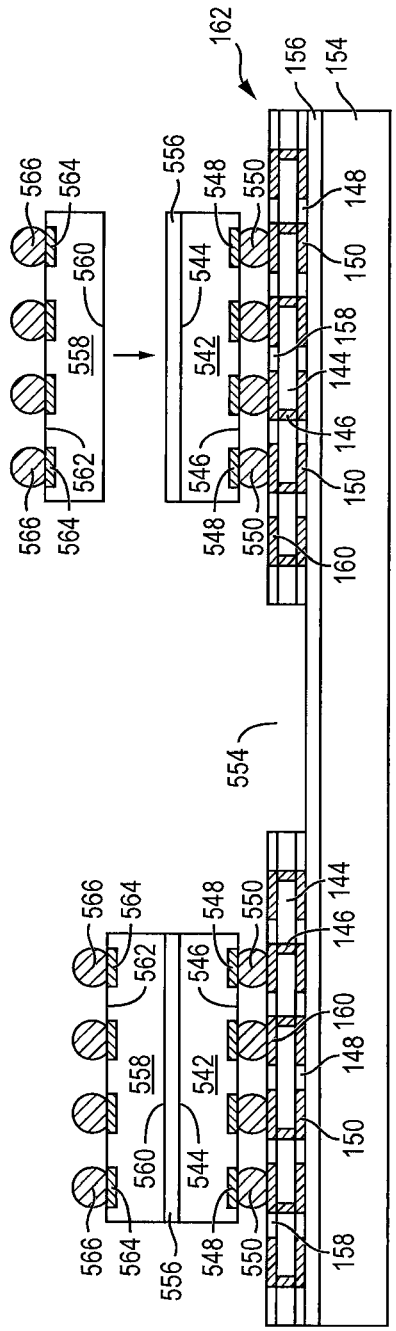

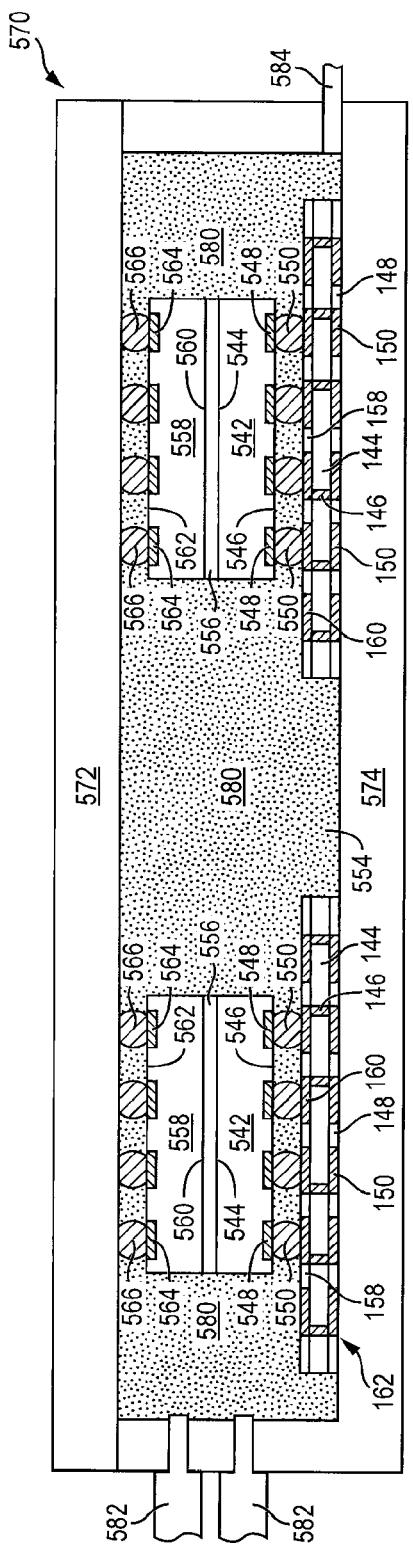
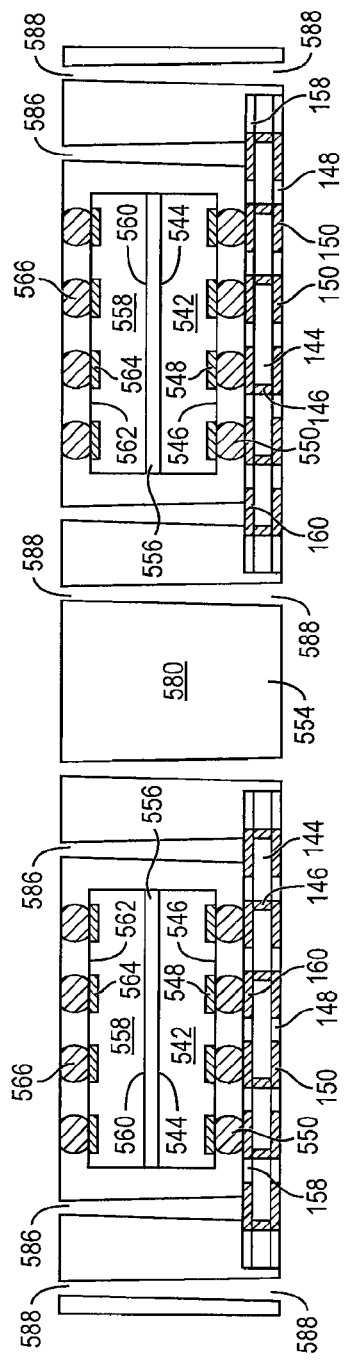
FIG. 15f
FIG. 15g

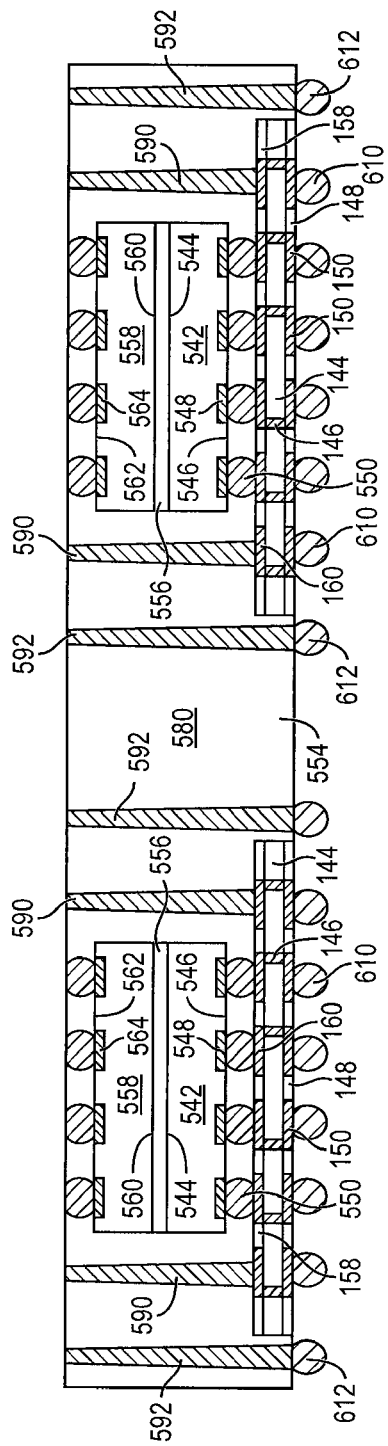
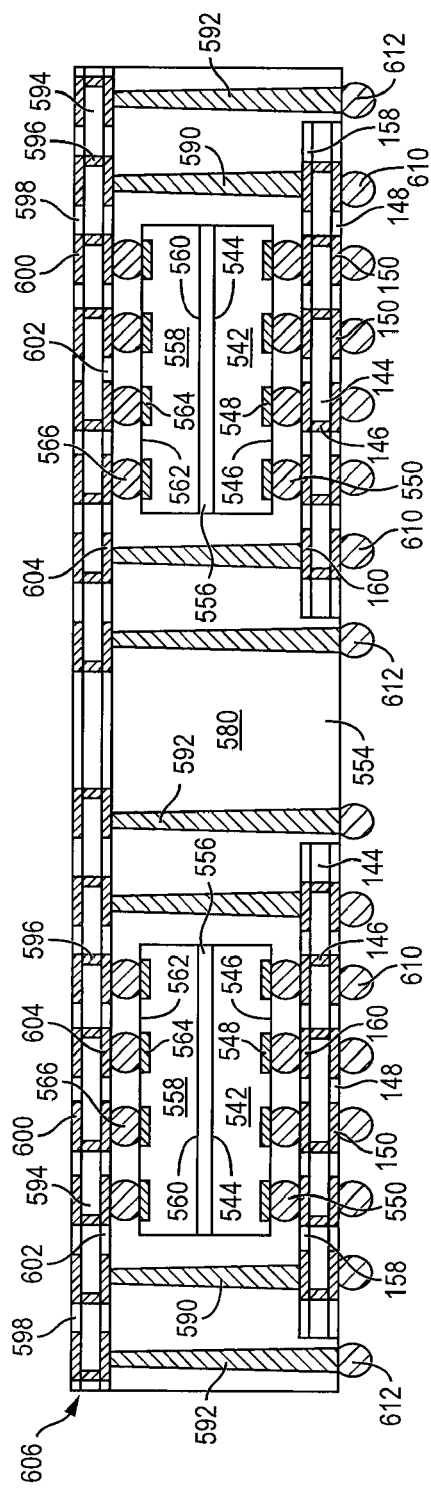
FIG. 15h
FIG. 15i

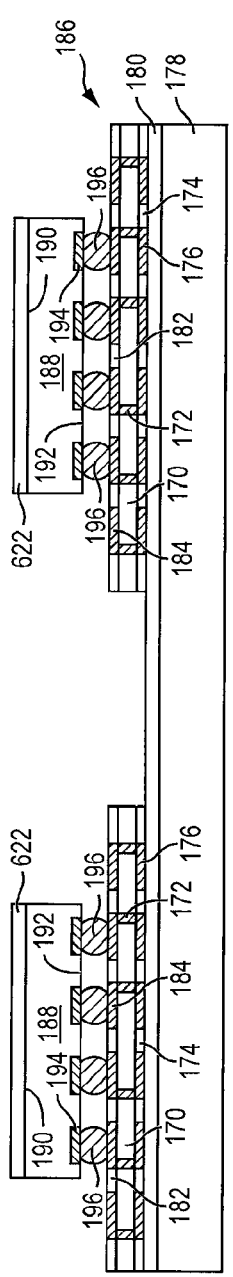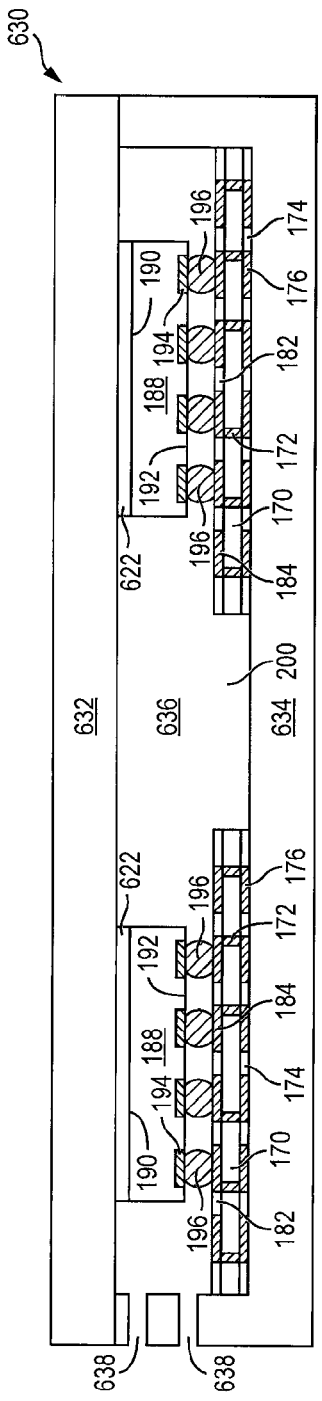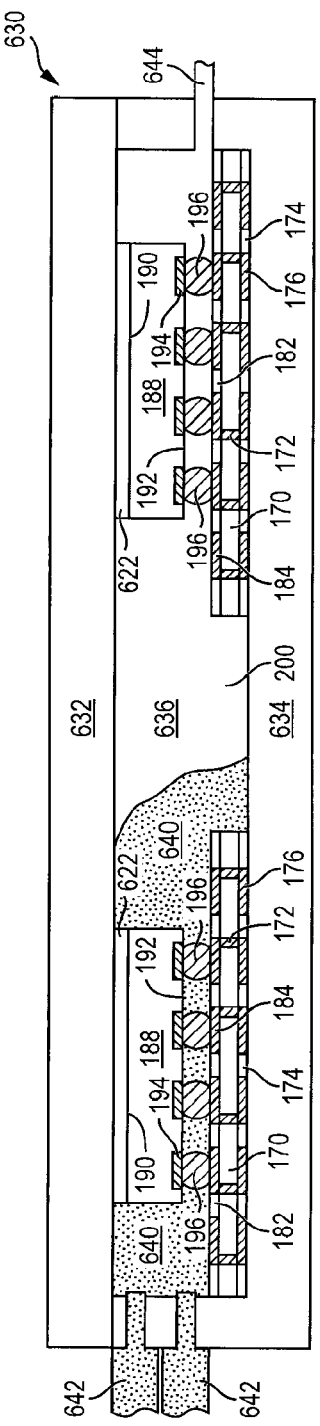

SEMICONDUCTOR DEVICE AND METHOD OF FORMING STACKED SEMICONDUCTOR DIE AND CONDUCTIVE INTERCONNECT STRUCTURE THROUGH AN ENCAPSULANT

FIELD OF THE INVENTION

The present invention relates in general to semiconductor devices and, more particularly, to a semiconductor device and method of forming a stacked-die semiconductor package with an interconnect structure through an encapsulant to electrically connect the stacked die to a common surface of the package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor device may contain stacked semiconductor die mounted to a substrate for high density and efficient integration of die. A plurality of first bond wires is formed to electrically connect a lower die to the substrate and a plurality of second bond wires is formed to electrically connect an upper die to the substrate. An encapsulant is formed over the die and the substrate. The bond wires formed between the upper and lower die and the substrate can cause an undesirable increase in the height of the package. An adhesive layer between the die must have sufficient thickness and headroom to enable the first bond wires to clear a footprint of the lower die without contacting the upper die. Additionally, the encapsulant must have sufficient thickness and headroom to enable the second bond wires to clear a footprint of the upper die without breaching a surface of the encapsulant. The process of forming bond wires greatly increases manufacturing time and expense, as well as increasing package profile.

SUMMARY OF THE INVENTION

A need exists for a simple, cost effective, and high-density semiconductor package with stacked semiconductor die and an interconnect structure to enable accessibility of input and output (I/O) signals of the stacked die from a single surface of the semiconductor package. Accordingly, in one embodiment, the present invention is a method of making a semiconductor device having first and second surfaces comprising the steps of providing a first substrate, forming a first conductive layer over the first substrate, mounting a first semiconductor die to the first substrate electrically connected to the first conductive layer, providing a second substrate, forming a second conductive layer over the second substrate, mounting a second semiconductor die to the second substrate electrically connected to the second conductive layer, mounting the first semiconductor die over the second semiconductor die, depositing an encapsulant over the first and second semiconductor die and the first and second substrates, and forming a first conductive interconnect structure through the encapsulant to electrically connect the first and second semiconductor die to the second surface of the semiconductor device.

In another embodiment, the present invention is a method of making a semiconductor device having first and second surfaces comprising the steps of providing a first substrate, mounting a first semiconductor die over the first substrate, providing a second substrate, mounting a second semiconductor die over the second substrate, mounting the second semiconductor die over the first semiconductor die, depositing a first encapsulant over the first and second semiconductor die, and forming a plurality of first interconnect structures through the first encapsulant to electrically connect the first and second semiconductor die to the second surface of the semiconductor device.

In another embodiment, the present invention is a method of making a semiconductor device comprising the steps of providing a first substrate, providing a second substrate, mounting a first semiconductor die to the first substrate, mounting a second semiconductor die to the second substrate, mounting the first semiconductor die over the second semiconductor die, and forming a first interconnect structure to electrically connect the first and second semiconductor die to a common surface of the semiconductor device.

In another embodiment, the present invention is a semiconductor device comprising a first substrate. A first semiconductor die is mounted to the first substrate. A second semiconductor die is mounted over the first semiconductor die. A second substrate is mounted to the second semiconductor die. An encapsulant is deposited over the first substrate, the second substrate, and the first and second semiconductor die. A conductive interconnect structure is formed through the encapsulant electrically connecting the first and second semiconductor die to a common surface of the semiconductor device.

BRIEF DESCRIPTION OF THE DRAWINGS

FIG. 5 illustrates a stacked-die semiconductor package with an interconnect structure through an encapsulant according to FIGS. 4a-4t;

FIGS. 6a-6j illustrate a process of forming a stacked-die semiconductor package with first and second substrates and an interconnect structure through an encapsulant to electrically connect the first and second substrates;

FIGS. 8a-8h illustrate a process of forming a stacked-die semiconductor package with wirebonds electrically connecting an upper semiconductor die to a first substrate;

FIGS. 15a-15j illustrate a process of forming a stacked-die semiconductor package with multiple interconnect structures to electrically connect the stacked die to a top and bottom surface of the package;

DETAILED DESCRIPTION OF THE DRAWINGS

Figure 1:
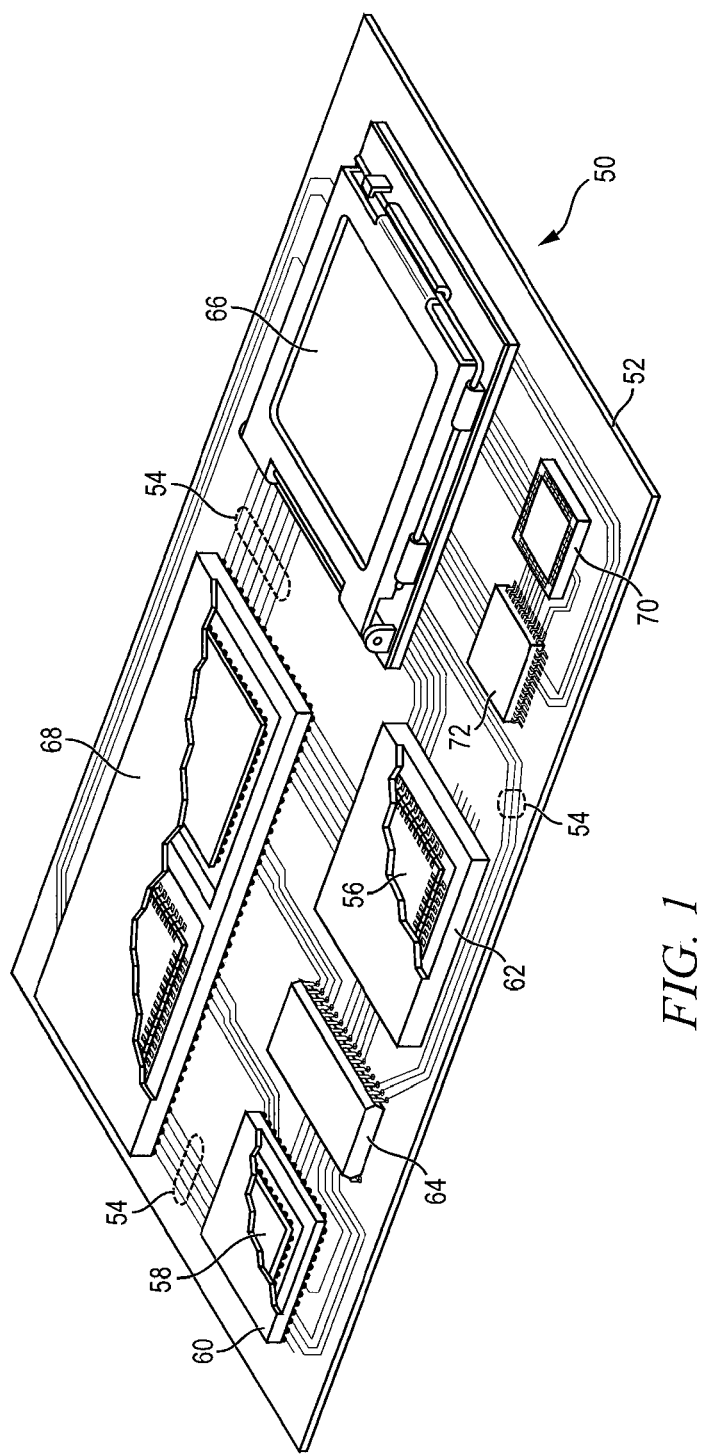
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photo resist or positive-acting photo resist. Second, the photoresist layer is transferred into the wafer surface. The transfer occurs when etching removes the portion of the top layers of semiconductor wafer not covered by the photoresist. The chemistry of photoresists is such that the photoresist dissolves slowly and resists removal by chemical etching solutions while the portion of the top layers of the semiconductor wafer not covered by the photoresist is removed more rapidly. The process of forming, exposing, and removing the photoresist, as well as the process of removing a portion of the semiconductor wafer can be modified according to the particular resist used and the desired results.

In negative-acting photo resists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photo resists, photoresist is exposed to light and is changed from relatively nonsoluble condition to a much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
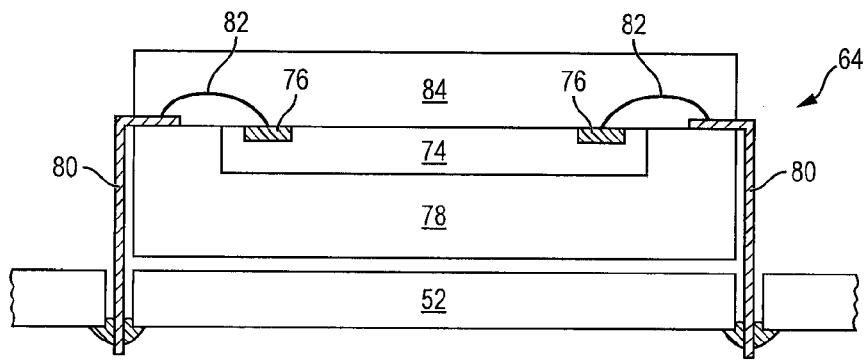
FIGS. 2a-2c illustrate further detail of the representative semiconductor packages mounted to the PCB.
Figure 2B:
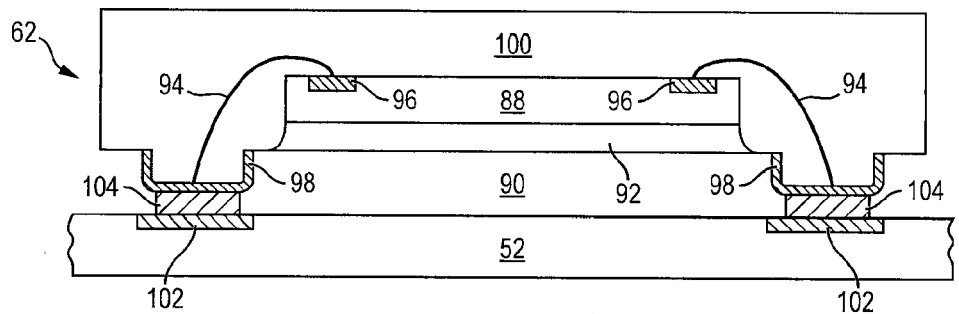
Figure 2C:
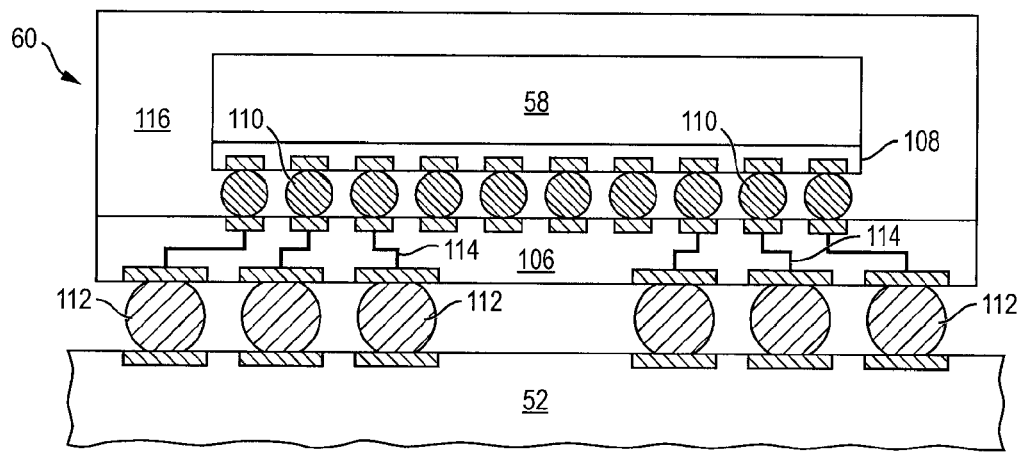

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
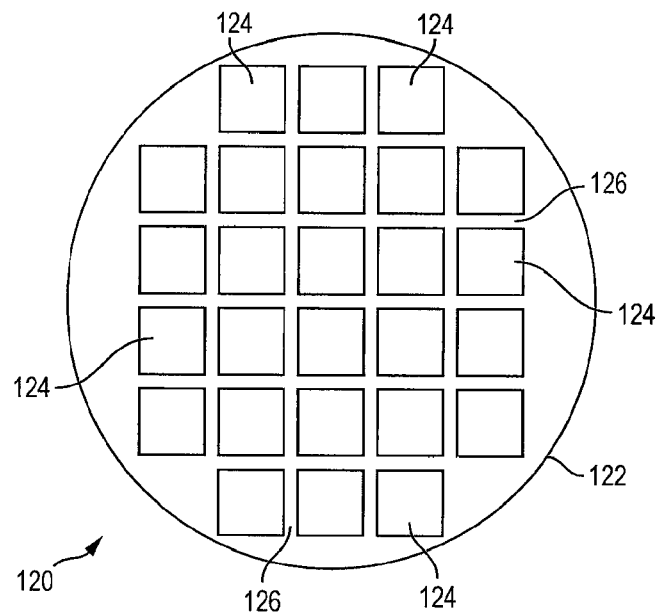
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on semiconductor wafer 120 separated by a non-active, inter-die wafer area or saw street 126 as described above. Saw street 126 provides cutting areas to singulate semiconductor wafer 120 into individual semiconductor die 124.

Figure 3B:
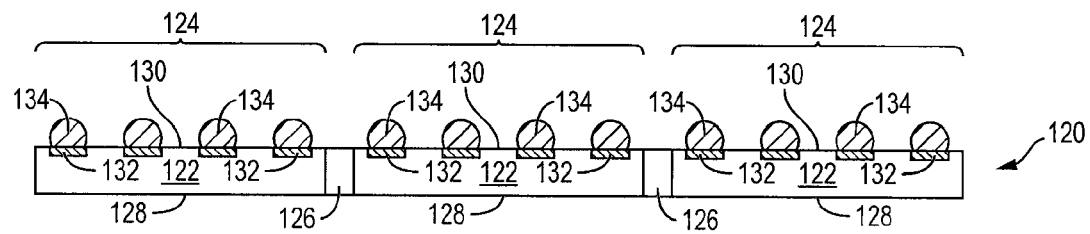

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 134. In some applications, bumps 134 are reflowed a second time to improve electrical contact to conductive layer 132. Bumps 134 can also be compression bonded to conductive layer 132. Bumps 134 represent one type of interconnect structure that can be formed over conductive layer 132. The interconnect structure can also use stud bump, micro bump, or other electrical interconnect.

Figure 3C:
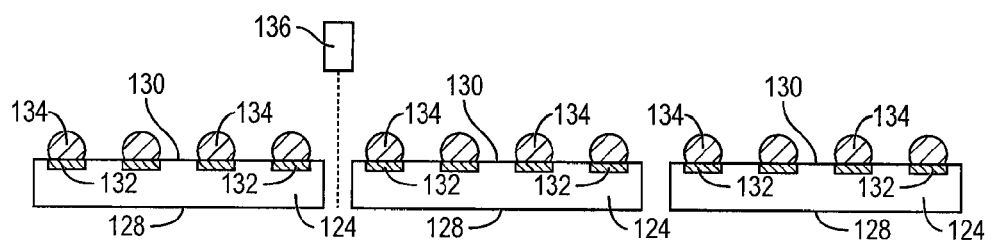

In FIG. 3c, semiconductor wafer 120 is singulated through saw street 126 using a saw blade or laser cutting tool 136 into individual semiconductor die 124.

Figure 4A:
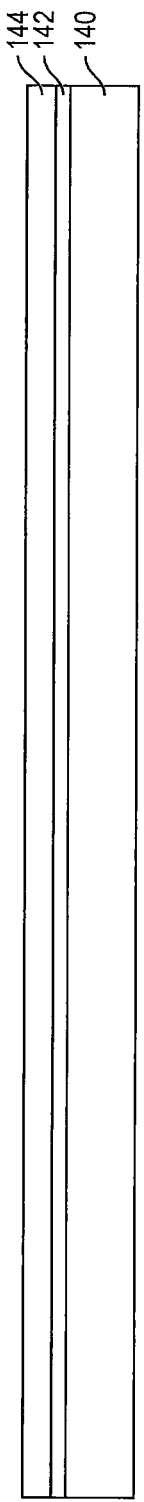
FIGS. 4a-4t illustrate a process of forming a stacked-die semiconductor package with an interconnect structure through an encapsulant to electrically connect the stacked die to a common surface of the package.

FIGS. 4a-4t illustrate, in relation to FIGS. 1 and 2a-2c, a process of forming a stacked-die semiconductor package with an interconnect structure through an encapsulant to electrically connect the stacked die to a common surface of the package. In FIG. 4a, a temporary substrate or carrier 140 contains sacrificial base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or release layer. A semiconductor wafer or substrate 144 contains base material, such as silicon, germanium, gallium arsenide, indium phosphide, or silicon carbide, for structural support. As a semiconductor wafer, substrate 144 can contain embedded integrated semiconductor die or discrete devices. Substrate 144 can also be a multi-layer flexible laminate, ceramic or leadframe. Substrate 144 is mounted to interface layer 142 over carrier 140.

Figure 4B:
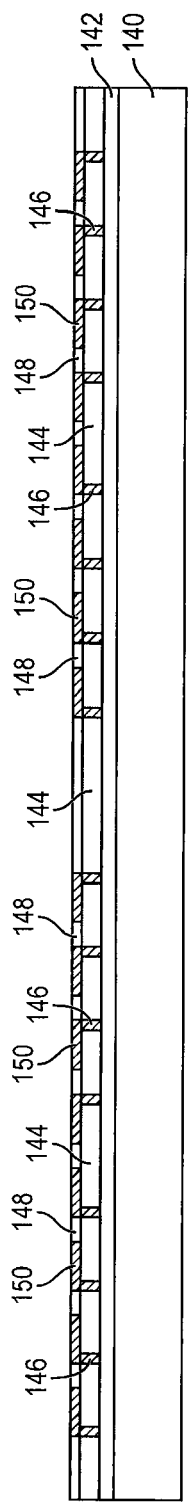

In FIG. 4b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiOn), tantalum pentoxide (Ta2O5), aluminum oxide (Al2O3), or other material having similar insulating and structural properties. A portion of insulating layer 148 is removed by an etching process with a patterned photoresist layer to expose substrate 144 and conductive vias 146.

An electrically conductive layer 150 is formed over the exposed substrate 144 and conductive vias 146 using a patterning and metal deposition process such as printing, PVD, CVD, sputtering, electrolytic plating, and electroless plating. Conductive layer 150 is one or more layers of Al, Cu, Sn, Ni, Au, Ag, or other suitable electrically conductive material. Conductive layer 150 is electrically connected to conductive vias 146.

Figure 4C:
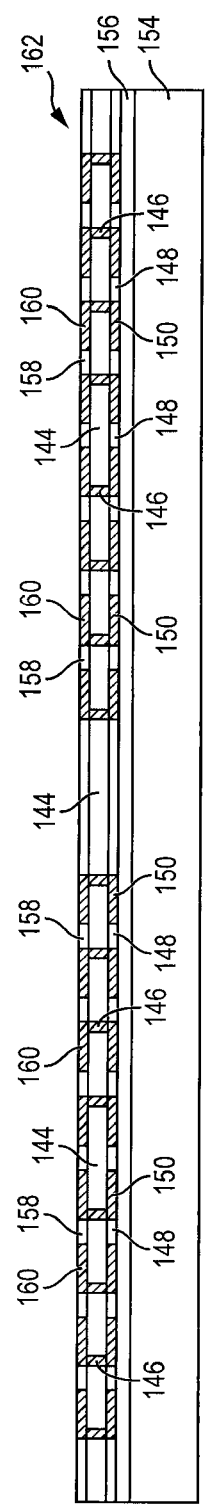

In FIG. 4c, a temporary substrate or carrier 154 contains sacrificial base material such as silicon, polymer, beryllium oxide, glass, or other suitable low-cost, rigid material for structural support. An interface layer or double-sided tape 156 is formed over carrier 154 as a temporary adhesive bonding film, etch-stop layer, or release layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of SiO2, Si3N4, SiOn, Ta2O5, Al2O3, or other material having similar insulating and structural properties. A portion of insulating layer 158 is removed by an etching process with a patterned photoresist layer to expose substrate 144 and conductive vias 146.

An electrically conductive layer 160 is formed over the exposed substrate 144 and conductive vias 146 using a patterning and metal deposition process such as printing, PVD, CVD, sputtering, electrolytic plating and electroless plating. Conductive layer 160 can be one or more layers of Al, Cu, Sn, Ni, Au, Ag, or other suitable electrically conductive material. Conductive layer 160 is electrically connected to conductive vias 146 and conductive layer 150. In another embodiment, conductive vias 146 are formed through substrate 144 after forming conductive layers 150 and/or 160. Conductive layers 150 and 160 can be formed prior to insulating layer 148 and 158, respectively. The resulting wafer-form through silicon via (TSV) interposer or substrate 162 provides electrical interconnect vertically and laterally across the substrate.

Figure 4D:
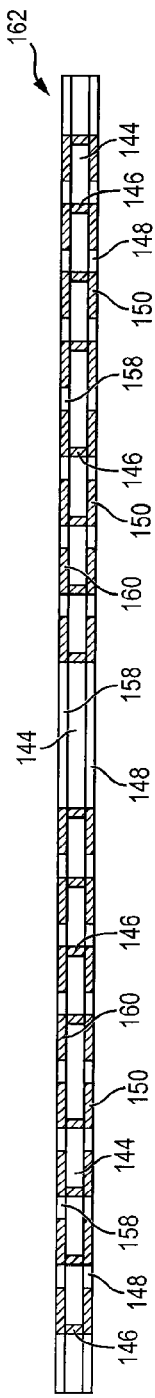

In FIG. 4d, carrier 154 and interface layer 156 are removed by chemical etching, mechanical peeling, CMP, mechanical grinding, thermal bake, UV light, laser scanning, or wet stripping to expose conductive layer 150 and insulating layer 148.

Figure 4E:
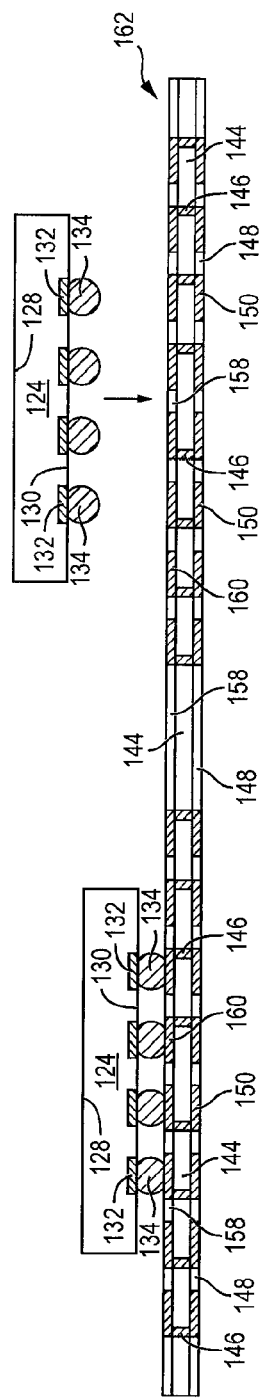
Figure 4F:
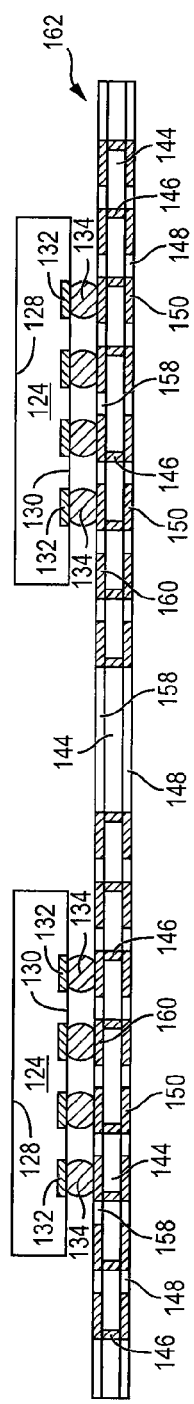

In FIG. 4e, semiconductor die 124 from FIGS. 3a-3c are mounted to conductive layer 160 of TSV substrate 162 using a pick and place operation with active surface 130 oriented toward the substrate. Bumps 134 are reflowed to electrically connect conductive layer 132 of semiconductor die 124 to conductive layer 160 of TSV substrate 162. FIG. 4f shows semiconductor die 124 mounted to TSV substrate 162.

Figure 4G:
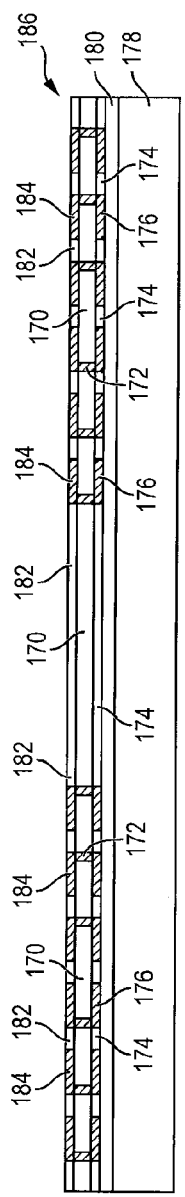

In FIG. 4g, a substrate layer 170 contains a base material, such as silicon, germanium, gallium arsenide, indium phosphide, or silicon carbide, for structural support, similar to FIGS. 4a-4d. As a semiconductor wafer, substrate 170 can contain embedded integrated semiconductor die or discrete devices. Substrate 170 can also be a multi-layer flexible laminate, ceramic, or leadframe. A plurality of vias is formed through substrate 170 using laser drilling, mechanical drilling or DRIE. The vias are filled with Al, Cu, Sn, Ni, Au, Ag, Ti, W, poly-silicon, or other suitable metal deposition process to form a plurality of z-direction vertical interconnect conductive vias 172.

An insulating layer 174 is formed over a surface of substrate 170 and conductive vias 172 using PVD, CVD, printing, spin coating, spray coating, sintering or thermal oxidation. The insulating layer 174 contains one or more layers of SiO2, Si3N4, SiON, Ta2O5, Al2O3, or other material having similar insulating and structural properties. A portion of insulating layer 174 is removed by an etching process with a patterned photoresist layer to expose substrate 170 and conductive vias 172.

Conductive layer 176 is formed over the exposed substrate 170 and conductive vias 172 using a patterning and metal deposition process such as printing, PVD, CVD, sputtering, electrolytic plating, and electroless plating. Conductive layer 176 can be one or more layers of Al, Cu, Sn, Ni, Au, Ag, or other suitable electrically conductive material. Conductive layer 176 is electrically connected to conductive vias 172.

A temporary substrate or carrier 178 contains sacrificial base material such as silicon, polymer, beryllium oxide, glass, or other suitable low-cost, rigid material for structural support. An interface layer 180 is formed over carrier 178 as a temporary adhesive bonding film, etch-stop layer, or release layer. Leading with insulating layer 174 and conductive layer 176, substrate 170 is mounted to carrier 178 with interface layer 180.

An insulating or passivation layer 182 is formed over substrate 170 and conductive vias 172 using PVD, CVD, printing, spin coating, spray coating, sintering or thermal oxidation. The insulating layer 182 contains one or more layers of SiO2, Si3N4, SiON, Ta2O5, Al2O3, or other material having similar insulating and structural properties. A portion of insulating layer 182 is removed by an etching process with a patterned photoresist layer to expose substrate 170 and conductive vias 172.

An electrically conductive layer 184 is formed over the exposed substrate 170 and conductive vias 172 using a patterning and metal deposition process such as printing, PVD, CVD, sputtering, electrolytic plating, and electroless plating. Conductive layer 184 can be one or more layers of Al, Cu, Sn, Ni, Au, Ag, or other suitable electrically conductive material. Conductive layer 184 is electrically connected to conductive vias 172. In another embodiment, conductive vias 172 are formed through substrate 170 after forming conductive layers 176 and/or 184. Conductive layers 176 and 184 can be formed prior to insulating layer 174 and 182, respectively. The resulting wafer-form TSV interposer or substrate 186 provides electrical interconnect vertically and laterally across the substrate.

Figure 4H:
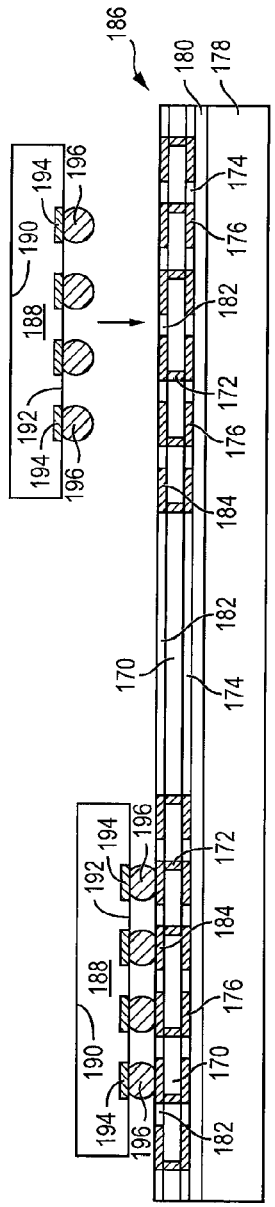

In FIG. 4h, a plurality of semiconductor die 188 originating from a semiconductor wafer, similar to FIGS. 3a-3c, has a back surface 190 and an active surface 192 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 192 to implement analog circuits or digital circuits, such as DSP, ASIC, memory or other signal processing circuit. Semiconductor die 188 may also contain IPDs, such as inductors, capacitors, and resistors, for RF signal processing. A plurality of contact pads 194 is formed on active surface 192 and electrically connected to the circuits on the active surface. A plurality of bumps 196 is formed over contact pads 194.

Figure 4I:
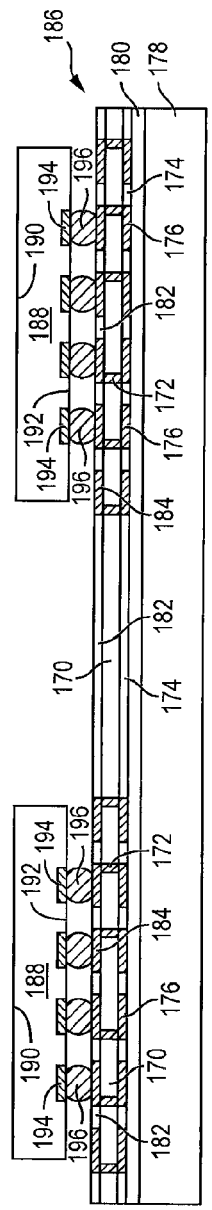

Each semiconductor die 188 is mounted to conductive layer 184 of TSV substrate 186 using a pick and place operation with active surface 192 oriented toward the substrate. Bumps 196 are reflowed to electrically connect conductive layer 194 of semiconductor die 188 to conductive layer 184 of TSV substrate 186. FIG. 4i shows semiconductor die 188 mounted to TSV substrate 186.

Figure 4J:
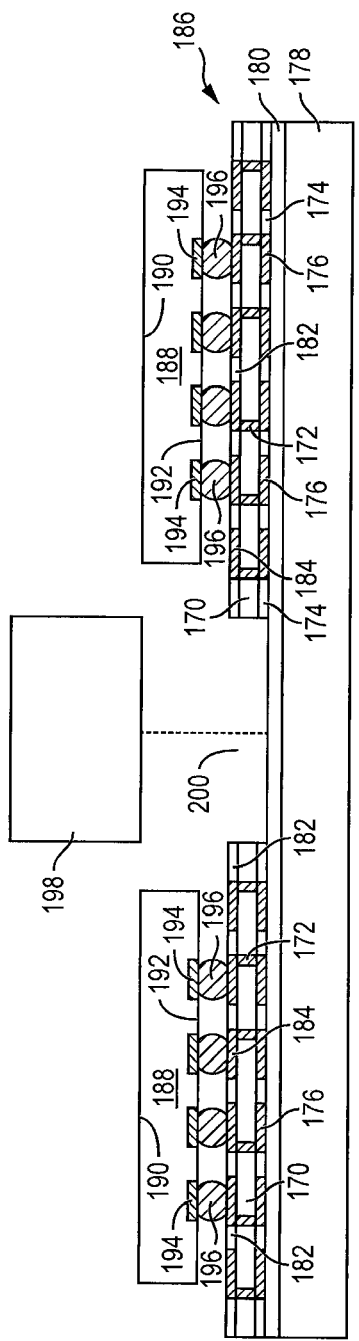

In FIG. 4j, a portion of TSV substrate 186 is removed using a saw blade or laser cutting tool 198 to create gap 200 between semiconductor die 188 and extending down to interface layer 180. Carrier 178 provides structural support for TSV substrate 186 and semiconductor die 188 during formation of gap 200.

Figure 4K:
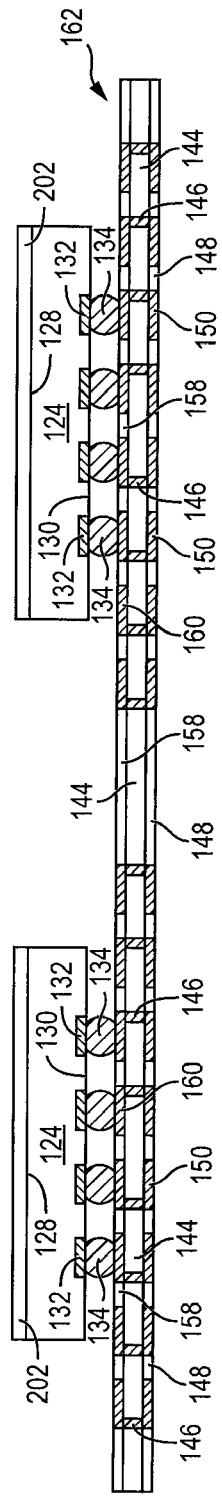

In FIG. 4k, an adhesive layer 202 is formed over back surface 128 of semiconductor die 124. Adhesive layer 202 can be thermal epoxy, epoxy resin, B-stage epoxy laminating film, ultraviolet (UV) B-stage film adhesive layer, UV B-stage film adhesive layer including acrylic polymer, thermo-setting adhesive film layer, wire-in-film (WIF) encapsulant material, suitable wafer backside coating, epoxy resin with organic filler, silica filler, or polymer filler, acrylate based adhesive, epoxy-acrylate adhesive, a PI-based adhesive or other suitable adhesive material.

In FIG. 4l, semiconductor die 188 is mounted to adhesive layer 202, over semiconductor die 124, with back surface 190 oriented toward back surface 128. In another embodiment, adhesive layer 202 is formed over back surface 190 of semiconductor die 188.

FIG. 4m shows semiconductor die 188 mounted to semiconductor die 124 with adhesive layer 202. Carrier 178 and interface layer 180 are removed by chemical etching, mechanical peeling, CMP, mechanical grinding, thermal bake, UV light, laser scanning, or wet stripping to expose insulating layer 174 and conductive layer 176.

Figure 4N:
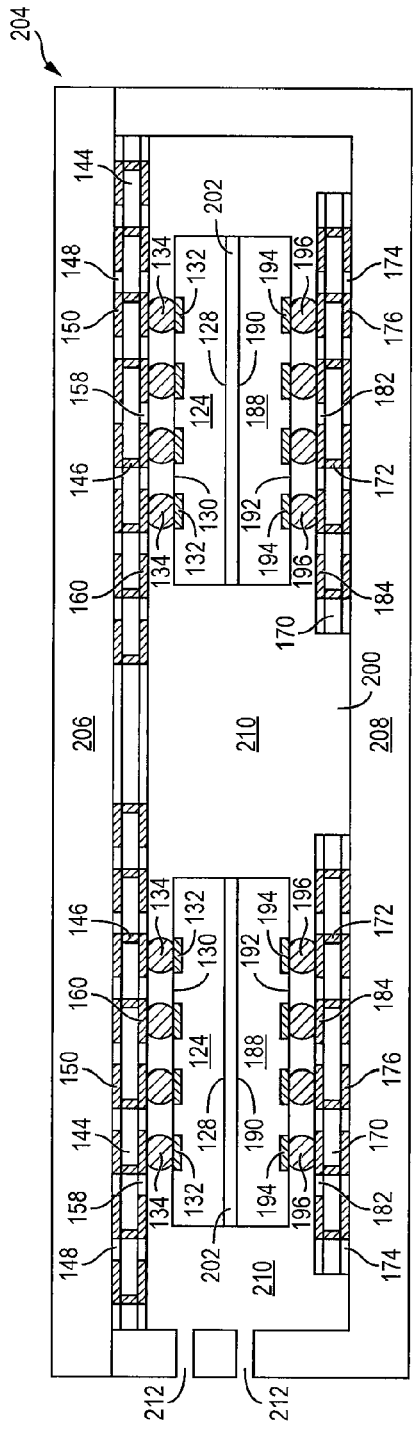

In FIG. 4n, the assembly from FIG. 4m, containing semiconductor die 124, semiconductor die 188, TSV substrate 162, and TSV substrate 186, is placed in chase mold 204. Chase mold 204 has an upper mold support 206 and lower mold support 208, which are brought together to enclose semiconductor die 124, semiconductor die 188, TSV substrate 162, and TSV substrate 186 with open space 210. The lower mold support 208 includes a plurality of openings or gates 212 for injecting MUF material into open space 210.

Figure 4O:
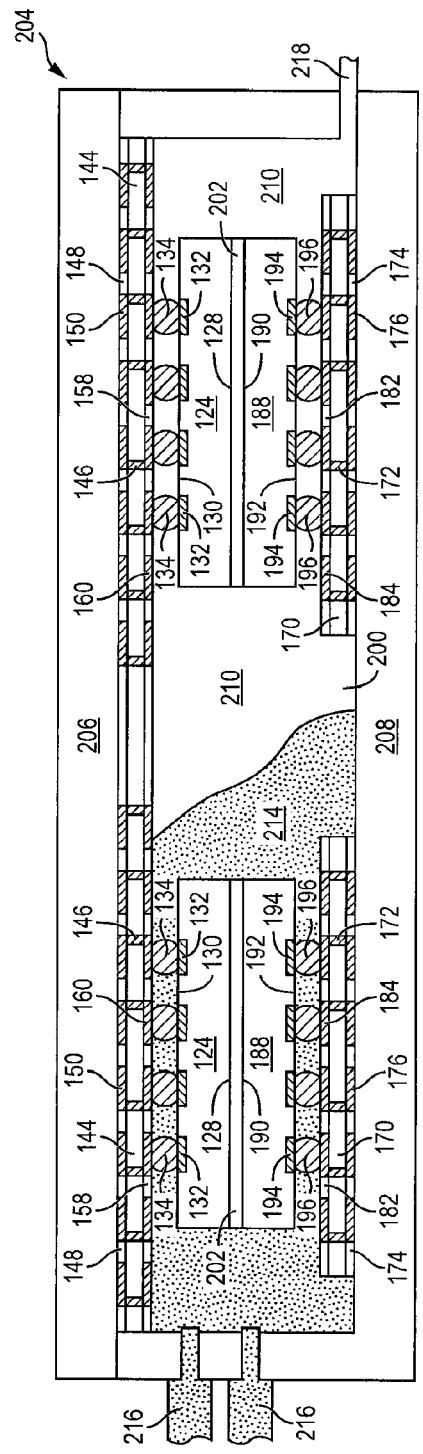
Figure 4P:
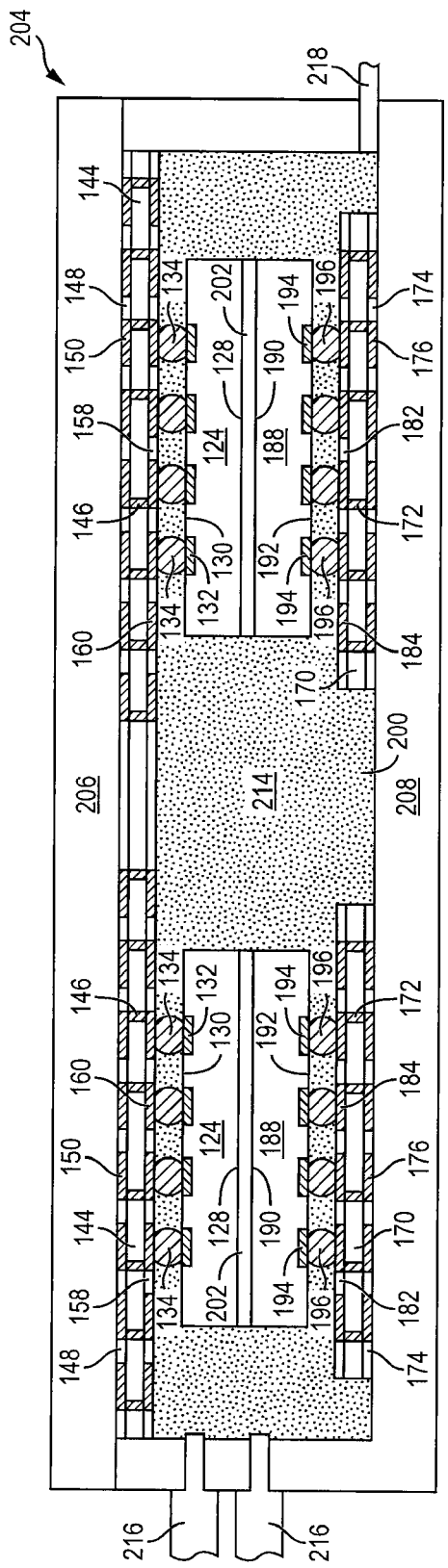
Figure 4Q:
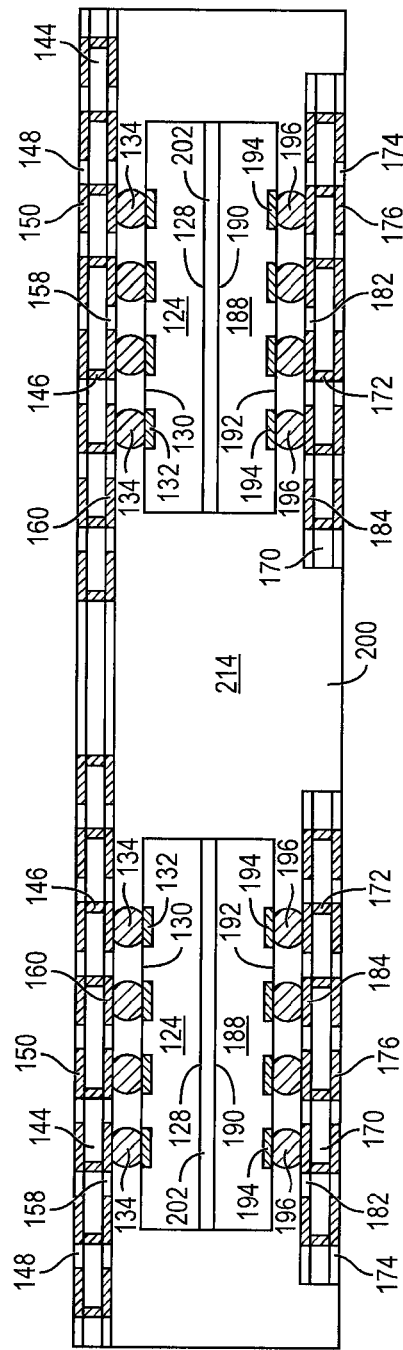

In FIG. 4o, MUF material 214 in a liquid state is injected through gates 212 with nozzles 216 while an optional vacuum assist 218 draws pressure from the side of chase mold 204 to uniformly fill open space 210 over semiconductor die 124, semiconductor die 188, TSV substrate 162, and TSV substrate 186, and within gap 200 with MUF material 214. MUF material 214 can be an encapsulant, molding compound, polymer composite material, such as epoxy resin with filler, epoxy acrylate with filler, or polymer with proper filler. FIG. 4p shows MUF material 214 disposed over semiconductor die 124, semiconductor die 188, TSV substrate 162, TSV substrate 186, and gap 200. In FIG. 4q, MUF material 214, semiconductor die 124, semiconductor die 188, TSV substrate 162 and TSV substrate 186 are removed from chase mold 204.

Figure 4R:
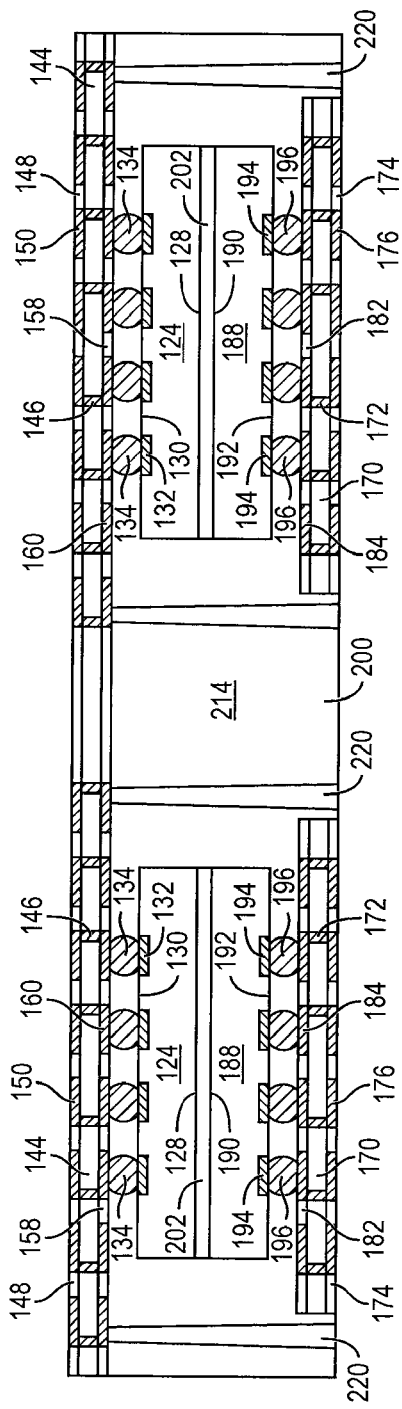

In FIG. 4r, a plurality of vias 220 is formed through MUF material 214, extending to conductive layer 160 using laser drilling, mechanical drilling, or DRIE. The sidewalls of vias 220 can have a tapered, straight, or stepped profile.

Figure 4S:
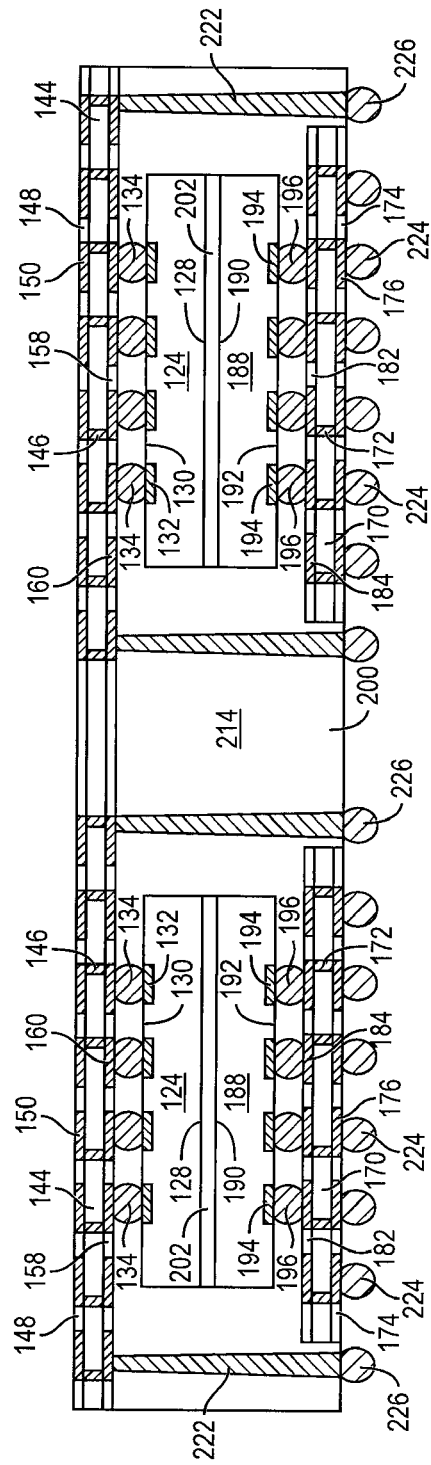

In FIG. 4s, the vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 222. Conductive vias 222 electrically connect with conductive layer 160, conductive vias 146 and conductive layer 150.

An electrically conductive bump material is deposited over conductive layer 176 of TSV substrate 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form balls or bumps 224. In some applications, bumps 224 are reflowed a second time to improve electrical contact to conductive layer 176. An under bump metallization (UBM) layer can be formed under bumps 224. Bumps 224 can also be compression bonded to conductive layer 176. Bumps 224 represent one type of interconnect structure that can be formed over conductive layer 176. The interconnect structure can also use stud bump, micro bump, or other electrical interconnect. In a similar process, an electrically conductive bump material is deposited over conductive vias 222, substantially coplanar with bumps 224, to form bumps 226.

In FIG. 4t, the assembly from FIG. 4s is singulated through MUF material 214 and TSV substrate 162, outside a footprint of semiconductor die 124 and 188, through gap 200, with saw blade or laser cutting tool 228 into individual integrated dual flipchip semiconductor packages 230.

FIG. 5 shows semiconductor package 230 after singulation. Semiconductor die 124 is mounted over semiconductor die 188 with adhesive layer 202, providing a high density of semiconductor die within a small footprint. Semiconductor die 124 is mechanically and electrically connected to TSV substrate 162 with bumps 134. Conductive layers 150 and 160, and conductive vias 146, provide electrical connectivity vertically and horizontally across TSV substrate 162. Semiconductor die 188 is mechanically and electrically connected to TSV substrate 186 with bumps 196. Conductive layers 176 and 184, and conductive vias 172, provide electrical connectivity vertically and horizontally across TSV substrate 186.

The length of TSV substrate 186 is less than the length of TSV substrate 162 to allow clearance for conductive vias 222. Semiconductor die 124 and 188, and TSV substrates 162 and 186 are disposed within a chase mold and MUF material 214 is deposited over the assembly. MUF material 214 is uniformly formed over semiconductor die 124 and 188 in a single manufacturing step, eliminating the need to deposit MUF material over each die individually. Conductive vias 222 are formed through MUF material 214 to electrically connect TSV substrate 162 to a common surface 231 of semiconductor package 230. Bumps 226 are formed over an exposed surface of conductive vias 222. Bumps 224 are formed over conductive layer 176 of TSV substrate 186.

Semiconductor die 124 is electrically connected through contact pads 132, bumps 134, TSV substrate 162, and conductive vias 222 to the common surface 231 of semiconductor package 230. Semiconductor die 188 is electrically connected through bumps 196, and TSV substrate 186 to the common surface 231 of semiconductor package 230. Accordingly, TSV substrate 162 and 186, conductive vias 222, and bumps 134 and 196 form a conductive interconnect structure to provide electrical paths for I/O signals of semiconductor die 124 and 188 to a common surface 231 of semiconductor package 230.

Figure 6E:
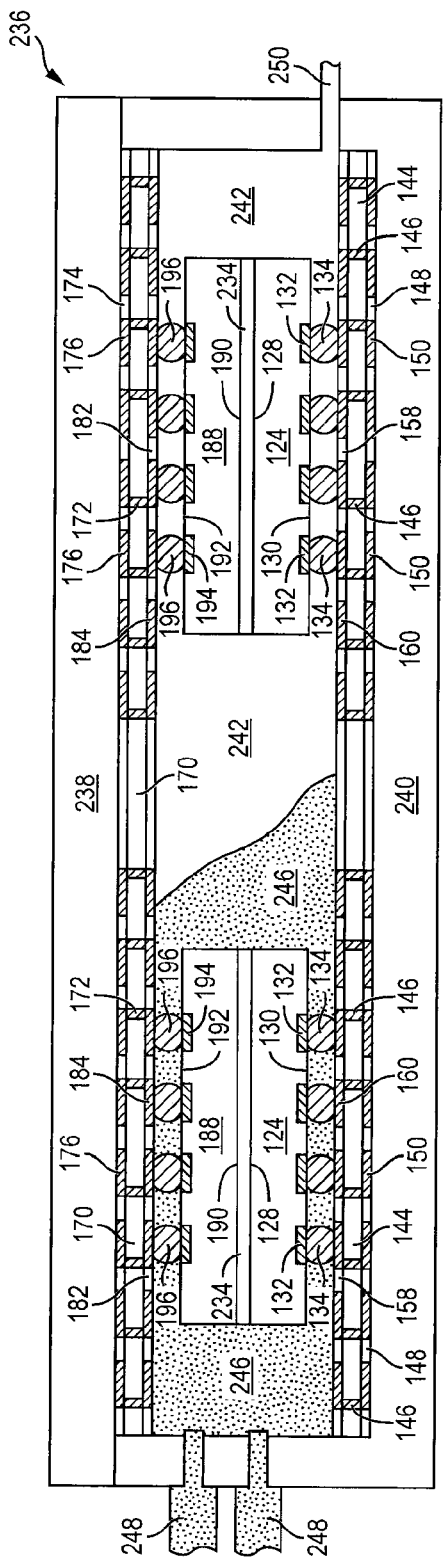

FIGS. 6a-6j illustrate, in relation to FIGS. 1 and 2a-2c, a process of forming a stacked-die semiconductor package with first and second substrates and an interconnect structure through an encapsulant to electrically connect the first and second substrates. Continuing from FIG. 4i, an adhesive layer 234 is formed over back surface 128 of semiconductor die 124, as shown in FIG. 6a. Adhesive layer 234 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, suitable wafer backside coating, epoxy resin with organic filler, silica filler, or polymer filler, acrylate based adhesive, epoxy-acrylate adhesive, a PI-based adhesive or other suitable adhesive material.

In FIG. 6b, semiconductor die 188 is mounted to adhesive layer 234, over semiconductor die 124, with back surface 190 oriented toward back surface 128. In another embodiment, adhesive layer 234 is formed over back surface 190 of semiconductor die 188. FIG. 6c shows semiconductor die 188 mounted over semiconductor die 124 to adhesive layer 234.

In FIG. 6d, the assembly from FIG. 6c, containing semiconductor die 124, semiconductor die 188, TSV substrate 162, and TSV substrate 186, is placed in chase mold 236. Chase mold 236 has an upper mold support 238 and lower mold support 240, which are brought together to enclose semiconductor die 124, semiconductor die 188, TSV substrate 162, and TSV substrate 186 with open space 242. The lower mold support 240 includes a plurality of openings or gates 244 for injecting MUF material into open space 242.

Figure 6F:
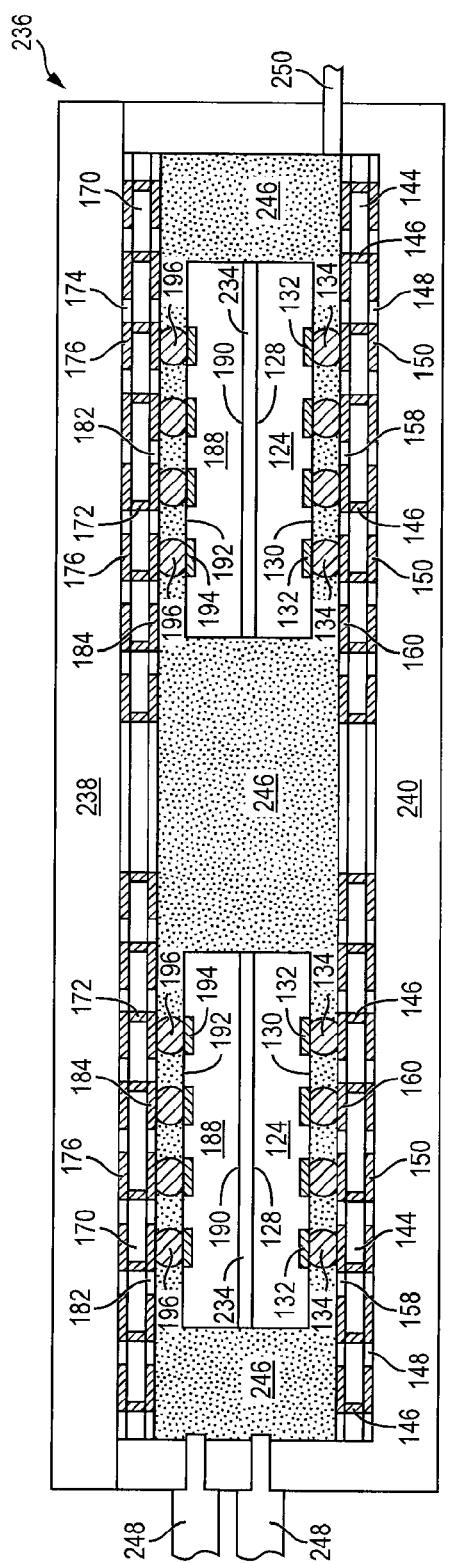

In FIG. 6e, MUF material 246 in a liquid state is injected through gates 244 with nozzles 248 while an optional vacuum assist 250 draws pressure from the side of chase mold 236 to uniformly fill open space 242 over semiconductor die 124, semiconductor die 188, TSV substrate 162 and TSV substrate 186 with MUF material 246. MUF material 246 can be an encapsulant, molding compound, polymer composite material, such as epoxy resin with filler, epoxy acrylate with filler, or polymer with proper filler. FIG. 6f shows MUF material 246 disposed around and between semiconductor die 124, semiconductor die 188, TSV substrate 162, and TSV substrate 186. In FIG. 6g, semiconductor die 124, semiconductor die 188, TSV substrate 162 and TSV substrate 186 are removed from chase mold 236.

In FIG. 6h, a plurality of vias 252 is formed through MUF material 246, TSV substrate 162, and TSV substrate 186, extending from conductive layer 176 to conductive layer 150 using laser drilling, mechanical drilling, or DRIE. The sidewalls of vias 252 can have a tapered, straight, or stepped profile.

Figure 6I:
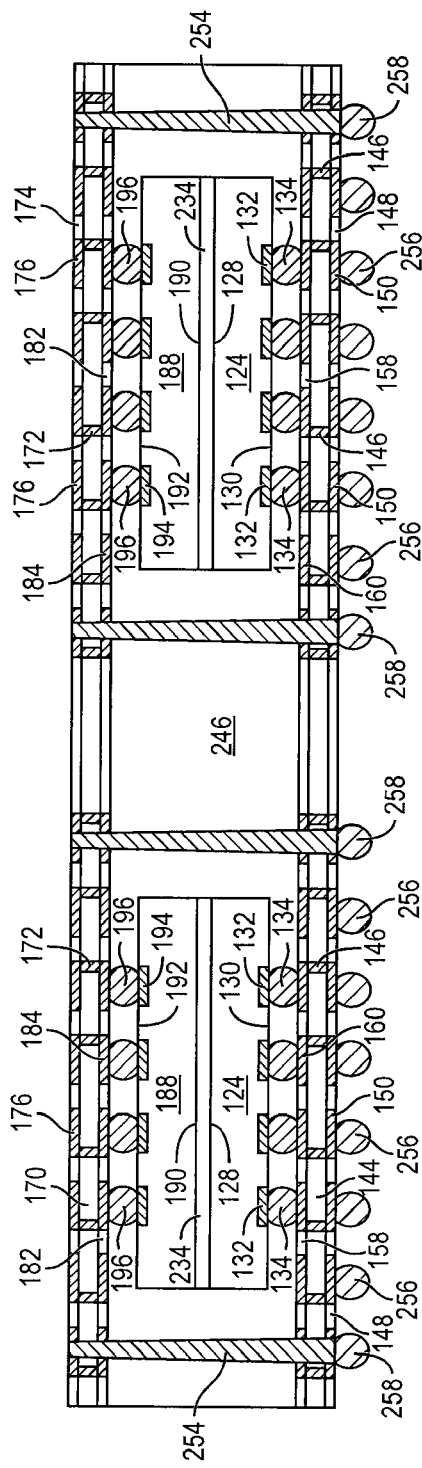

In FIG. 6i, the vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 254. Conductive vias 254 electrically connect with conductive layer 160, conductive vias 146, conductive layer 150, conductive layer 184, conductive vias 172, and conductive layer 176.

An electrically conductive bump material is deposited over conductive layer 150 of TSV substrate 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 256. In some applications, bumps 256 are reflowed a second time to improve electrical contact to conductive layer 150. An under bump metallization layer can be formed under bumps 256. Bumps 256 can also be compression bonded to conductive layer 150. Bumps 256 represent one type of interconnect structure that can be formed over conductive layer 150. The interconnect structure can also use stud bump, micro bump, or other electrical interconnect. In a similar process, an electrically conductive bump material is deposited over conductive vias 254, coplanar with bumps 256, to form bumps 258.

Figure 6J:
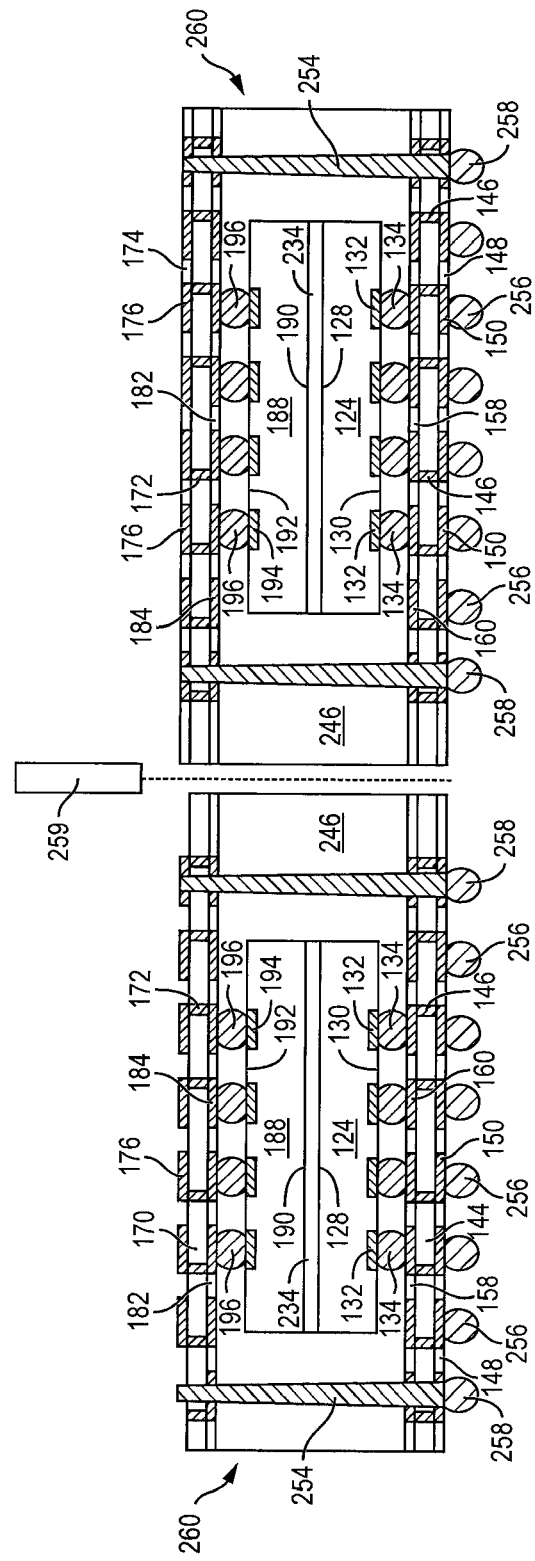

In FIG. 6j, the assembly from FIG. 6i is singulated through MUF material 246, TSV substrate 162, and TSV substrate 186, between semiconductor die 124 and 188 with saw blade or laser cutting tool 259 into individual integrated dual flipchip semiconductor packages 260.

Figure 7:
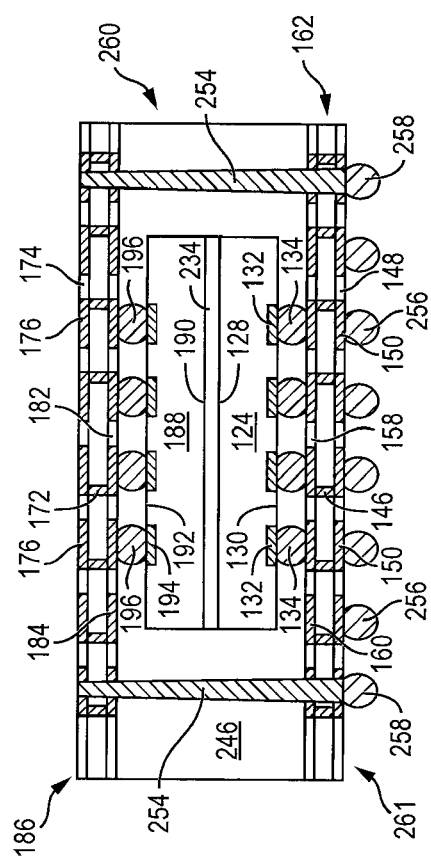
FIG. 7 illustrates the stacked-die semiconductor package with first and second substrates and an interconnect structure through an encapsulant to electrically connect the first and second substrates according to FIGS. 6a-6j.

FIG. 7 shows semiconductor package 260 after singulation. Semiconductor die 124 is mounted over semiconductor die 188 with adhesive layer 234, providing a high density of semiconductor die within a small footprint. Semiconductor die 124 is mechanically and electrically connected to TSV substrate 162 with bumps 134. Conductive layers 150 and 160, and conductive vias 146 provide electrical connectivity vertically and horizontally across TSV substrate 162. Semiconductor die 188 is mechanically and electrically connected to TSV substrate 186 with bumps 196. Conductive layers 176 and 184, and conductive vias 172 provide electrical connectivity vertically and horizontally across TSV substrate 186.

Semiconductor die 124 and 188, and TSV substrates 162 and 186 are disposed within a chase mold and MUF material 246 is deposited over the assembly. MUF material 246 is uniformly formed over semiconductor die 124 and 188 in a single manufacturing step, eliminating the need to deposit MUF material over each die individually. Conductive vias 254 are formed through MUF material 246, TSV substrate 162, and TSV substrate 186 to electrically connect TSV substrates 162 and 186 to common surface 261. Bumps 258 are formed over an exposed surface of conductive vias 254. Bumps 224 are formed over conductive layer 176 of TSV substrate 186.

Semiconductor die 124 is electrically connected through contact pads 132, bumps 134, TSV substrate 162, and conductive vias 254 to the common surface 261 of semiconductor package 260. Semiconductor die 188 is electrically connected through bumps 196, TSV substrate 186, and conductive vias 154 to the common surface 261 of semiconductor package 260. Accordingly, TSV substrate 162 and 186, bumps 134 and 196, and conductive vias 254 form a conductive interconnect structure to provide electrical paths for I/O signals of semiconductor die 124 and 188 to the entire common surface 261 of semiconductor package 260.

Figure 8A:
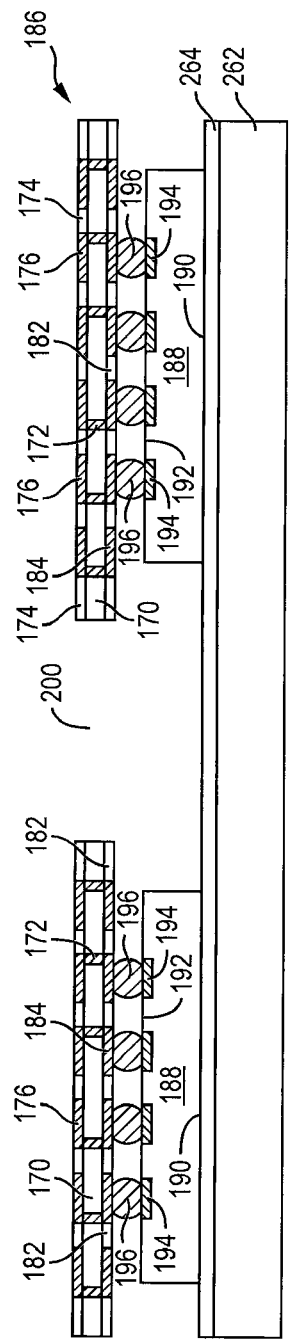

FIGS. 8a-8h illustrate, in relation to FIGS. 1 and 2a-2c, a process of forming a stacked-die semiconductor package with wire bonds electrically connecting an upper semiconductor die to a first substrate. In FIG. 8a, continuing from FIG. 4k, a temporary substrate or carrier 262 contains sacrificial base material such as silicon, polymer, beryllium oxide, glass, or other suitable low-cost, rigid material for structural support. An interface layer or double-sided tape 264 is formed over carrier 262 as a temporary adhesive bonding film. Semiconductor die 188 is mounted to interface layer 264 over carrier 262 with back surface 190 oriented toward carrier 262. Carrier 178 and interface layer 180 are removed by chemical etching, mechanical peeling, CMP, mechanical grinding, thermal bake, UV light, laser scanning, or wet stripping to expose conductive layer 176 and insulating layer 174.

Figure 8B:
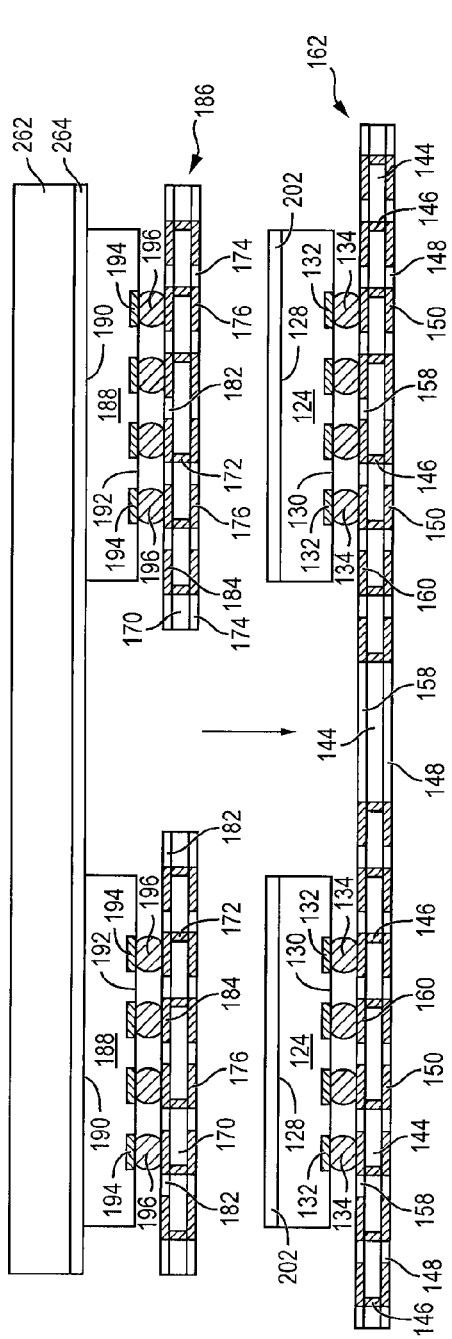

In FIG. 8b, TSV substrate 186 is mounted to adhesive layer 202, over semiconductor die 124, with conductive surface 176 oriented toward adhesive layer 202. In one embodiment, adhesive layer 202 is formed over conductive layer 176.

Figure 8C:
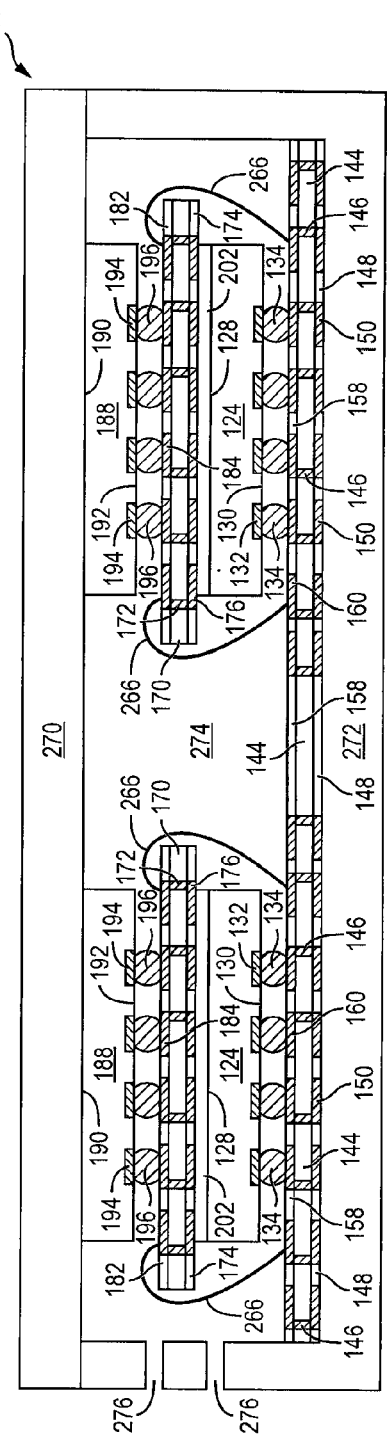

FIG. 8c shows TSV substrate 186 mounted to semiconductor die 124 with adhesive layer 202. Carrier 262 and interface layer 264 are removed by chemical etching, mechanical peeling, CMP, mechanical grinding, thermal bake, UV light, laser scanning, or wet stripping. Bond wires 266 are formed between conductive layer 184 on TSV substrate 186 and conductive layer 160 on TSV substrate 162. Bond wires 266 are electrically connected between conductive layer 184, conductive vias 172, conductive layer 176, conductive layer 160, conductive vias 146 and conductive layer 150. Semiconductor die 124, semiconductor die 188, TSV substrate 162, and TSV substrate 186, are placed in chase mold 268. Chase mold 268 has an upper mold support 270 and lower mold support 272, which are brought together to enclose semiconductor die 124, semiconductor die 188, TSV substrate 162, and TSV substrate 186 with open space 274. The lower mold support 272 includes a plurality of openings or gates 276 for injecting MUF material into open space 274.

Figure 8F:
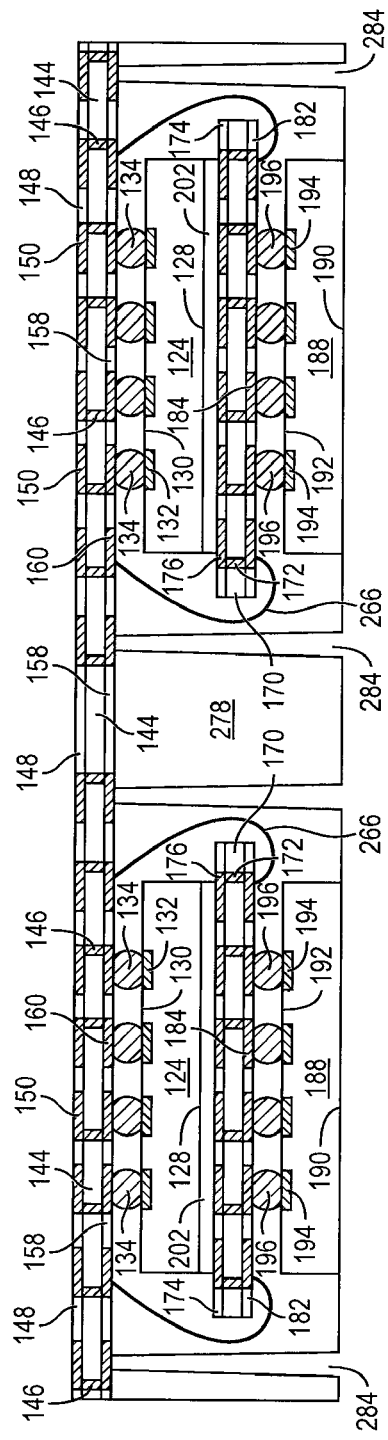

In FIG. 8d, MUF material 278 in a liquid state is injected through gates 276 with nozzles 280 while an optional vacuum assist 282 draws pressure from the side of chase mold 268 to uniformly fill open space 274 around semiconductor die 124, semiconductor die 188, TSV substrate 162, TSV substrate 186, and bond wires 266 with MUF material 278. MUF material 278 can be an encapsulant, molding compound, polymer composite material, such as epoxy resin with filler, epoxy acrylate with filler, or polymer with proper filler. FIG. 8e shows MUF material 278 disposed around and between semiconductor die 124, semiconductor die 188, TSV substrate 162, TSV substrate 186, and bond wires 266. In FIG. 8f, semiconductor die 124, semiconductor die 188, TSV substrate 162 and TSV substrate 186 are removed from chase mold 268. A plurality of vias 284 is formed through MUF material 278 extending to conductive layer 160 using laser drilling, mechanical drilling, or DRIE. The sidewalls of vias 284 can have a tapered, straight, or stepped profile.

Figure 8G:
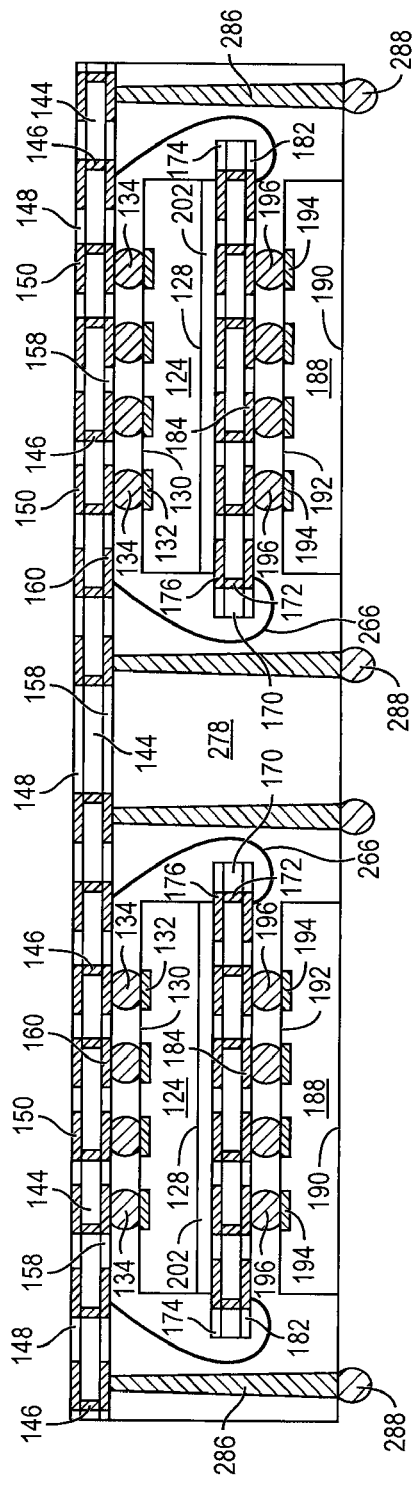

In FIG. 8g, the vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 286. Conductive vias 286 electrically connect with conductive layer 160, conductive vias 146, conductive layer 150, bond wires 266, conductive layer 176, conductive vias 172 and conductive layer 184.

An electrically conductive bump material is deposited over vias 286 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive vias 286 using a suitable attachment or bonding process. In one embodiment, the bump material is reflowed by heating the material above its melting point to form balls or bumps 288. In some applications, bumps 288 are reflowed a second time to improve electrical contact to conductive vias 286. A UBM layer can be formed under bumps 288. Bumps 288 can also be compression bonded to conductive vias 286. Bumps 288 represent one type of interconnect structure that can be formed over conductive vias 286. The interconnect structure can also use stud bump, micro bump, or other electrical interconnect.

Figure 8H:
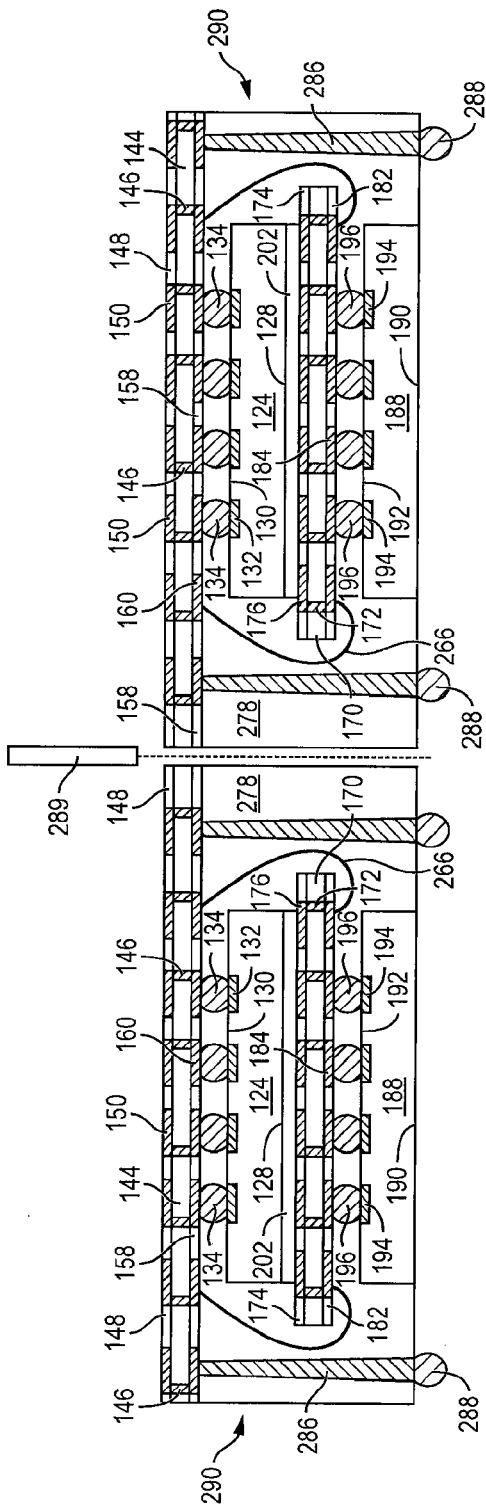

In FIG. 8h, the assembly from FIG. 8g is singulated through MUF material 278 and TSV substrate 162, outside a footprint of semiconductor die 124 and 188, with saw blade or laser cutting tool 289 into individual integrated dual flipchip semiconductor packages 290.

Figure 9:
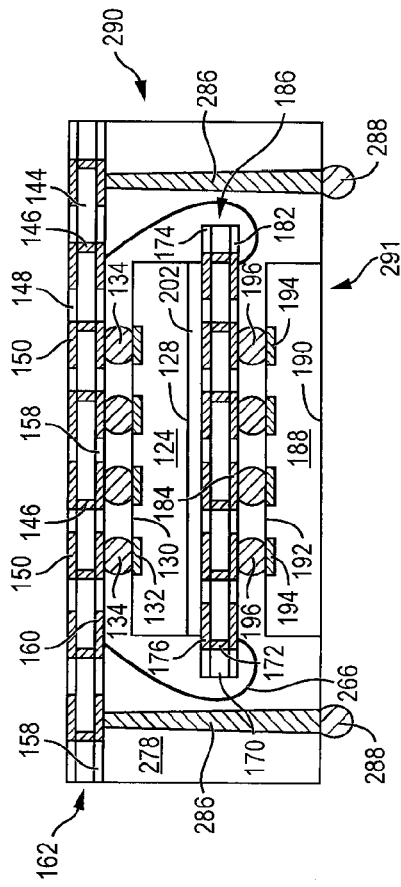
FIG. 9 illustrates the stacked-die semiconductor package with wirebonds electrically connecting an upper semiconductor die to a first substrate according to FIGS. 8a-8h.

FIG. 9 shows semiconductor package 290 after singulation. Semiconductor die 124 is mounted over semiconductor die 188 with adhesive layer 202, providing a high density of semiconductor die within a small footprint. Semiconductor die 124 is mechanically and electrically connected to TSV substrate 162 with bumps 134. Conductive layers 150 and 160, and conductive vias 146, provide electrical connectivity vertically and horizontally across TSV substrate 162. Semiconductor die 188 is mechanically and electrically connected to TSV substrate 186 with bumps 196. Conductive layers 176 and 184, and conductive vias 172, provide electrical connectivity vertically and horizontally across TSV substrate 186. Bond wires 266 electrically connect TSV substrate 186 to TSV substrate 162.

The length of TSV substrate 186 is less than the length of TSV substrate 162 to allow clearance for conductive vias 286 and bond wires 266. Semiconductor die 124 and 188, and TSV substrates 162 and 186 are disposed within a chase mold and MUF material 278 is deposited over the assembly. MUF material 278 is uniformly formed over semiconductor die 124 and 188 in a single manufacturing step, eliminating the need to deposit MUF material over each die individually. Conductive vias 286 are formed through MUF material 278 to electrically connect TSV substrate 162 to a common surface 291 of semiconductor package 290. Bumps 288 are formed over an exposed surface of conductive vias 286.

Semiconductor die 124 is electrically connected through contact pads 132, bumps 134, TSV substrate 162, and conductive vias 286 to the common surface 291 of semiconductor package 290. Semiconductor die 188 is electrically connected through bumps 196, TSV substrate 186 and bond wires 266 to TSV substrate 162. Accordingly, TSV substrate 162 and 186, bumps 134 and 196, bond wires 266, and conductive vias 286 form a conductive interconnect structure to provide electrical paths for I/O signals of semiconductor die 124 and 188 to the common surface 291 of semiconductor package 290.

Figure 10A:
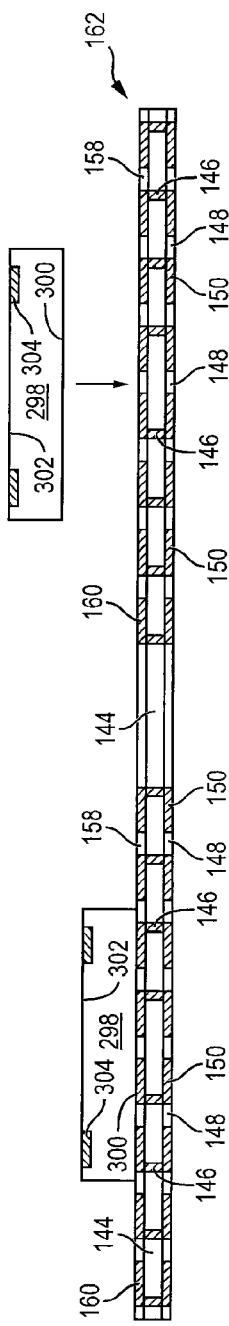
FIGS. 10a-10k illustrate a process of forming a stacked-die semiconductor package with a first semiconductor die electrically connected to a first substrate with wirebonds.

FIGS. 10a-10k illustrate in relation to FIGS. 1 and 2a-2c, a process of forming a stacked-die semiconductor package with a first semiconductor die electrically connected to a first substrate with wirebonds. In FIG. 10a, continuing from FIG. 4d, a plurality of semiconductor die 298 originating from a semiconductor wafer, similar to FIGS. 3a-3c, has a back surface 300 and an active surface 302 containing analog or digital circuits implemented as active devices, passive devices, conductive layers, and dielectric layers formed within the die and electrically interconnected according to the electrical design and function of the die. For example the circuit may include one or more transistors, diodes, and other circuit elements formed within active surface 302 to implement analog circuits or digital circuits, such as DSP, ASIC, memory or other signal processing circuit. Semiconductor die 298 may also contain IPDs, such as inductors, capacitors, and resistors, for RF signal processing. A plurality of contact pads 304 is formed on active surface 302 and electrically connected to the circuits on the active surface. Semiconductor die 298 is mounted to TSV substrate 162, with back surface 300 oriented toward conductive layer 160, using a suitable die attach adhesive.

Figure 10B:
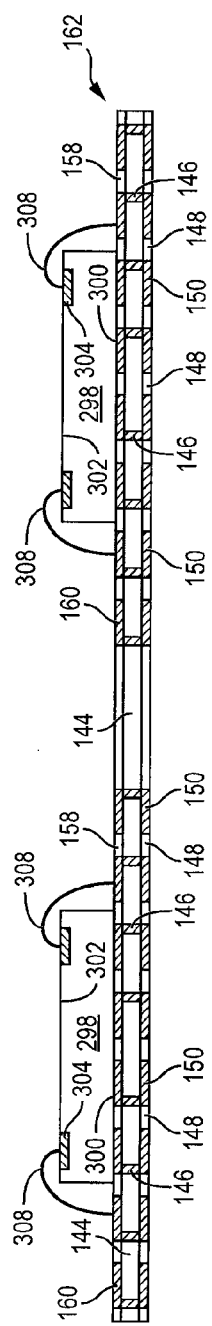

In FIG. 10b, bond wires 308 are formed between contact pads 304 and conductive layer 160, providing an electrical connection between contact pads 304, bond wires 308, conductive layers 160 and 150, and conductive vias 146.

Figure 10C:
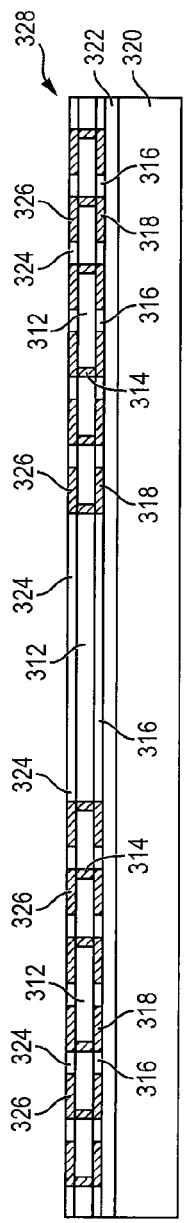

In FIG. 10c, a TSV substrate is formed, similar to FIGS. 4a-4d, with substrate layer 312 and conductive vias 314. Insulating layer 316 and conductive layer 318 are formed on one side of substrate 312 and mounted to temporary carrier 320 with interface layer 322. Insulating layer 324 and conductive layer 326 are formed on substrate 312, on the side opposite insulating layer 316, to form TSV substrate 328.

Figure 10D:
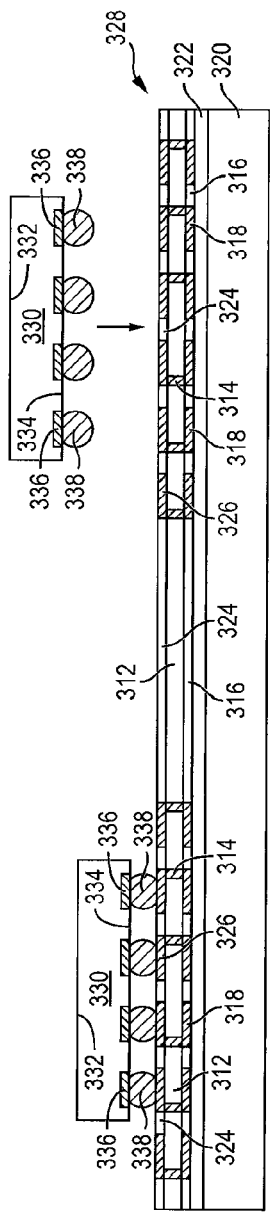

In FIG. 10d, a plurality of semiconductor die 330 originating from a semiconductor wafer, similar to FIGS. 3a-3c, has a back surface 332 and an active surface 334 containing analog or digital circuits implemented as active devices, passive devices, conductive layers, and dielectric layers formed within the die and electrically interconnected according to the electrical design and function of the die. For example the circuit may include one or more transistors, diodes, and other circuit elements formed within active surface 334 to implement analog circuits or digital circuits, such as DSP, ASIC, memory or other signal processing circuit. Semiconductor die 330 may also contain IPDs, such as inductors, capacitors, and resistors, for RF signal processing. A plurality of contact pads 336 is formed on active surface 334 and electrically connected to the circuits on the active surface. A plurality of bumps 338 is formed over contact pads 336.

Figure 10E:
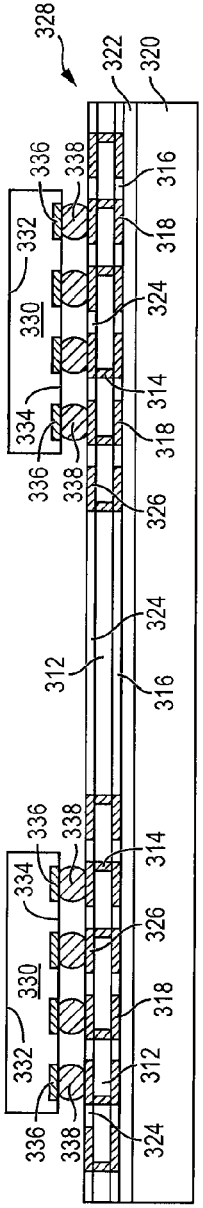

Each semiconductor die 330 is mounted to conductive layer 326 of TSV substrate 328 using a pick and place operation with active surface 334 oriented toward the substrate. Bumps 338 are reflowed to electrically connect conductive layer 326 of semiconductor die 330 to conductive layer 326 of TSV substrate 328. FIG. 10e shows semiconductor die 330 mounted to TSV substrate 328.

Figure 10F:
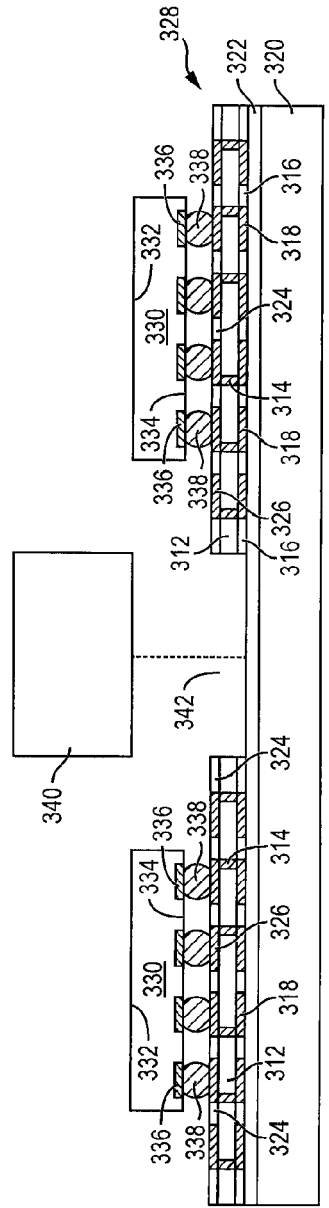

In FIG. 10f, a portion of TSV substrate 328 is removed using a saw blade or laser cutting tool 340 to create gap 342 between semiconductor die 330 and extending down to interface layer 322. Carrier 320 provides structural support for TSV substrate 328 and semiconductor die 330 during formation of gap 342.

Figure 10G:
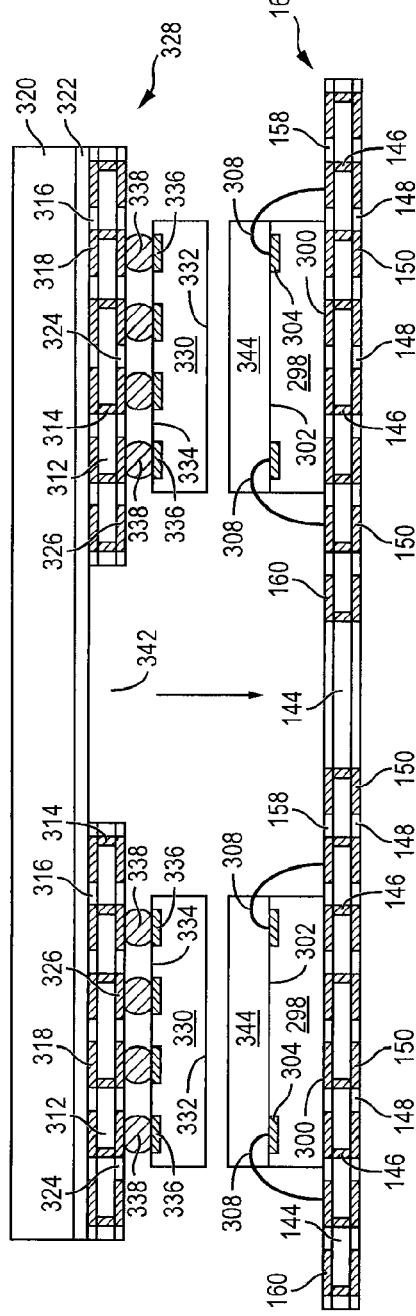

In FIG. 10g, an adhesive layer 344 is formed over active surface 302 of semiconductor die 298. Adhesive layer 344 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, suitable wafer backside coating, epoxy resin with organic filler, silica filler, or polymer filler, acrylate based adhesive, epoxy-acrylate adhesive, a PI-based adhesive or other suitable adhesive material. Leading with back surface 332, semiconductor die 330 is mounted to semiconductor die 298 with adhesive layer 344. Adhesive layer 344 has a sufficient thickness to enable clearance and headroom of bond wires 308 to electrically connect contact pads 304 with conductive layer 160.

Figure 10H:
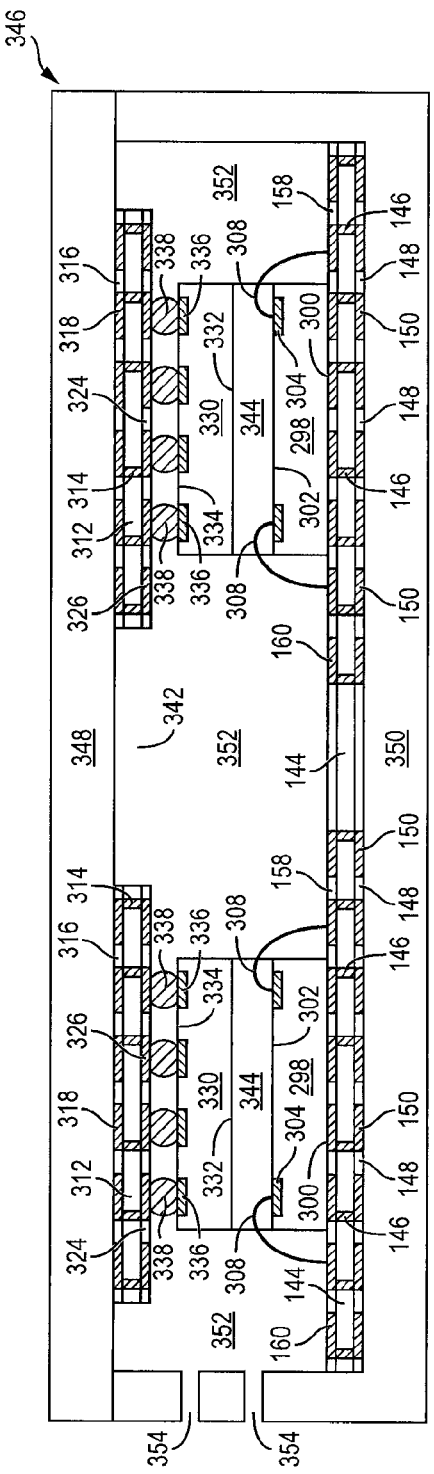

In FIG. 10h, carrier 320 and interface layer 322 are removed by chemical etching, mechanical peeling, CMP, mechanical grinding, thermal bake, UV light, laser scanning, or wet stripping to expose insulating layer 316 and conductive layer 318. The assembly from FIG. 10g, containing semiconductor die 298, semiconductor die 330, TSV substrate 328, TSV substrate 162, and bond wires 308, is placed in chase mold 346. Chase mold 346 has an upper support mold 348 and lower support mold 350, which are brought together to enclose semiconductor die 298, semiconductor die 330, TSV substrate 328, TSV substrate 162, and bond wires 308, with open space 352. The lower support mold 350 includes a plurality of openings or gates 354 for injecting MUF material into open space 352.

Figure 10I:
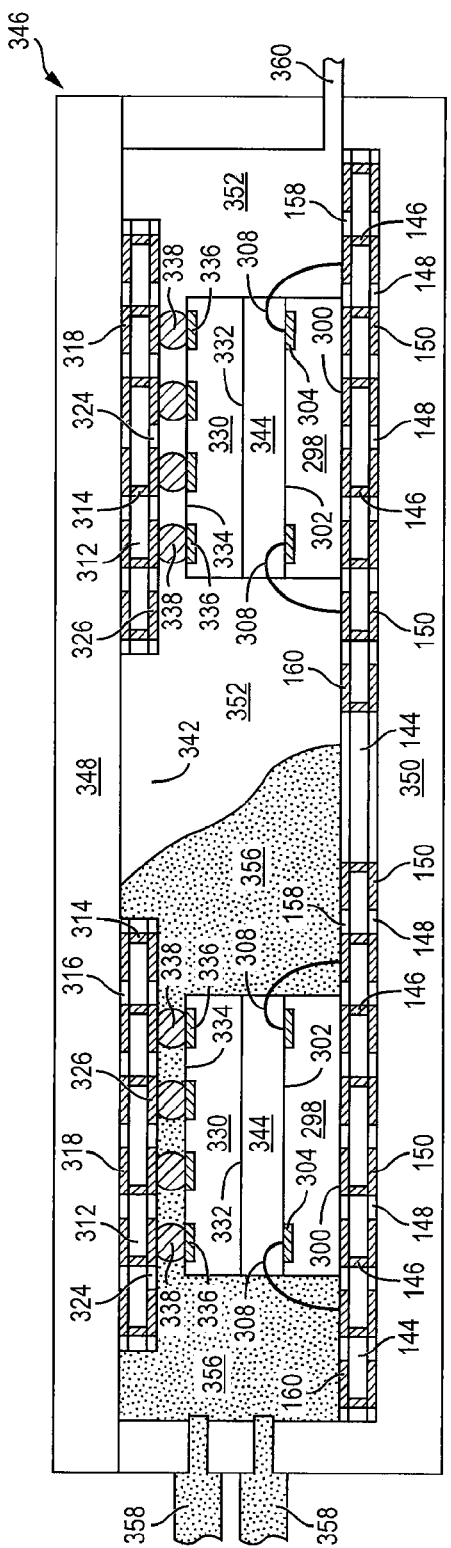

In FIG. 10i, MUF material 356 in a liquid state is injected through gates 354 with nozzles 358 while an optional vacuum assist 360 draws pressure from the side of chase mold 346 to uniformly fill open space 352 over semiconductor die 298, semiconductor die 330, TSV substrate 328, TSV substrate 162, bond wires 308 and gap 342. MUF material 356 can be an encapsulant, molding compound, polymer composite material, such as epoxy resin with filler, epoxy acrylate with filler, or polymer with proper filler.

Figure 10J:
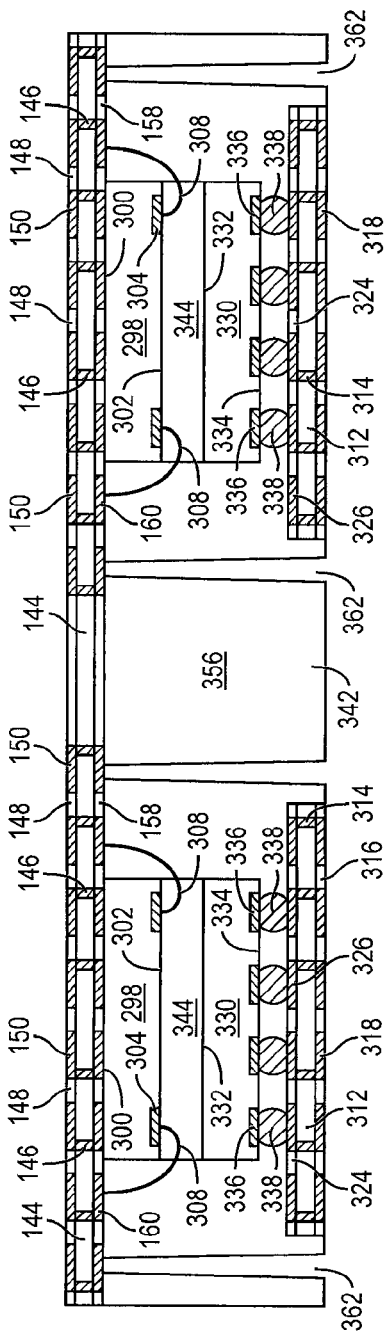

In FIG. 10j, semiconductor die 298, semiconductor die 330, TSV substrate 328, TSV substrate 162, and bond wires 308 are removed from chase mold 346. A plurality of vias 362 is formed through MUF material 356, outside a footprint of semiconductor die 298 and 230, extending to conductive layer 160 using laser drilling, mechanical drilling, or DRIE. The sidewalls of vias 362 can have a tapered, straight, or stepped profile.

Figure 10K:
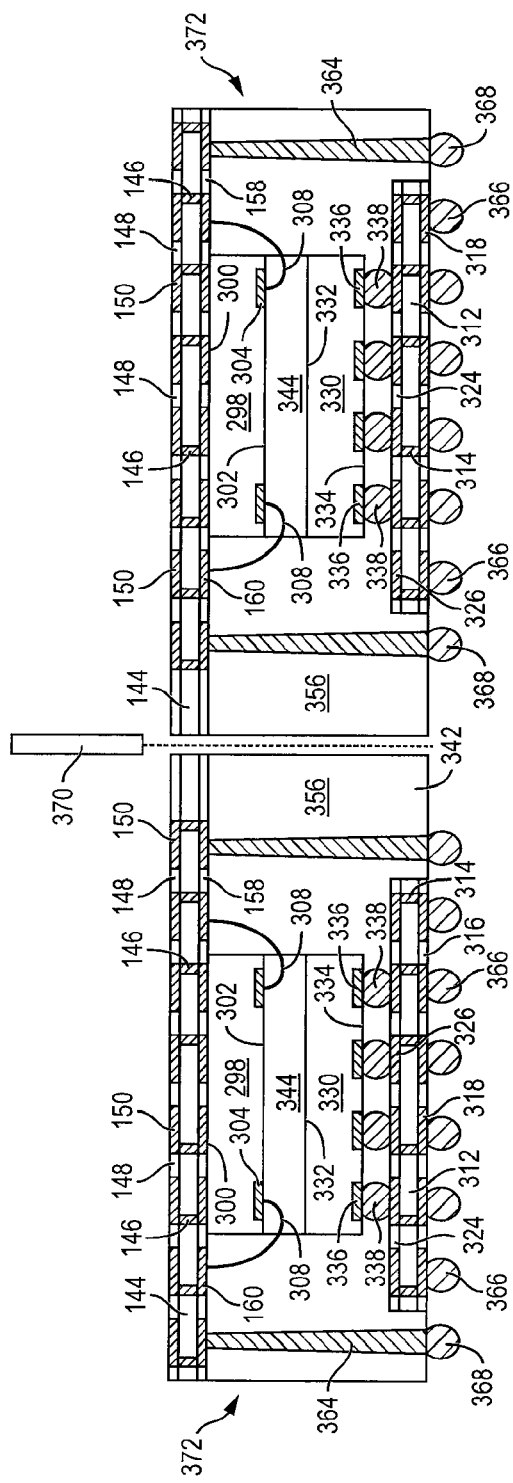

In FIG. 10k, the vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 364. Conductive vias 364 electrically connect with conductive layer 160, conductive vias 146, conductive layer 150, bond wires 308 and contact pads 304.

An electrically conductive bump material is deposited over conductive layer 318 of TSV substrate 328 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 318 using a suitable attachment or bonding process. In one embodiment, the bump material is reflowed by heating the material above its melting point to form balls or bumps 366. In some applications, bumps 366 are reflowed a second time to improve electrical contact to conductive layer 318. A UBM layer can be formed under bumps 366. Bumps 366 can also be compression bonded to conductive layer 318. Bumps 366 represent one type of interconnect structure that can be formed over conductive layer 318. The interconnect structure can also use stud bump, micro bump, or other electrical interconnect. In a similar process, an electrically conductive bump material is deposited over conductive vias 364, substantially coplanar with bumps 366, to form bumps 368. The assembly is singulated through gap 342, MUF material 356 and TSV substrate 162 with saw blade or laser cutting tool 370 into individual semiconductor packages 372.

Figure 11:
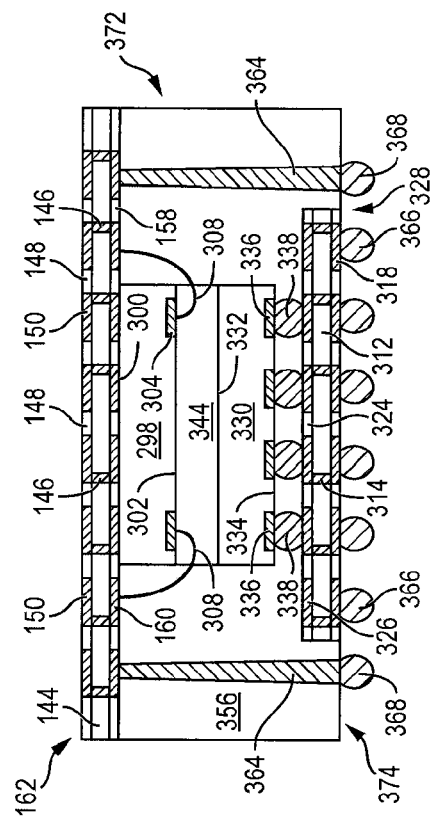
FIG. 11 illustrates the stacked-die semiconductor package with a first semiconductor die electrically connected to a first substrate with wirebonds according to FIGS. 10a-10k.

FIG. 11 shows semiconductor package 372 after singulation. Semiconductor die 298 is mounted over semiconductor die 330 with adhesive layer 344, providing a high density of semiconductor die within a small footprint. Adhesive layer 344 has a sufficient thickness to enable clearance and headroom of bond wires 308 without breaching an upper surface of adhesive layer 344 contacting semiconductor die 188 as bond wires 308 curve to electrically connect contact pads 304 with conductive layer 160. Semiconductor die 330 is mechanically and electrically connected to TSV substrate 328 with bumps 338. Conductive layers 318 and 326, and conductive vias 314 provide electrical connectivity vertically and horizontally across TSV substrate 328. Semiconductor die 298 is mechanically connected to TSV substrate 162 and electrically connected to TSV substrate 162 with bond wires 308. Conductive layers 150 and 160, and conductive vias 146, provide electrical connectivity vertically and horizontally across TSV substrate 162.

The length of TSV substrate 328 is less than the length of TSV substrate 162 to allow clearance for conductive vias 364 and bond wires 308. Semiconductor die 330 and 298, and TSV substrates 162 and 328 are disposed within a chase mold and MUF material 356 is deposited over the assembly. MUF material 356 is uniformly formed over semiconductor die 330 and 298 in a single manufacturing step, eliminating the need to deposit MUF material over each die individually. Conductive vias 364 are formed through MUF material 356 to electrically connect TSV substrate 162 to a common surface 374 of semiconductor package 372. Bumps 368 are formed over an exposed surface of conductive vias 364. Bumps 366 are formed over conductive layer 318 of TSV substrate 328.

Semiconductor die 298 is electrically connected through contact pads 304, bond wires 308, TSV substrate 162, and conductive vias 364 to the common surface 374 of semiconductor package 372. Semiconductor die 330 is electrically connected through bumps 338, and TSV substrate 328 to the common surface 374 of semiconductor package 372. Accordingly, TSV substrate 162 and 328, bond wires 308, bumps 338, and conductive vias 364 form a conductive interconnect structure to provide electrical paths for I/O signals of semiconductor die 330 and 298 to the common surface 374 of semiconductor package 372.

Figure 12A:
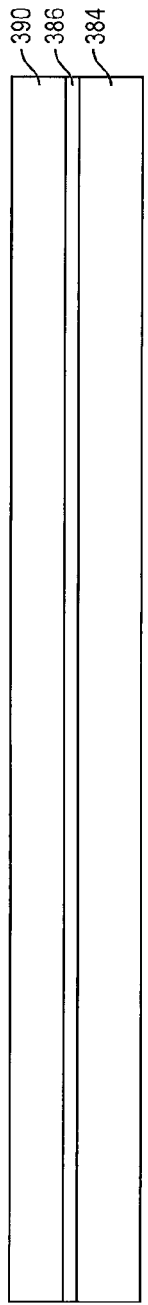
FIGS. 12a-12n illustrate a process of forming a stacked-die semiconductor package with a first substrate with multiple interconnected conductive layers.
Figure 12B:
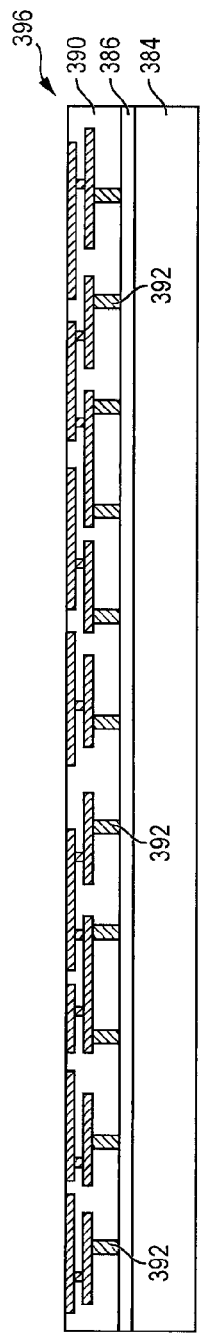
Figure 12C:
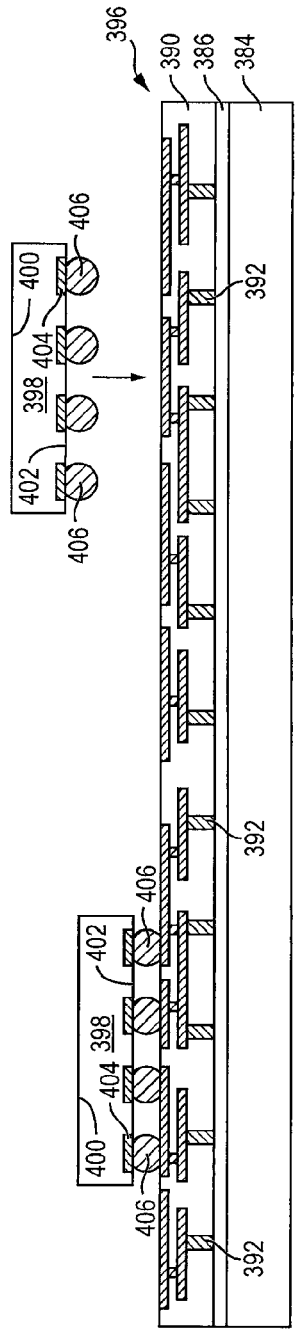
Figure 12D:
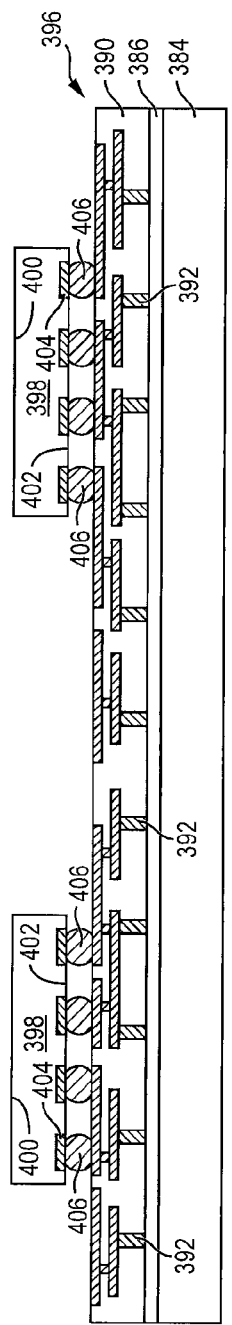
Figure 12E:
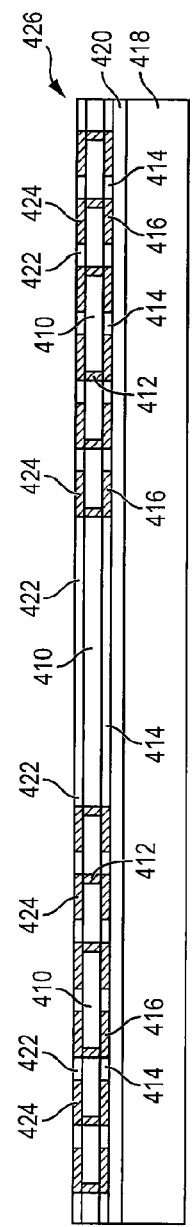
Figure 12F:
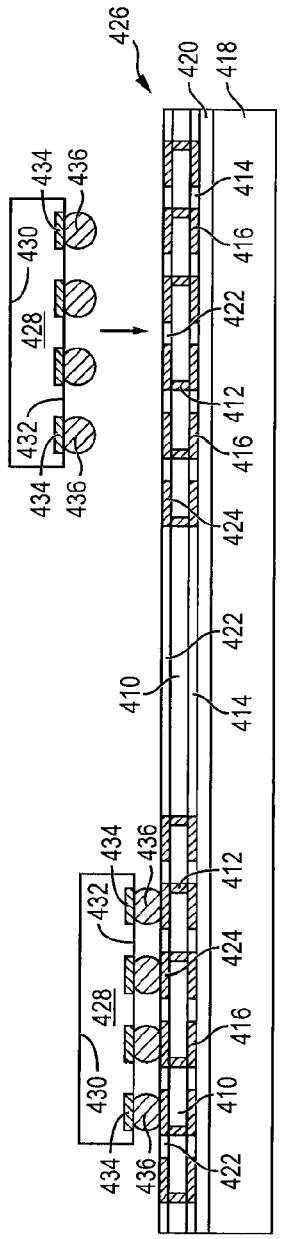
Figure 12G:
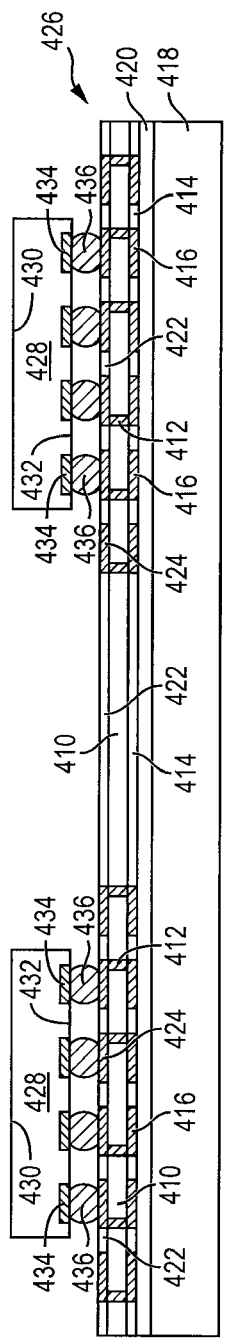
Figure 12H:
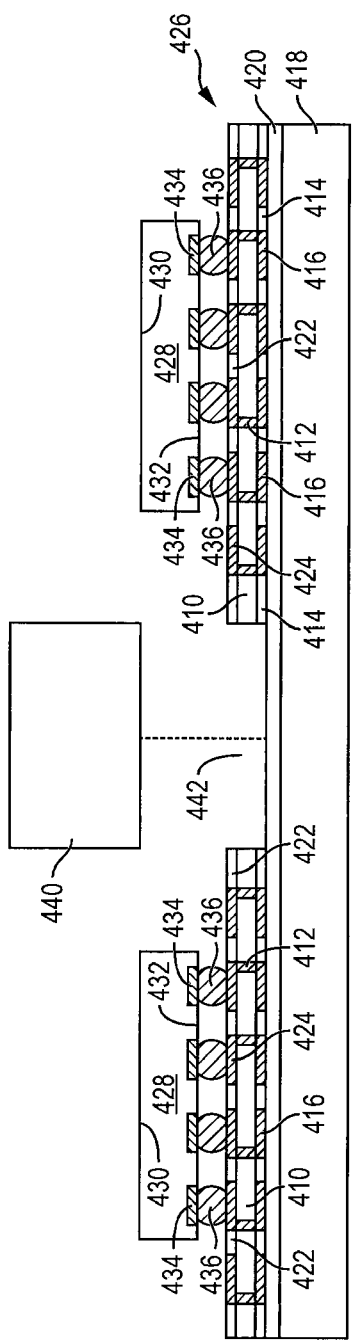
Figure 12I:
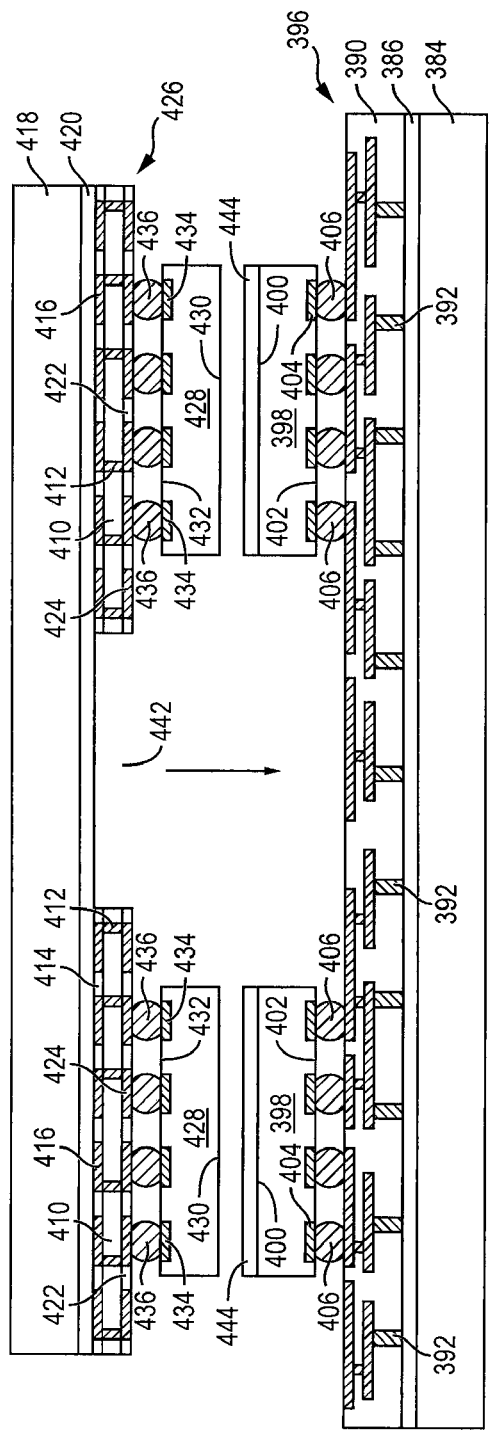
Figure 12L:
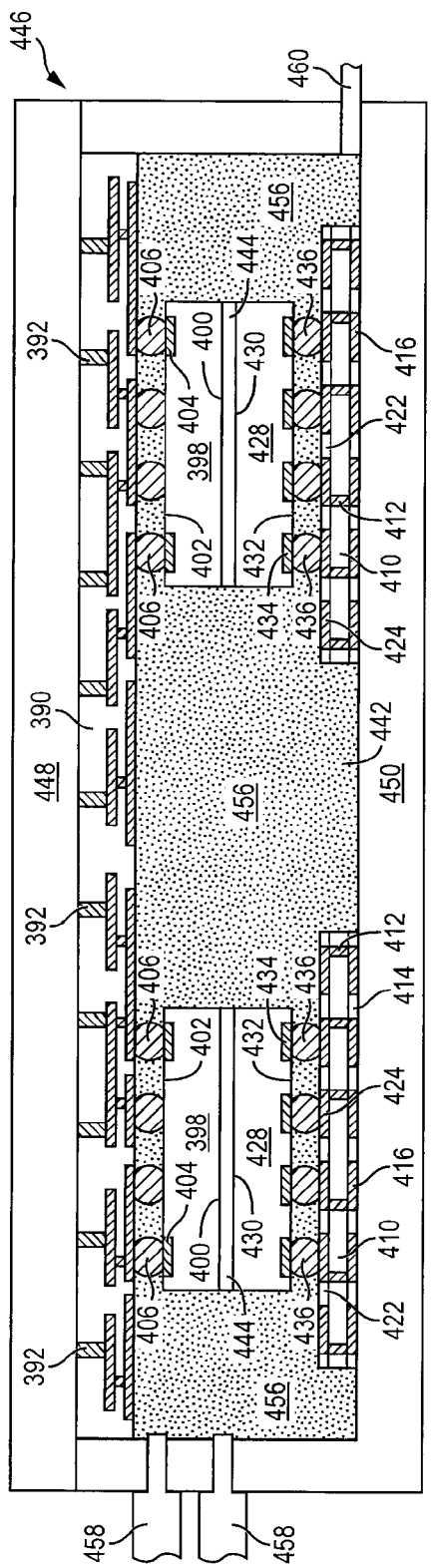
Figure 12M:
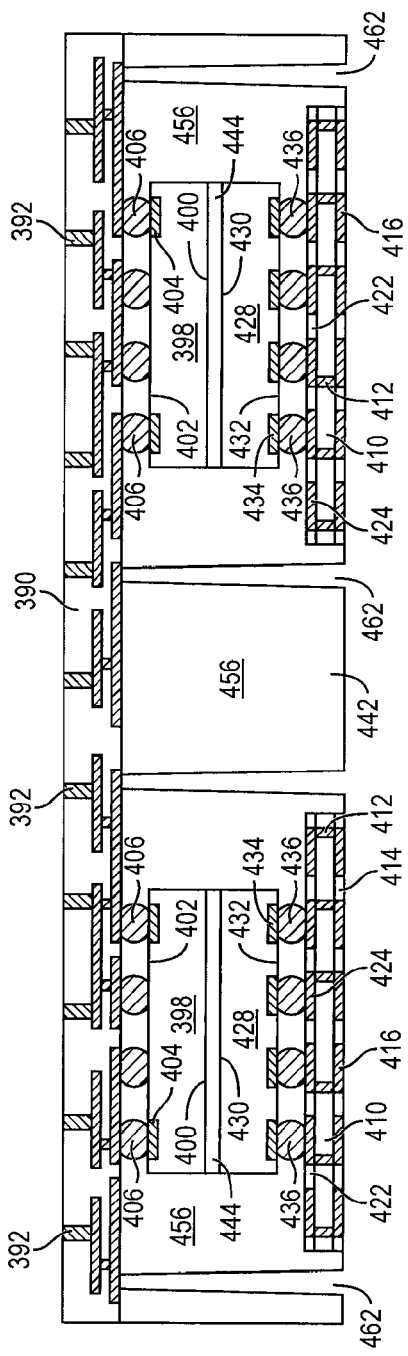
Figure 12N:
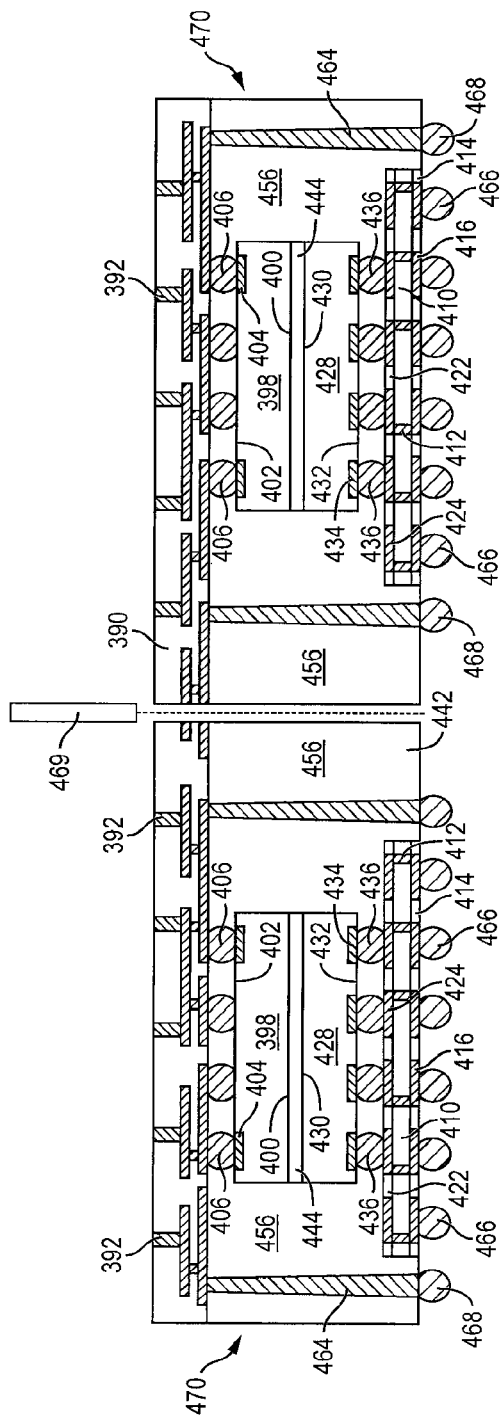

FIGS. 12*a*-12*n* illustrate, in relation to FIGS. 1 and 2*a*-2*c*, a process of forming a stacked-die semiconductor package with a first substrate having multiple interconnected conductive layers. In FIG. 12*a*, a temporary substrate or carrier 384 contains sacrificial base material such as silicon, polymer, beryllium oxide, glass, or other suitable low-cost, rigid material for structural support. An interface layer or double-sided tape 386 is formed over carrier 384 as a temporary adhesive bonding film, etch-stop layer, or release layer. A semiconductor wafer or substrate 390 contains base material, such as silicon, germanium, gallium arsenide, indium phosphide, or silicon carbide, for structural support. As a semiconductor wafer, substrate 390 can contain embedded integrated semiconductor die or discrete devices. Substrate 390 can also be a multi-layer flexible laminate, ceramic or leadframe. Substrate 390 is mounted to interface layer 386 over carrier 384.

In FIG. 12*b*, a plurality of vias is formed through substrate 390 using laser drilling, mechanical drilling, DRIE. The vias are filled with Al, Cu, Sn, Ni, Au, Ag, Ti, tungsten W, polysilicon, or other suitable electrically conductive material using electrolytic plating, electroless plating process, or other suitable metal deposition process to form z-direction vertical interconnect conductive vias 392. Substrate 390 also includes redistribution layers for routing electrical signals horizontally. The resulting wafer-form TSV interposer or substrate 396 provides electrical interconnect vertically and laterally across the substrate.

In FIG. 12*c*, a plurality of semiconductor die 398 originating from a semiconductor wafer, similar to FIGS. 3*a*-3*c*, has a back surface 400 and an active surface 402 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 402 to implement analog circuits or digital circuits, such as DSP, ASIC, memory or other signal processing circuit. Semiconductor die 398 may also contain IPDs, such as inductors, capacitors, and resistors, for RF signal processing. A plurality of contact pads 404 is formed on active surface 402 and electrically connected to the circuits on active surface 402. A plurality of bumps 406 is formed over contact pads 404.

Each semiconductor die 398 is mounted to TSV substrate 396 using a pick and place operation with active surface 402 oriented toward the substrate. Bumps 406 are reflowed to electrically connect semiconductor die 398 to one or more redistribution layers of TSV substrate 396 and conductive vias 392. FIG. 12*d* shows semiconductor die 398 mounted to TSV substrate 396.

In FIG. 12*e*, a TSV substrate is formed, similar to FIGS. 4*a*-4*d*, with substrate layer 410 and conductive vias 412. Insulating layer 414 and conductive layer 416 are formed on one side of substrate 410 and mounted to temporary carrier 418 with interface layer 420. Insulating layer 422 and conductive layer 424 are formed on substrate 410, on the side opposite insulating layer 414. The resulting wafer-form TSV interposer or substrate 426 provides electrical interconnect vertically across the substrate.

In FIG. 12*f*, a plurality of semiconductor die 428 originating from a semiconductor wafer, similar to FIGS. 3*a*-3*c*, has a back surface 430 and an active surface 432 containing analog or digital circuits implemented as active devices, passive devices, conductive layers, and dielectric layers formed within the die and electrically interconnected according to the electrical design and function of the die. For example the circuit may include one or more transistors, diodes, and other circuit elements formed within active surface 432 to implement analog circuits or digital circuits, such as DSP, ASIC, memory or other signal processing circuit. Semiconductor die 428 may also contain IPDs, such as inductors, capacitors, and resistors, for RF signal processing. A plurality of contact pads 434 is formed on active surface 432 and electrically connected to the circuits on the active surface. A plurality of bumps 436 is formed over contact pads 434.

Each semiconductor die 428 is mounted to conductive layer 424 of TSV substrate 426 using a pick and place operation with active surface 432 oriented toward the substrate. Bumps 436 are reflowed to electrically connect semiconductor die 428 to conductive layer 424 of TSV substrate 426. FIG. 12g shows semiconductor die 428 mounted to TSV substrate 426.

In FIG. 12h, a portion of TSV substrate 426 is removed using a saw blade or laser cutting tool 440 to create gap 442 between semiconductor die 428 and extending down to interface layer 420. Carrier 418 provides structural support for TSV substrate 426 and semiconductor die 428 during formation of gap 442.

In FIG. 12i, an adhesive layer 444 is formed over back surface 400 of semiconductor die 398. Adhesive layer 444 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, suitable wafer backside coating, epoxy resin with organic filler, silica filler, or polymer filler, acrylate based adhesive, epoxy-acrylate adhesive, a PI-based adhesive or other suitable adhesive material.

Semiconductor die 428 is mounted to semiconductor die 398, with adhesive layer 444, with back surface 430 oriented toward back surface 400. In another embodiment, adhesive layer 444 is formed over back surface 430 of semiconductor die 428.

FIG. 12j shows semiconductor die 428 mounted to semiconductor die 398 with adhesive layer 444. Carrier 418 and interface layer 420 are removed by chemical etching, mechanical peeling, CMP, mechanical grinding, thermal bake, UV light, laser scanning, or wet stripping to expose insulating layer 414 and conductive layer 416.

The assembly, containing semiconductor die 428, semiconductor die 398, TSV substrate 396, and TSV substrate 426, is placed in chase mold 446. Chase mold 446 has an upper mold support 448 and lower mold support 450, which are brought together to enclose semiconductor die 428, semiconductor die 398, TSV substrate 396, and TSV substrate 426 with open space 452. The lower mold support 450 includes a plurality of openings or gates 454 for injecting MUF material into open space 452.

In FIG. 12k, MUF material 456 in a liquid state is injected through gates 454 with nozzles 458 while an optional vacuum assist 460 draws pressure from the side of chase mold 446 to uniformly fill open space 452 over semiconductor die 398, semiconductor die 428, TSV substrate 396, TSV substrate 426 and gap 442 with MUF material. MUF material 456 can be an encapsulant, molding compound, polymer composite material, such as epoxy resin with filler, epoxy acrylate with filler, or polymer with proper filler. FIG. 12l shows MUF material 456 disposed over semiconductor die 398, semiconductor die 428, TSV substrate 396, and TSV substrate 426.

In FIG. 12m, semiconductor die 398, semiconductor die 428, TSV substrate 396 and TSV substrate 426 are removed from chase mold 446. A plurality of vias 462 is formed through MUF material 456 extending to TSV substrate 396 using laser drilling, mechanical drilling, or DRIE. The sidewalls of vias 462 can have a tapered, straight, or stepped profile.

In FIG. 12n, vias 462 are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 464. Conductive vias 464 electrically connect with one or more redistribution layers and conductive vias 392 of TSV substrate 396.

An electrically conductive bump material is deposited over conductive layer 416 of TSV substrate 426 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 416 using a suitable attachment or bonding process. In one embodiment, the bump material is reflowed by heating the material above its melting point to form balls or bumps 466. In some applications, bumps 466 are reflowed a second time to improve electrical contact to conductive layer 416. An under bump metallization layer can be formed under bumps 466. Bumps 466 can also be compression bonded to conductive layer 416. Bumps 466 represent one type of interconnect structure that can be formed over conductive layer 416. The interconnect structure can also use stud bump, micro bump, or other electrical interconnect. In a similar process, an electrically conductive bump material is deposited over conductive vias 464, substantially coplanar with bumps 466, to form bumps 468.

The assembly is singulated through MUF material 456, gap 442, and TSV substrate 396, outside a footprint of the periphery of semiconductor die 398 and 428 with saw blade or laser cutting tool 469 into individual integrated dual flipchip semiconductor packages 470.

Figure 13:
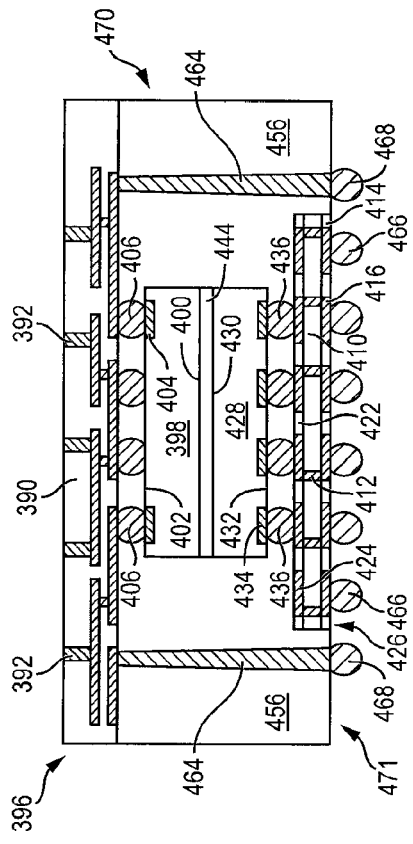
FIG. 13 illustrates the stacked-die semiconductor package with a first substrate with multiple interconnected conductive layers according to FIGS. 12a-12n.

FIG. 13 shows semiconductor package 470 after singulation. Semiconductor die 398 is mounted over semiconductor die 428 with adhesive layer 444, providing a high density of semiconductor die within a small footprint. Semiconductor die 398 is mechanically and electrically connected to TSV substrate 396 with bumps 406. TSV substrate 396 has a plurality of conductive vias 390 and multiple conductive redistribution layers, providing electrical connectivity vertically and horizontally across TSV substrate 396. Semiconductor die 428 is mechanically and electrically connected to TSV substrate 426 with bumps 436. Conductive layers 424 and 416, and conductive vias 412, provide electrical connectivity vertically and horizontally across TSV substrate 426.

The length of TSV substrate 426 is less than the length of TSV substrate 396 to allow clearance for conductive vias 464. Semiconductor die 398 and 428, and TSV substrates 426 and 396 are disposed within a chase mold and MUF material 456 is deposited over the assembly. MUF material 456 is uniformly formed over semiconductor die 398 and 428 in a single manufacturing step, eliminating the need to deposit MUF material over each die individually. Conductive vias 464 are formed through MUF material 456 to electrically connect TSV substrate 396 to a common surface 471 of semiconductor package 470. Bumps 468 are formed over an exposed surface of conductive vias 464. Bumps 466 are formed over conductive layer 416 of TSV substrate 426.

Semiconductor die 398 is electrically connected through contact pads 404, bumps 406, TSV substrate 396, and conductive vias 464 to the common surface 471 of semiconductor package 470. Semiconductor die 428 is electrically connected through bumps 436, and TSV substrate 426 to the common surface 471 of semiconductor package 470. Accordingly, TSV substrate 396 and 426, bumps 406 and 436, and conductive vias 464 form a conductive interconnect structure to provide electrical paths for I/O signals of semiconductor die 398 and 428 to the common surface 471 of semiconductor package 470.

Figure 14:
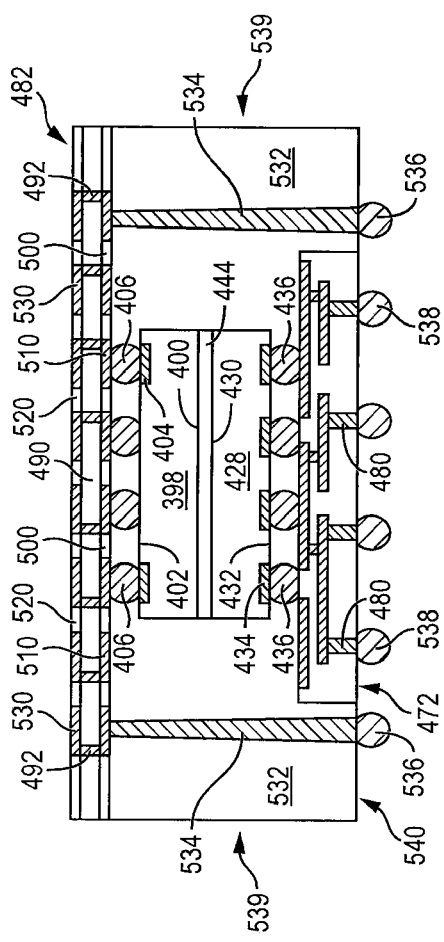
FIG. 14 illustrates a stacked-die semiconductor package with a second substrate with multiple interconnected conductive layers.

In another embodiment, shown in FIG. 14, TSV substrate 472 can contain a silicon substrate layer with z-direction vertical conductive vias 480 and one or more redistribution layers to provide electrical connections horizontally and vertically across TSV substrate 472. TSV substrate 482 can contain a substrate layer 490, vias 492, with insulating layer 500 and conductive layer 510 opposite insulating layer 520 and conductive layer 530. Conductive layers 510 and 530, and conductive vias 492 provide electrical connectivity vertically and horizontally across TSV substrate 482. Semiconductor die 398 is mounted over semiconductor die 428 with adhesive layer 444, providing a high density of semiconductor die within a small footprint. Semiconductor die 398 is mechanically and electrically connected to TSV substrate 482 with bumps 406.

The length of TSV substrate 472 is less than the length of TSV substrate 482 to allow clearance for conductive vias 534. Semiconductor die 398 and 428, and TSV substrates 472 and 482 are disposed within a chase mold and MUF material 532 is deposited over the assembly. MUF material 532 is uniformly formed over semiconductor die 398 and 428 in a single manufacturing step, eliminating the need to deposit MUF material over each die individually. Conductive vias 534 are formed through MUF material 532 to electrically connect TSV substrate 482 to a common surface 540 of semiconductor package 539. Bumps 536 are formed over an exposed surface of conductive vias 534. Bumps 538 are formed over conductive vias 480 of TSV substrate 472.

Semiconductor die 398 is electrically connected through contact pads 404, bumps 406, TSV substrate 482, and conductive vias 534 to the common surface 540 of semiconductor package 539. Semiconductor die 428 is electrically connected through bumps 436, and TSV substrate 472 to the common surface 540 of semiconductor package 539. Accordingly, TSV substrate 482 and 472, bumps 406 and 436, and conductive vias 534 form a conductive interconnect structure to provide electrical paths for I/O signals of semiconductor die 398 and 428 to a common surface 540 of semiconductor package 539.

Figure 15A:
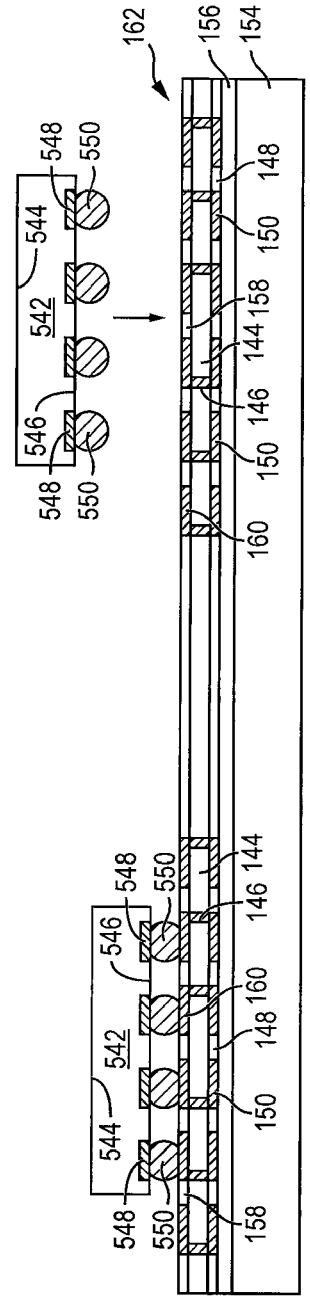

FIGS. 15a-15j illustrate, in relation to FIGS. 1 and 2a-2c, a process of forming a stacked-die semiconductor package with multiple interconnect structures to electrically connect the stacked die to a top and bottom surface of the package. In FIG. 15a, continuing from FIG. 4c, a plurality of semiconductor die 542 originating from a semiconductor wafer, similar to FIGS. 3a-3c, has a back surface 544 and an active surface 546 containing analog or digital circuits implemented as active devices, passive devices, conductive layers, and dielectric layers formed within the die and electrically interconnected according to the electrical design and function of the die. For example the circuit may include one or more transistors, diodes, and other circuit elements formed within active surface 546 to implement analog circuits or digital circuits, such as DSP, ASIC, memory or other signal processing circuit. Semiconductor die 542 may also contain IPDs, such as inductors, capacitors, and resistors, for RF signal processing. A plurality of contact pads 548 is formed on active surface 546 and electrically connected to the circuits on the active surface. A plurality of bumps 550 is formed over contact pads 548.

Each semiconductor die 542 is mounted to conductive layer 160 of TSV substrate 162 using a pick and place operation with active surface 546 oriented toward the substrate. Bumps 550 are reflowed to electrically connect conductive layer 548 of semiconductor die 542 to conductive layer 160 of TSV substrate 162.

In FIG. 15b, a portion of TSV substrate 162 is removed using a saw blade or laser cutting tool 552 to create gap 554 between semiconductor die 542 and extending down to interface layer 156. Carrier 154 provides structural support for TSV substrate 162 and semiconductor die 542 during formation of gap 554.

In FIG. 15c, an adhesive layer 556 is formed over back surface 544 of semiconductor die 542. Adhesive layer 556 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, suitable wafer backside coating, epoxy resin with organic filler, silica filler, or polymer filler, acrylate based adhesive, epoxy-acrylate adhesive, a PI-based adhesive or other suitable adhesive material.

A plurality of semiconductor die 558 originating from a semiconductor wafer, similar to FIGS. 3a-3c, has a back surface 560 and an active surface 562 containing analog or digital circuits implemented as active devices, passive devices, conductive layers, and dielectric layers formed within the die and electrically interconnected according to the electrical design and function of the die. For example the circuit may include one or more transistors, diodes, and other circuit elements formed within active surface 562 to implement analog circuits or digital circuits, such as DSP, ASIC, memory or other signal processing circuit. Semiconductor die 558 may also contain IPDs, such as inductors, capacitors, and resistors, for RF signal processing. A plurality of contact pads 564 is formed on active surface 562 and electrically connected to the circuits on the active surface. A plurality of bumps 566 is formed over contact pads 564.

Figure 15D:
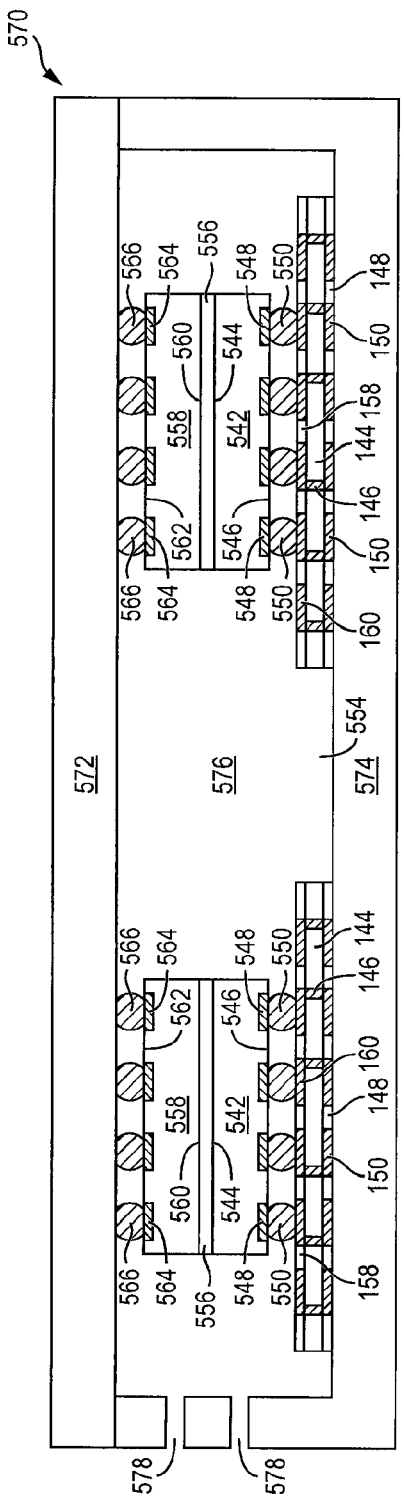

FIG. 15d shows semiconductor die 558 mounted to semiconductor die 542 with adhesive layer 556. Carrier 154 and interface layer 156 are removed by chemical etching, mechanical peeling, CMP, mechanical grinding, thermal bake, UV light, laser scanning, or wet stripping to expose insulating layer 148 and conductive layer 150 of TSV substrate 162.

The assembly, containing semiconductor die 542, semiconductor die 558, and TSV substrate 162 is placed in chase mold 570. Chase mold 570 has an upper mold support 572 and lower mold support 574, which are brought together to enclose semiconductor die 542, semiconductor die 558, and TSV substrate 162 with open space 576. The lower mold support 574 includes a plurality of openings or gates 578 for injecting MUF material into open space 576.

Figure 15E:
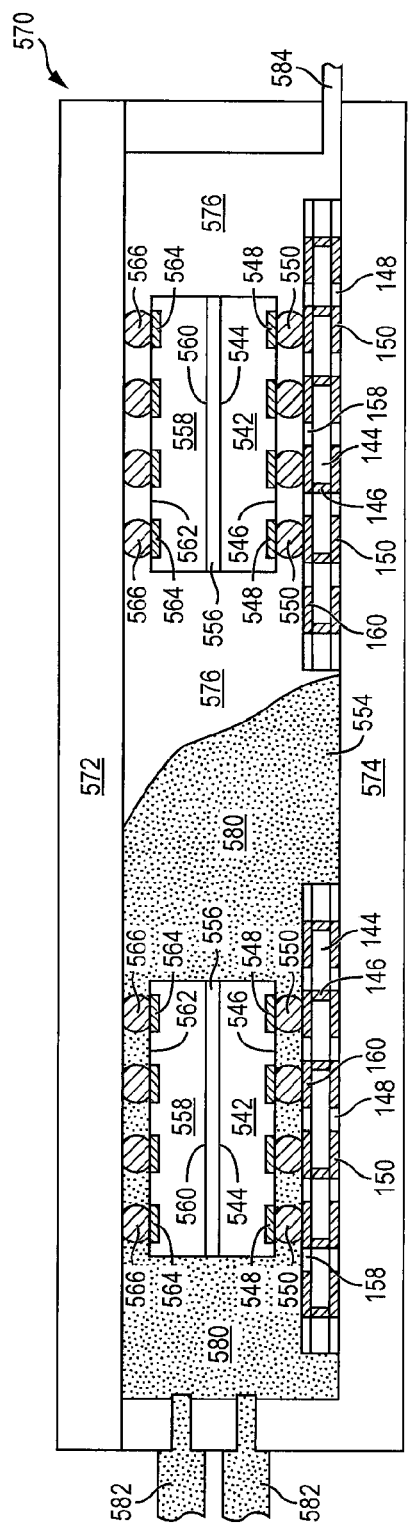

In FIG. 15e, MUF material 580 in a liquid state is injected through gates 578 with nozzles 582 while an optional vacuum assist 584 draws pressure from the side of chase mold 570 to uniformly fill open space 576 over semiconductor die 558, semiconductor die 542, TSV substrate 162, and gap 554 with MUF material 580. MUF material 580 can be an encapsulant, molding compound, polymer composite material, such as epoxy resin with filler, epoxy acrylate with filler, or polymer with proper filler. FIG. 15f shows MUF material 580 disposed around and between semiconductor die 558, semiconductor die 542, TSV substrate 162, and gap 554.

In FIG. 15g, semiconductor die 542, semiconductor die 558, and TSV substrate 162 are removed from chase mold 570. A plurality of vias 586 is formed through MUF material 580 extending to conductive layer 160 using laser drilling, mechanical drilling, or DRIE. A plurality of second vias 588 is formed through MUF material 580, extending through gap 554 and creating an opening on the opposite surface of MUF material 580. The sidewalls of vias 586 and 588 can have a tapered, straight, or stepped profile.

In FIG. 15h, vias 586 and 588 are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 590 and 592 respectively.

In FIG. 15i, a TSV substrate is formed, similar to FIGS. 4a-4d, with substrate layer 594 and conductive vias 596. Insulating layer 598 and conductive layer 600 are formed on one side of substrate 594. Insulating layer 602 and conductive layer 604 are formed on substrate 594, on the side opposite insulating layer 598. The resulting wafer-form TSV interposer or substrate 606 provides electrical interconnect vertically across the substrate. Leading with conductive layer 604, TSV substrate 606 is mounted over the assembly, using a suitable attachment or bonding process, and electrically connected to bumps 566, and conductive vias 590 and 592.

An electrically conductive bump material is deposited over conductive layer 150 of TSV substrate 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 610. In some applications, bumps 610 are reflowed a second time to improve electrical contact to conductive layer 150. A UBM layer can be formed under bumps 610. Bumps 610 can also be compression bonded to conductive layer 150. Bumps 610 represent one type of interconnect structure that can be formed over conductive layer 150. The interconnect structure can also use stud bump, micro bump, or other electrical interconnect. In a similar process, an electrically conductive bump material is deposited over conductive vias 592, substantially coplanar with bumps 610, to form bumps 612.

Figure 15J:
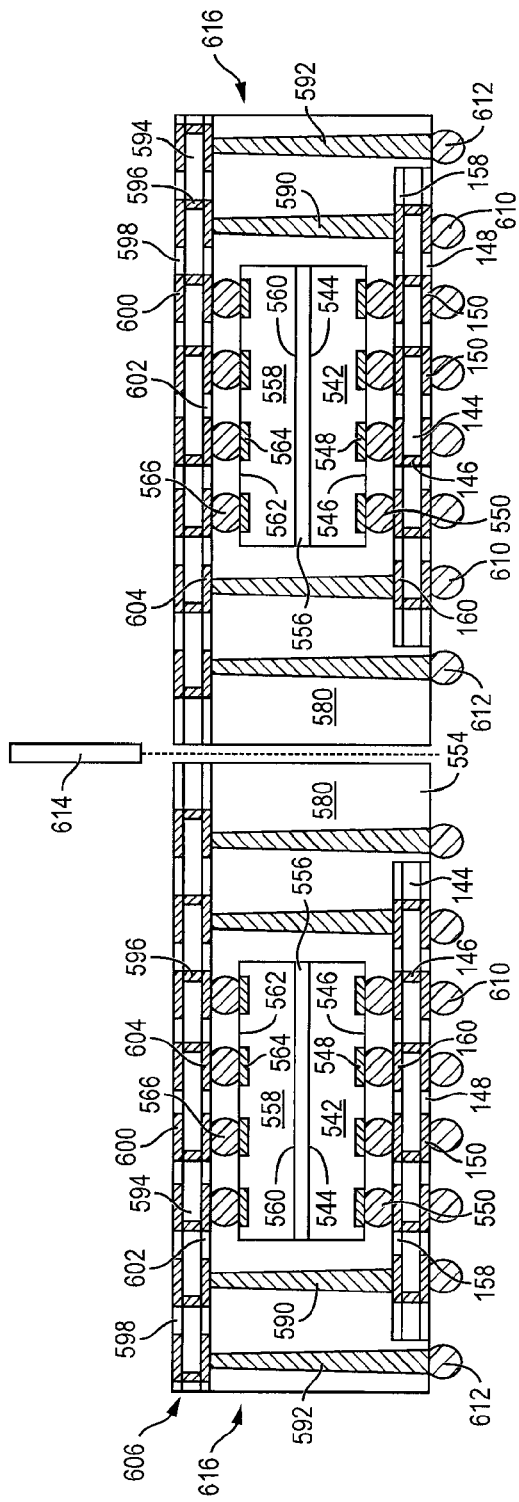

In FIG. 15j, the assembly from FIG. 15i is singulated through MUF material 580, gap 554, and TSV substrate 606, outside a footprint of semiconductor die 558 and 542, with saw blade or laser cutting tool 614 into individual integrated dual flipchip semiconductor packages 616.

Figure 16:
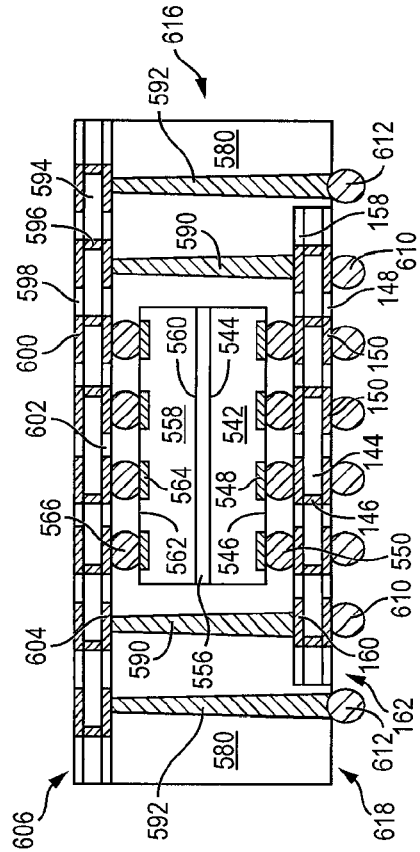
FIG. 16 illustrates a stacked-die semiconductor package with multiple interconnect structures to electrically connect the stacked die to a top and bottom surface of the package according to FIGS. 15a-15j.

FIG. 16 shows semiconductor package 616 after singulation. Semiconductor die 558 is mounted over semiconductor die 542 with adhesive layer 556, providing a high density of semiconductor die within a small footprint. Semiconductor die 558 is mechanically and electrically connected to TSV substrate 606 with bumps 566. Conductive layers 604 and 600, and conductive vias 596, provide electrical connectivity vertically and horizontally across TSV substrate 606. Semiconductor die 542 is mechanically and electrically connected to TSV substrate 162 with bumps 550. Conductive layers 150 and 160, and conductive vias 146, provide electrical connectivity vertically and horizontally across TSV substrate 162.

The length of TSV substrate 162 is less than the length of TSV substrate 606 to allow clearance for conductive vias 592. Semiconductor die 542 and 558, and TSV substrate 162 are disposed within a chase mold and MUF material 580 is deposited over the assembly. MUF material 580 is uniformly formed over semiconductor die 542 and 558 in a single manufacturing step, eliminating the need to deposit MUF material over each die individually. Conductive vias 590 and 592 are formed through MUF material 580. TSV substrate 606 is mechanically and electrically connected to conductive vias 590 and 592. Conductive vias 590 electrically connect TSV substrate 606 to TSV substrate 162. Conductive vias 592 extend from TSV substrate 606 to a common surface 618 of semiconductor package 616. Bumps 612 are formed over an exposed surface of conductive vias 592. Bumps 610 are formed over conductive layer 150 of TSV substrate 162.

Semiconductor die 558 is electrically connected through contact pads 564, bumps 566, TSV substrate 606, and conductive vias 592 to the common surface 618 of semiconductor package 616. Semiconductor die 542 is electrically connected through bumps 550, and TSV substrate 162 to the common surface 618 of semiconductor package 616. Conductive vias 590 electrically connect TSV substrate 606 to TSV substrate 162. Accordingly, TSV substrate 162 and 606, bumps 566 and 550, and conductive vias 590 and 592 form a conductive interconnect structure to provide electrical paths for I/O signals of semiconductor die 558 and 542 to a common surface 618 of semiconductor package 616.

Figure 17D:
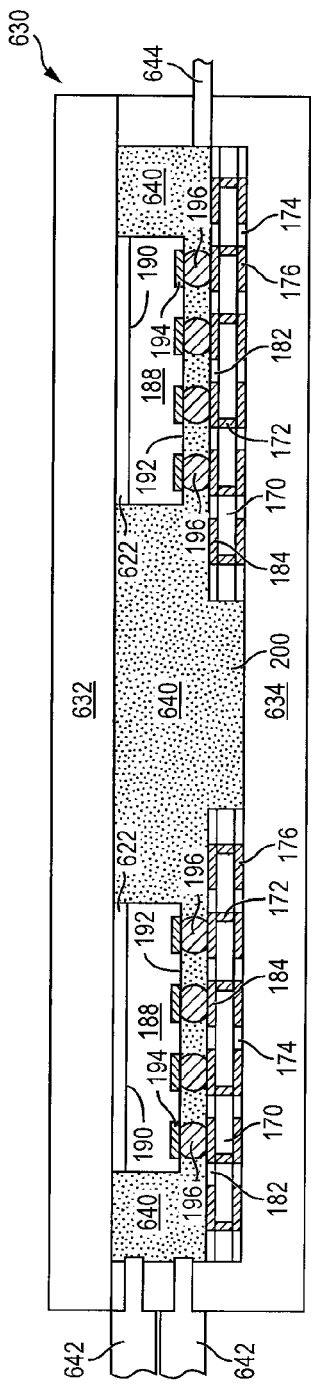
FIGS. 17a-17r illustrate a process of forming a stacked-die semiconductor package with multiple interconnect structures through an encapsulant to provide electrical connectivity between the die and multiple substrates.
Figure 17E:
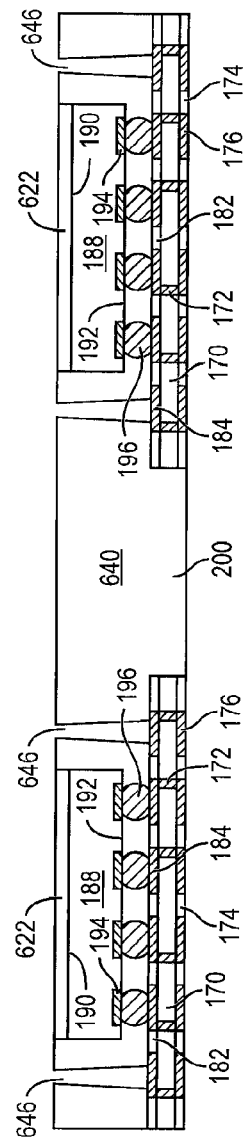
Figure 17F:
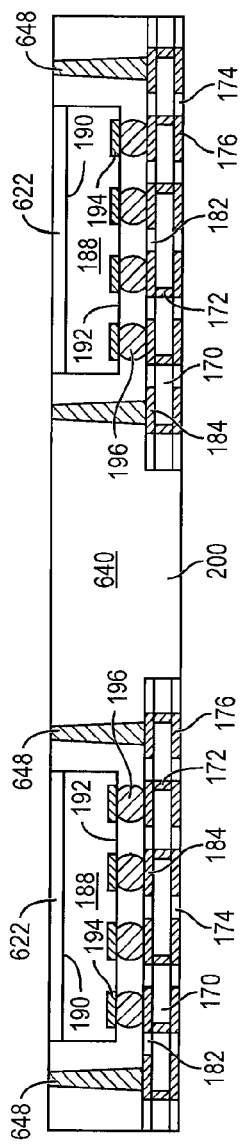
Figure 17G:
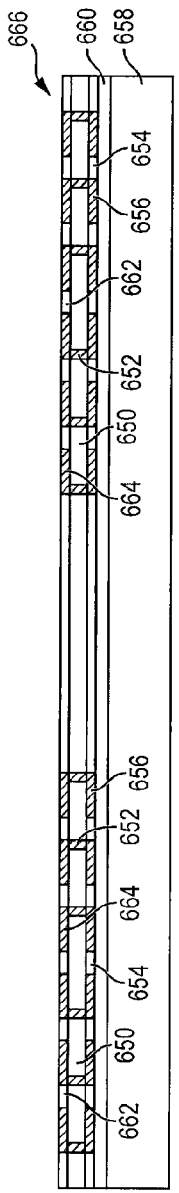
Figure 17H:
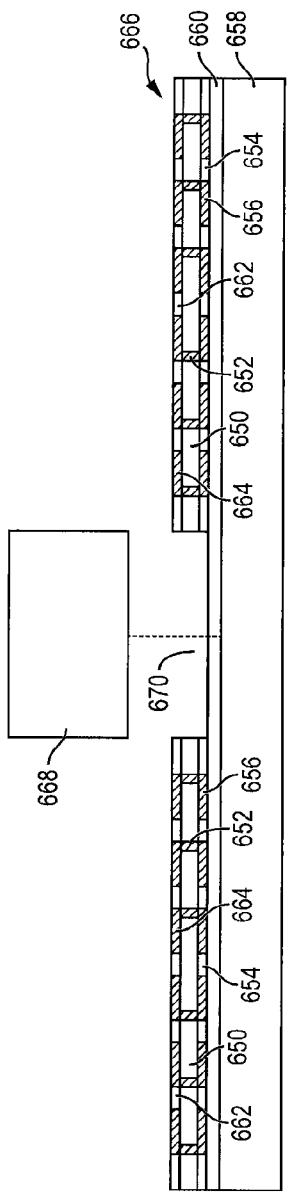
Figure 17I:
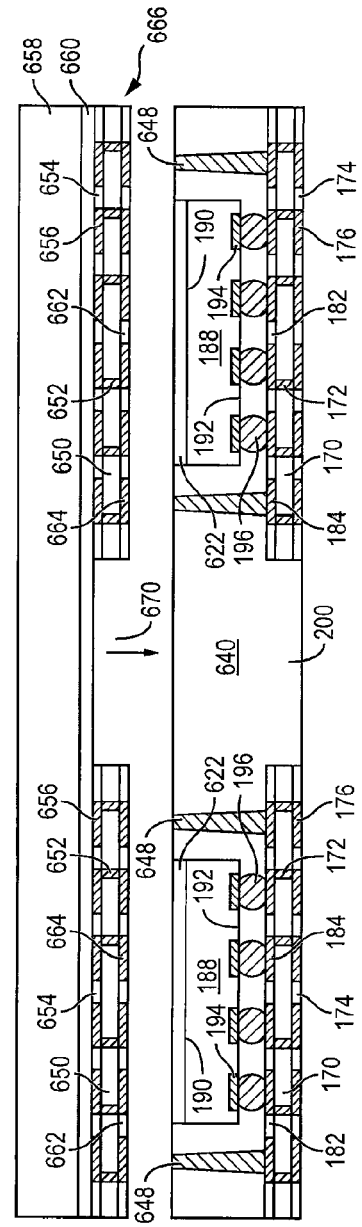
Figure 17J:
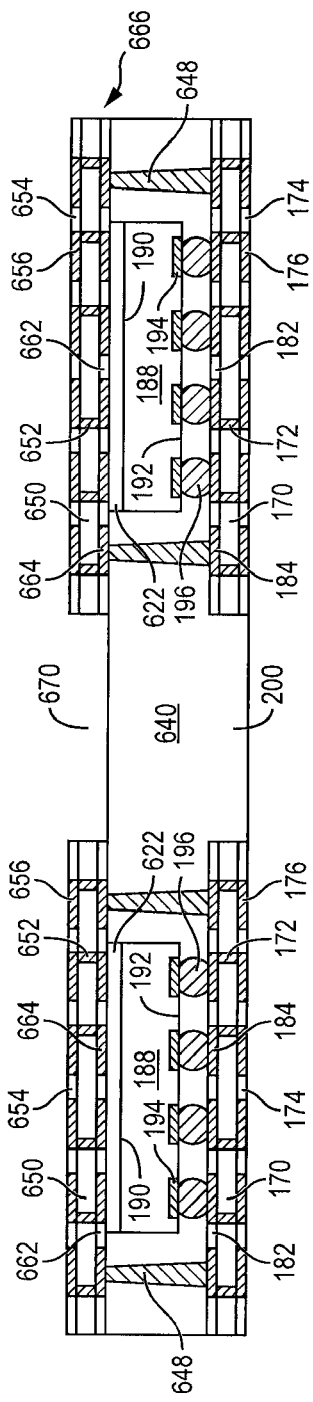
Figure 17K:
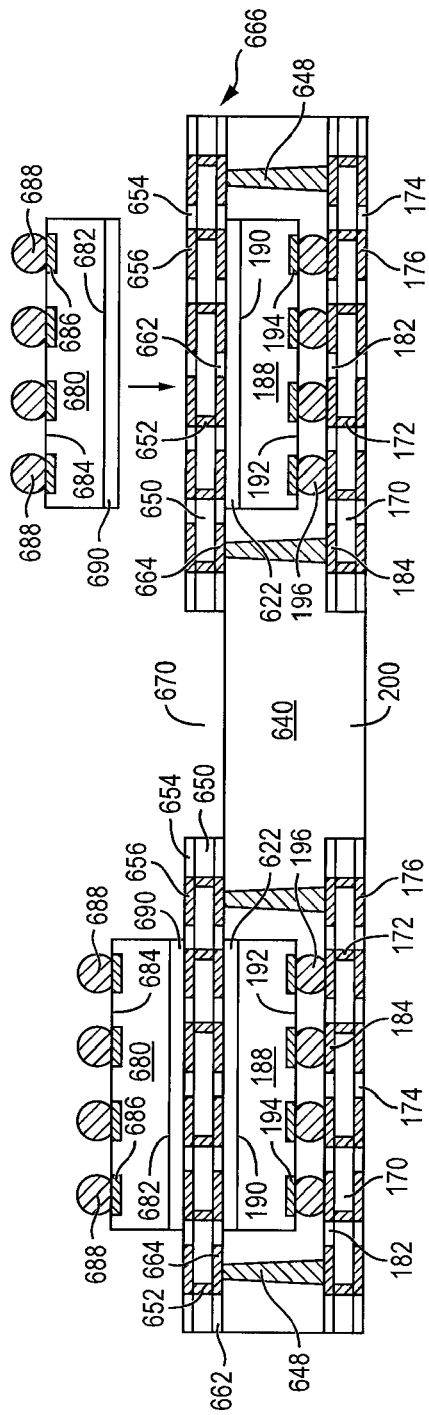
Figure 17L:
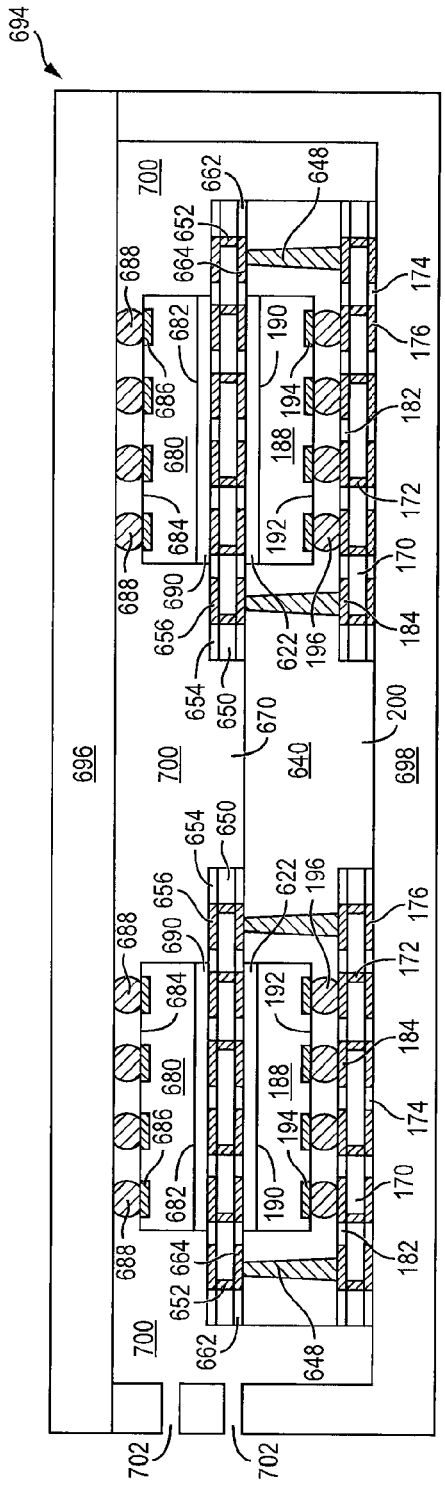
Figure 17M:
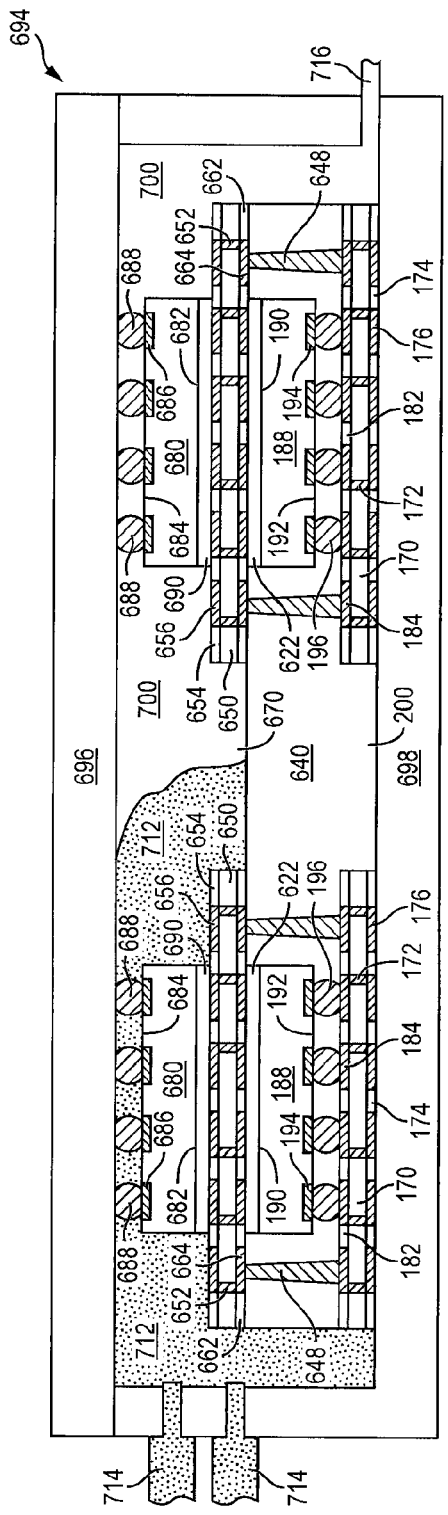
Figure 17N:
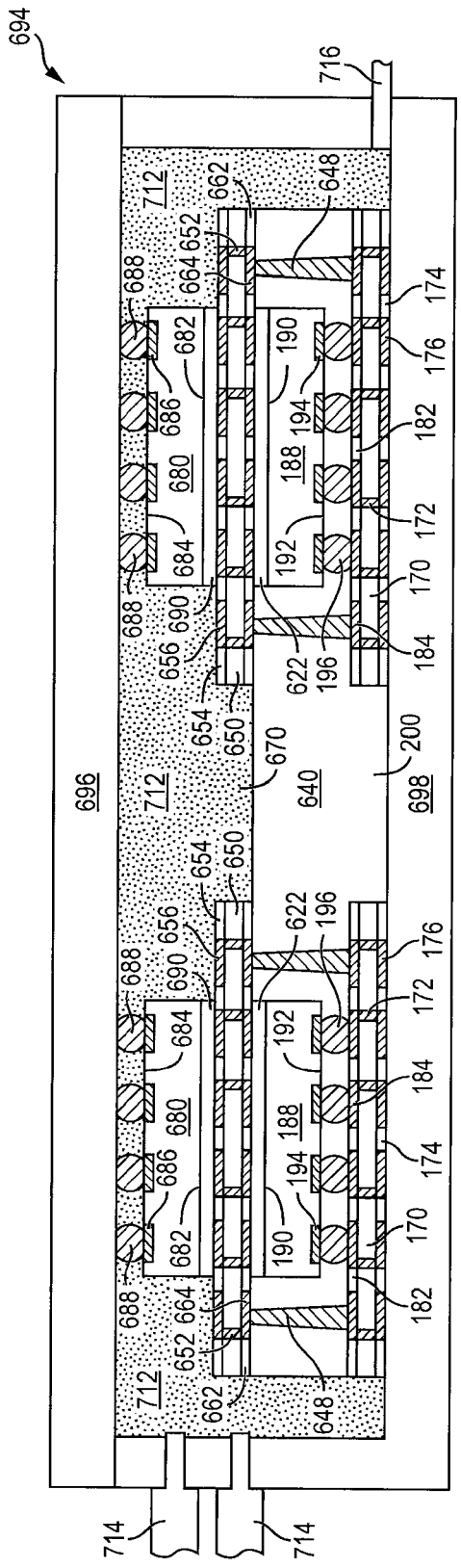
Figure 17O:
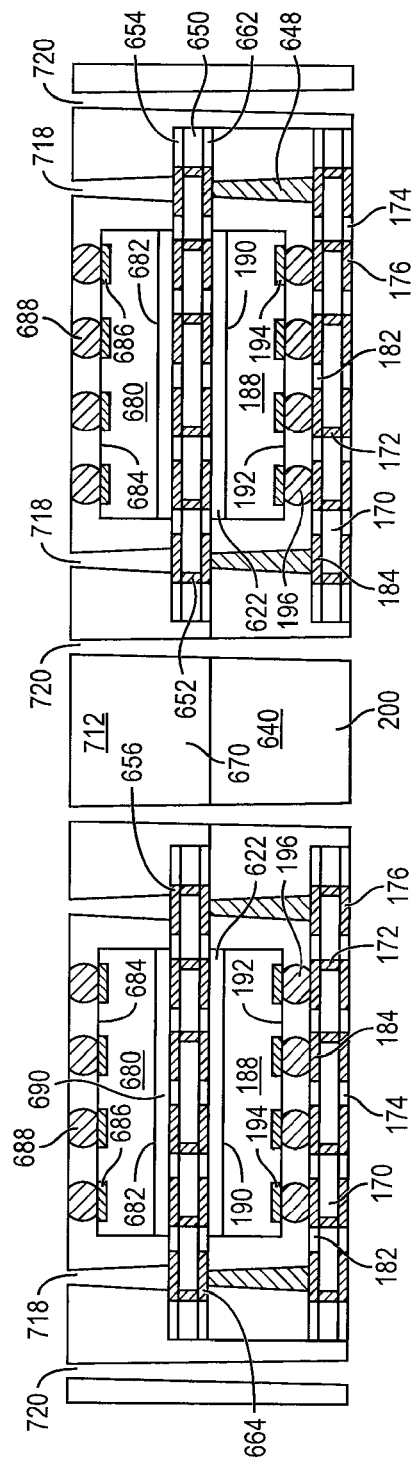
Figure 17P:
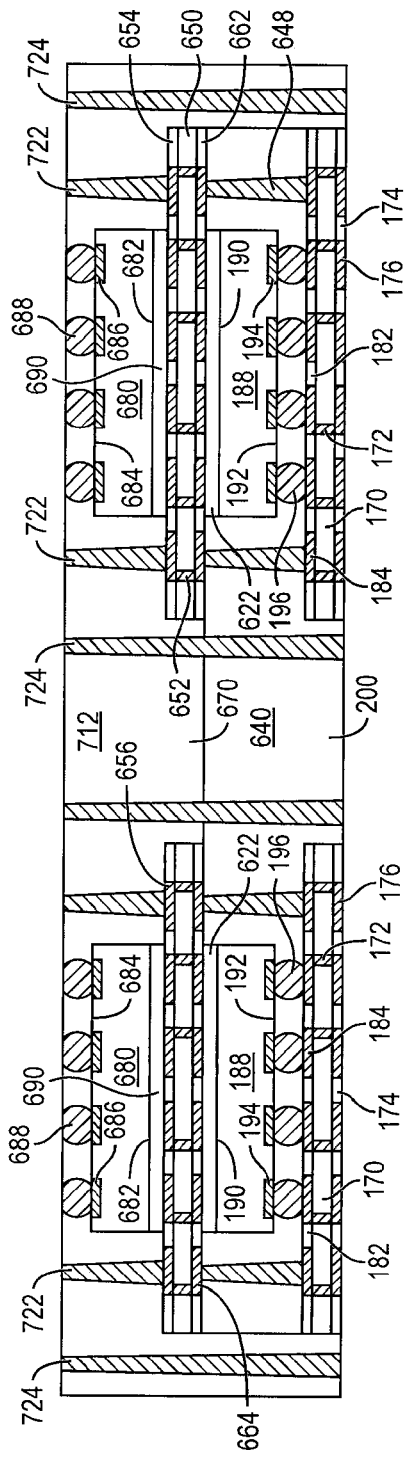
Figure 17Q:
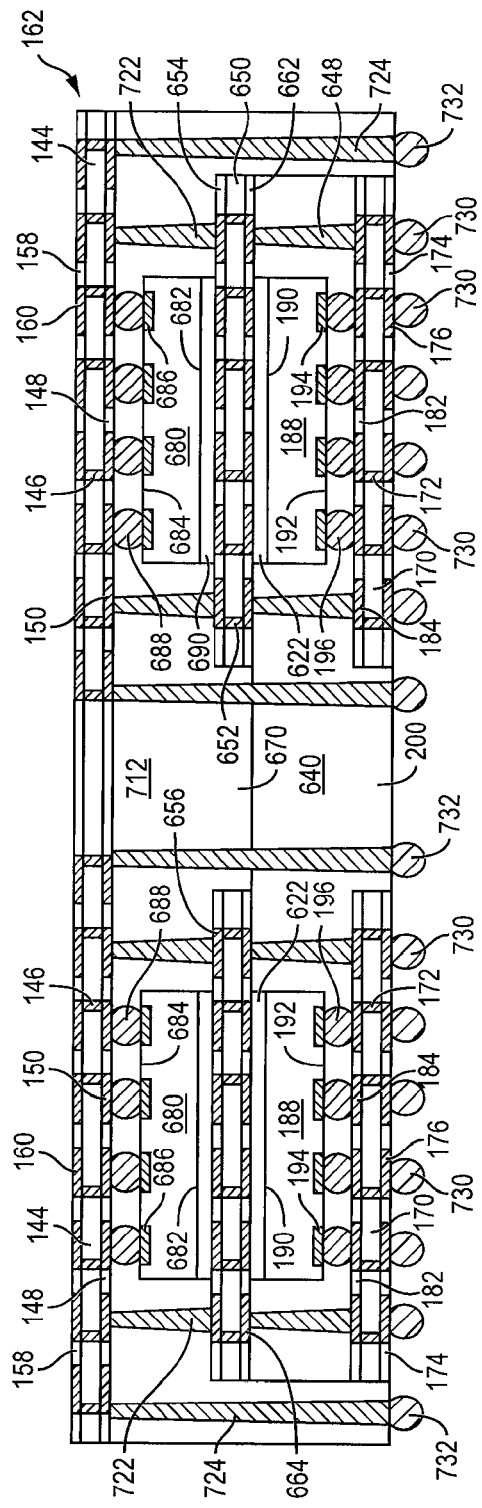
Figure 17R:
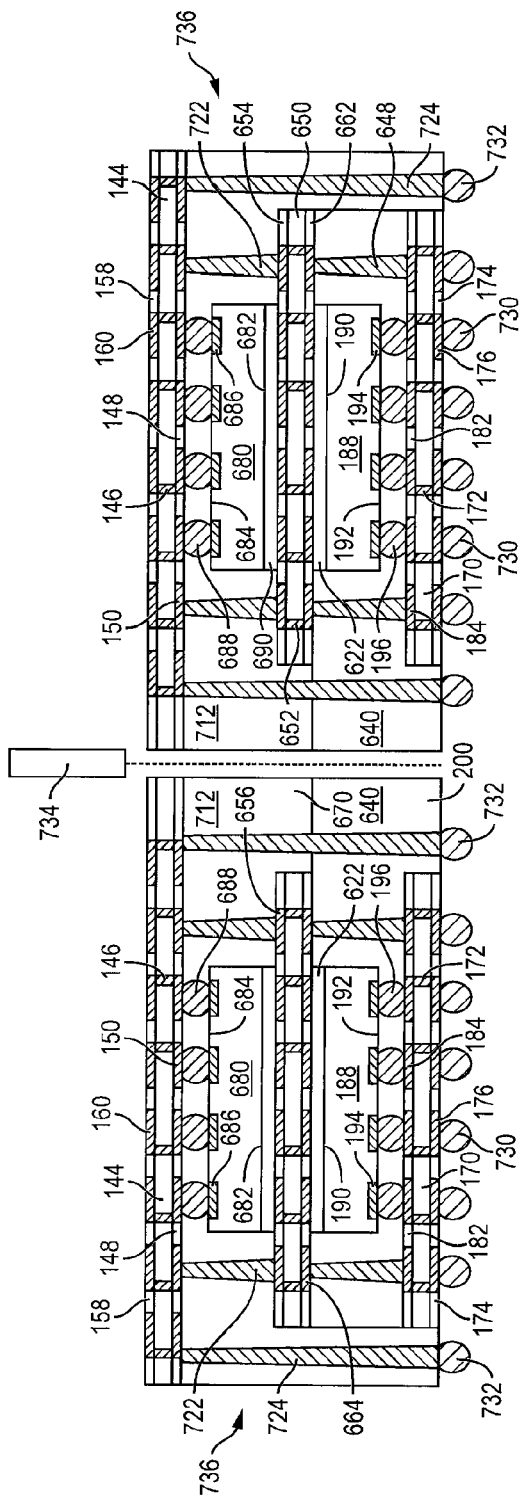

FIGS. 17a-17r illustrate, in relation to FIGS. 1 and 2a-2c, a process of forming a stacked-die semiconductor package with multiple interconnect structures through an encapsulant to provide electrical connectivity between the die and multiple substrates. In FIG. 17a, continuing from FIG. 4j, an adhesive layer 622 is formed over back surface 190 of semiconductor die 188. Adhesive layer 622 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, suitable wafer backside coating, epoxy resin with organic filler, silica filler, or polymer filler, acrylate based adhesive, epoxy-acrylate adhesive, a PI-based adhesive or other suitable adhesive material.

In FIG. 17b, carrier 178 and interface layer 180 are removed by chemical etching, mechanical peeling, CMP, mechanical grinding, thermal bake, UV light, laser scanning, or wet stripping to expose insulating layer 174 and conductive layer 176. TSV substrate 186 and semiconductor die 188 are placed in chase mold 630. Chase mold 630 has an upper mold support 632 and lower mold support 634, which are brought together to enclose semiconductor die 188 and TSV substrate 186 with open space 636. The lower mold support 634 includes a plurality of openings or gates 638 for injecting MUF material into open space 636.

In FIG. 17c, MUF material 640 in a liquid state is injected through gates 638 with nozzles 642 while an optional vacuum assist 644 draws pressure from the side of chase mold 630 to uniformly fill open space 636 around semiconductor die 188, TSV substrate 186, and gap 200 with MUF material. MUF material 640 can be an encapsulant, molding compound, polymer composite material, such as epoxy resin with filler, epoxy acrylate with filler, or polymer with proper filler. FIG. 17d shows MUF material 640 disposed around and between semiconductor die 188, TSV substrate 186, and gap 200.

In FIG. 17e, semiconductor die 188, and TSV substrate 186 are removed from chase mold 630. A plurality of vias 646 is formed through MUF material 640 extending to conductive layer 184 of TSV substrate 186 using laser drilling, mechanical drilling, or DRIE. The sidewalls of vias 646 can have a tapered, straight, or stepped profile.

In FIG. 17f, vias 646 are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 648. Conductive vias 648 electrically connect with conductive layer 184 of TSV substrate 186.

In FIG. 17g, a TSV substrate is formed, similar to FIGS. 4a-4d, with substrate layer 650 and conductive vias 652. Insulating layer 654 and conductive layer 656 are formed on one side of substrate 650 and mounted to temporary carrier 658 with interface layer 660. Insulating layer 662 and conductive layer 664 are formed on substrate 650, on the side opposite insulating layer 654. The resulting wafer-form TSV interposer or substrate 666 provides electrical interconnect vertically across the substrate.

In FIG. 17h, a portion of TSV substrate 666 is removed using a saw blade or laser cutting tool 668 to create gap 670 extending down to interface layer 660. Carrier 658 provides structural support for TSV substrate 666 during formation of gap 670.

In FIG. 17i, TSV substrate 666 is mounted to semiconductor die 188 with adhesive layer 622. Conductive layer 664 is electrically connected to conductive vias 648, conductive layers 184 and 176, and conductive vias 172.

In FIG. 17j, carrier 658 and interface layer 660 are removed by chemical etching, mechanical peeling, CMP, mechanical grinding, thermal bake, UV light, laser scanning, or wet stripping to expose conductive layer 656 and insulating layer 654.

In FIG. 17k, a plurality of semiconductor die 680 originating from a semiconductor wafer, similar to FIGS. 3a-3c, has a back surface 682 and an active surface 684 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 684 to implement analog circuits or digital circuits, such as DSP, ASIC, memory or other signal processing circuit. Semiconductor die 680 may also contain IPDs, such as inductors, capacitors, and resistors, for RF signal processing. A plurality of contact pads 686 is formed on active surface 684 and electrically connected to the circuits on the active surface. A plurality of bumps 688 is formed over contact pads 686.

An adhesive layer 690 is formed over back surface 682 of semiconductor die 680. Adhesive layer 690 can be thermal epoxy, epoxy resin, B-stage epoxy laminating film, UV B-stage film adhesive layer, UV B-stage film adhesive layer including acrylic polymer, thermo-setting adhesive film layer, WIF encapsulant material, suitable wafer backside coating, epoxy resin with organic filler, silica filler, or polymer filler, acrylate based adhesive, epoxy-acrylate adhesive, a PI-based adhesive or other suitable adhesive material. Leading with back surface 682, each semiconductor die 680 is mounted to TSV substrate 666 with adhesive layer 690, on the side of TSV substrate 666 opposite semiconductor die 188.

In FIG. 17l, the assembly, containing TSV substrate 186 and 666, and semiconductor die 680 and 188, is placed in chase mold 694. Chase mold 694 has an upper mold support 696 and lower mold support 698, which are brought together to enclose semiconductor die 188, semiconductor die 680, TSV substrate 186, and TSV substrate 666 with open space 700. The lower mold support 698 includes a plurality of openings or gates 702 for injecting MUF material into open space 700.

In FIG. 17m, MUF material 712 in a liquid state is injected through gates 702 with nozzles 714 while an optional vacuum assist 716 draws pressure from the side of chase mold 694 to uniformly fill open space 700 over the assembly. MUF material 712 can be an encapsulant, molding compound, polymer composite material, such as epoxy resin with filler, epoxy acrylate with filler, or polymer with proper filler. FIG. 17n shows MUF material 712 disposed around semiconductor die 188, TSV substrate 186, and TSV substrate 666.

In FIG. 17o, the assembly from FIG. 17o, comprising semiconductor die 188 and 680, TSV substrate 186, and TSV substrate 666, is removed from chase mold 694. A plurality of vias 718 is formed through MUF material 712 extending to conductive layer 656 using laser drilling, mechanical drilling, or DRIE. Similarly, a plurality of vias 720 is formed through MUF material 712 and 640, extending through gap 670 and gap 200. Vias 718 and 720 can have a tapered, straight, or stepped profile.

In FIG. 17p, vias 718 and 720 are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 722 and 724, respectively. Conductive vias 722 electrically connect with conductive layer 656, conductive layer 664, conductive layer 184, conductive layer 176, conductive vias 652, conductive vias 172, and conductive vias 648.

In FIG. 17q, leading with conductive layer 150, TSV substrate 162, from FIG. 4d (without attached semiconductor die) is mounted to the assembly from FIG. 17q. Conductive layer 150 is electrically connected to bumps 688, contact pads 686, conductive vias 722, and conductive vias 724.

An electrically conductive bump material is deposited over conductive layer 176 of TSV substrate 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form balls or bumps 730. In some applications, bumps 730 are reflowed a second time to improve electrical contact to conductive layer 176. A UBM layer can be formed under bumps 730. Bumps 730 can also be compression bonded to conductive layer 176. Bumps 730 represent one type of interconnect structure that can be formed over conductive layer 176. The interconnect structure can also use stud bump, micro bump, or other electrical interconnect. In a similar process, an electrically conductive bump material is deposited over conductive vias 724, coplanar with bumps 730, to form bumps 732.

In FIG. 17r, the assembly from FIG. 17r is singulated through TSV substrate 162, and gaps 670 and 200, outside a footprint of semiconductor die 680 and 188, with saw blade or laser cutting tool 734 into individual semiconductor packages 736.

Figure 18:
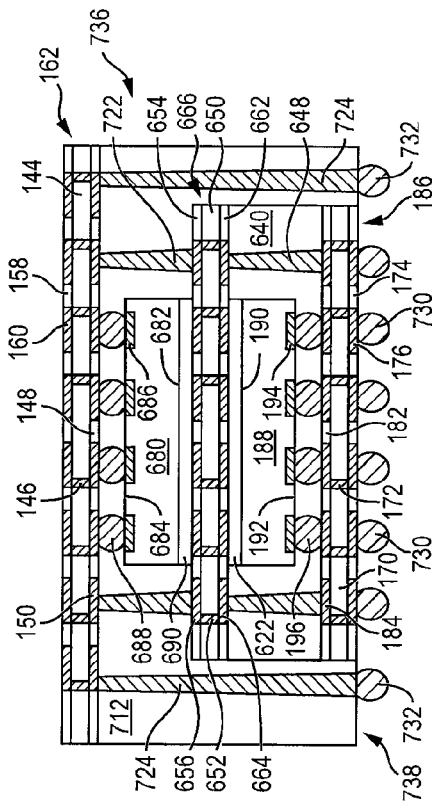
FIG. 18 illustrates the stacked-die semiconductor package with multiple interconnect structures through an encapsulant to provide electrical connectivity between the die and multiple substrates according to FIGS. 17a-17r.

FIG. 18 shows semiconductor package 736 after singulation. Semiconductor die 680 is mounted over TSV substrate 666 with adhesive layer 690, and semiconductor die 188 is mounted over an opposing surface of TSV substrate 666 with adhesive layer 622, providing a high density of semiconductor die within a small footprint. Semiconductor die 680 is mechanically and electrically connected to TSV substrate 162 with bumps 688. Conductive layers 150 and 160, and conductive vias 146 provide electrical connectivity vertically and horizontally across TSV substrate 162. Semiconductor die 188 is mechanically and electrically connected to TSV substrate 186 with bumps 196. Conductive layers 176 and 184, and conductive vias 172, provide electrical connectivity vertically and horizontally across TSV substrate 186.

The length of TSV substrates 186 and 666 is less than the length of TSV substrate 162 to allow clearance for conductive vias 724. MUF material 640 is deposited over semiconductor die 188 and TSV substrate 186 in a chase mold. In a separate process, MUF material 712 is deposited over semiconductor die 680 and 188, and TSV substrates 666 and 186. Conductive vias 648 are formed through MUF material 640 to electrically connect TSV substrate 186 to TSV substrate 666. Conductive vias 722 are formed through MUF material 712 to electrically connect TSV substrate 162 to TSV substrate 666. Conductive vias 724 are formed through MUF material 712 to electrically connect TSV substrate 162 to a common surface 738 of semiconductor package 736. Bumps 732 are formed over an exposed surface of conductive vias 724. Bumps 730 are formed over conductive layer 176 of TSV substrate 186.

Semiconductor die 680 is electrically connected through contact pads 686, bumps 688, TSV substrate 162, and conductive vias 724 to the common surface 738 of semiconductor package 736. Semiconductor die 188 is electrically connected through contact pads 194, bumps 196, and TSV substrate 186 to the common surface 738 of semiconductor package 736. Conductive vias 722 electrically connect TSV substrate 162 to TSV substrate 666. Conductive vias 648 electrically connect TSV substrate 666 to TSV substrate 186. Accordingly, TSV substrates 162, 186, and 666, bumps 688 and 196, and conductive vias 724, 722, and 648 form a conductive interconnect structure to provide electrical paths for I/O signals of semiconductor die 680 and 188 to a common surface 738 of semiconductor package 736.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first substrate;
   a first semiconductor die disposed over the first substrate including an active surface of the first semiconductor die oriented toward and electrically connected to the first substrate;
   a second semiconductor die disposed over the first semiconductor die;
   a second substrate disposed over the second semiconductor die;
   an encapsulant deposited over the first substrate, second substrate, first semiconductor die, and second semiconductor die; and
   a conductive interconnect structure formed through the encapsulant electrically connecting the first semiconductor die and second semiconductor die to a common surface of the semiconductor device.

2. The semiconductor device of claim 1, wherein the first substrate includes a first conductive layer and the second substrate includes a second conductive layer.

3. The semiconductor device of claim 1, wherein a plurality of first conductive vias extends through the encapsulant from the first substrate to the common surface of the semiconductor device.

4. The semiconductor device of claim 1, further including:
   a plurality of bond wires electrically connecting the first semiconductor die to the first substrate; and
   an adhesive layer formed over the first semiconductor die and the bond wires including sufficient thickness to enable clearance of the bond wires outside a footprint of the first semiconductor die.

5. The semiconductor device of claim 1, wherein the first substrate includes a first length and the second substrate includes a second length less than the first length.

6. A semiconductor device, comprising:
   a first substrate;
   a first semiconductor die disposed over the first substrate;
   a second substrate, the second substrate including a length less than a length of the first substrate; and
   a second semiconductor die disposed over the second substrate with the first semiconductor die disposed over and in electrical connection with the second semiconductor die.

7. The semiconductor device of claim 6, wherein the electrical connection includes a first interconnect structure formed between the first substrate and the second substrate.

8. The semiconductor device of claim 6, further including an encapsulant deposited over the first substrate, second substrate, first semiconductor die, and second semiconductor die.

9. The semiconductor device of claim 6, further including:
   a third substrate disposed over the first semiconductor die opposite the first substrate and further disposed over the second semiconductor die opposite the first semiconductor die;
   a conductive layer formed over the third substrate;
   a second interconnect structure formed to electrically connect the first substrate to the third substrate; and
   a third interconnect structure formed to electrically connect the second substrate to the third substrate.

10. The semiconductor device of claim 6, further including:
    a first conductive layer formed over the first substrate connected to the first semiconductor die; and
    a second conductive layer formed over the second substrate connected to the second semiconductor die.

11. A semiconductor device, comprising:
    a substrate;
    a first semiconductor die and second semiconductor die stacked over the substrate including an active surface of the first semiconductor die oriented toward and electrically connected to the substrate;
    an encapsulant disposed over the substrate; and
    a conductive interconnect structure disposed over the substrate and formed through the encapsulant to electrically connect the first semiconductor die and second semiconductor die to a common surface of the semiconductor device.

12. The semiconductor device of claim 11, wherein the substrate includes a first conductive layer.

13. The semiconductor device of claim 11, wherein a plurality of first conductive vias extends from the substrate to the common surface of the semiconductor device.

14. The semiconductor device of claim 11, further including a conductive layer formed over a surface of the conductive interconnect structure.

* * * * *

UNITED STATES PATENT AND TRADEMARK OFFICE
CERTIFICATE OF CORRECTION

PATENT NO. : 8,816,404 B2  
APPLICATION NO. : 13/234902  
DATED : August 26, 2014  
INVENTOR(S) : YoungJoon Kim et al.

Page 1 of 1

It is certified that error appears in the above-identified patent and that said Letters Patent is hereby corrected as shown below:

In the Claims

At column 30, claim 10, line 32, after the words, "over the first substrate" insert -- electrically --.

At column 30, claim 10, line 34, after the words, "over the second substrate" insert -- electrically --.

Signed and Sealed this
Second Day of December, 2014

Michelle K. Lee
*Deputy Director of the United States Patent and Trademark Office*